US 10,971,612 B2

(12) United States Patent
Bothe et al.

(10) Patent No.: US 10,971,612 B2
(45) Date of Patent: *Apr. 6, 2021

(54) HIGH ELECTRON MOBILITY TRANSISTORS AND POWER AMPLIFIERS INCLUDING SAID TRANSISTORS HAVING IMPROVED PERFORMANCE AND RELIABILITY

(71) Applicant: Cree, Inc., Durham, NC (US)

(72) Inventors: Kyle Bothe, Cary, NC (US); Evan Jones, Durham, NC (US); Dan Namishia, Wake Forest, NC (US); Chris Hardiman, Morrisville, NC (US); Fabian Radulescu, Chapel Hill, NC (US); Terry Alcorn, Cary, NC (US); Scott Sheppard, Chapel Hill, NC (US); Bruce Schmukler, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/555,036

(22) Filed: Aug. 29, 2019

(65) Prior Publication Data

US 2020/0395475 A1   Dec. 17, 2020

Related U.S. Application Data

(63) Continuation-in-part of application No. 16/440,427, filed on Jun. 13, 2019.

(51) Int. Cl.
*H01L 31/101* (2006.01)
*H01L 21/338* (2006.01)
*H01L 29/778* (2006.01)
*H01L 29/20* (2006.01)
*H01L 29/205* (2006.01)
(Continued)

(52) U.S. Cl.
CPC .... *H01L 29/7786* (2013.01); *H01L 21/28575* (2013.01); *H01L 21/30612* (2013.01); *H01L 21/765* (2013.01); *H01L 29/2003* (2013.01); *H01L 29/205* (2013.01); *H01L 29/404* (2013.01); *H01L 29/4175* (2013.01); *H01L 29/452* (2013.01); *H01L 29/66462* (2013.01);
(Continued)

(58) Field of Classification Search
CPC ...................... H01L 29/66462; H01L 29/7786
USPC .................................. 438/175–180; 257/187
See application file for complete search history.

(56) References Cited

U.S. PATENT DOCUMENTS 4,946,547 A   8/1990   Palmour
5,192,987 A   3/1993   Khan
(Continued)

FOREIGN PATENT DOCUMENTS

EP   2339635   6/2011

OTHER PUBLICATIONS

Bothe et al., "Optically-Defined 150-nm, 28-V GaN HEMT Process for Ka-Band", presented on May 1, 2019 at CS Mantech (4 pages).
(Continued)

*Primary Examiner* — Calvin Lee
(74) *Attorney, Agent, or Firm* — Myers Bigel, P.A.

(57) ABSTRACT

A power amplifier comprising a GaN-based high electron mobility transistor (HEMT) device, wherein a power added efficiency (PAE) of the power amplifier is greater than 32% at P1DB during operation of the power amplifier between 26.5 GHz and 30.5 GHz.

21 Claims, 39 Drawing Sheets

(51) Int. Cl.

| | | |
|---|---|---|
| *H01L 29/40* | (2006.01) | |
| *H01L 29/45* | (2006.01) | |
| *H01L 21/306* | (2006.01) | |
| *H01L 21/765* | (2006.01) | |
| *H01L 29/66* | (2006.01) | |
| *H01L 29/417* | (2006.01) | |
| *H03F 3/21* | (2006.01) | |
| *H03F 1/02* | (2006.01) | |
| *H01L 21/285* | (2006.01) | |

(52) U.S. Cl.
CPC ............. *H03F 1/0205* (2013.01); *H03F 3/21* (2013.01); *H03F 2200/451* (2013.01)

(56) References Cited

U.S. PATENT DOCUMENTS

| | | |
|---|---|---|
| 5,200,022 A | 4/1993 | Kong |
| 5,210,051 A | 5/1993 | Carter, Jr. |
| 5,296,395 A | 3/1994 | Khan |
| RE34,861 E | 2/1995 | Davis |
| 5,393,993 A | 2/1995 | Edmond |
| 5,523,589 A | 6/1996 | Edmond |
| 6,218,680 B1 | 4/2001 | Carter, Jr. |
| 6,316,793 B1 | 11/2001 | Sheppard |
| 6,548,333 B2 | 4/2003 | Smith |
| 7,030,428 B2 | 4/2006 | Saxler |
| 7,045,404 B2 | 5/2006 | Sheppard |
| 7,259,402 B2 | 8/2007 | Edmond |
| 7,291,529 B2 | 11/2007 | Slater |
| 7,544,963 B2 | 6/2009 | Saxler |
| 7,548,112 B2 | 6/2009 | Sheppard |
| 7,592,211 B2 | 9/2009 | Sheppard |
| 7,615,774 B2 | 11/2009 | Saxler |
| 7,709,269 B2 | 5/2010 | Smith |
| 7,932,111 B2 | 4/2011 | Edmond |
| 8,049,252 B2 | 11/2011 | Smith |
| 8,120,064 B2 | 2/2012 | Parikh |
| 8,513,686 B2 | 8/2013 | Edmond |
| 8,563,372 B2 | 10/2013 | Hagleitner |
| 9,136,396 B2 * | 9/2015 | Ko ................. H01L 29/808 257/187 |
| 9,214,352 B2 | 12/2015 | Hagleitner |
| 9,226,383 B2 | 12/2015 | Mishra et al. |
| 9,362,198 B2 | 6/2016 | Viswanathan et al. |
| 9,570,438 B1 | 2/2017 | Curatola et al. |
| 10,312,358 B2 | 6/2019 | Ren et al. |
| 2007/0164315 A1 | 7/2007 | Smith et al. |
| 2008/0035934 A1 | 2/2008 | Sheppard et al. |
| 2015/0364591 A1 | 12/2015 | Lu |
| 2018/0240902 A1 | 8/2018 | Odnoblyudov et al. |

OTHER PUBLICATIONS

Estella, Nicholas et al. "High-Efficiency, Ka-band GaN Power Amplifiers." 2019 IEEE MTT-S International Microwave Symposium (IMS) (2019): 568-571, Presented Jun. 5, 2019, (4 pages).

C. Campbell et al., "High Efficiency Ka-Band Gallium Nitride Power Amplifier MMICs," 2013 IEEE International Conference on Microwaves, Communications, Antennas and Electronic Systems (COMCAS), Oct. 2013, (5 pages).

S. Din et al., "High Power and High Efficiency Ka Band Power Amplifier," 2015 IEEE Internal Microwave Symposium (IMS), May 2015, (4 pages).

J. Cheron et al., "High-gain Over 30% PAE Power Amplifier MMICs in 100 nm GaN Technology at Ka-Band Frequencies," Proceedings of the 10th European Microwave Integrated Circuits Conference, Sep. 2015, (pp. 262-264).

P. Blount et al., "A High Efficiency, Ka-Band Pulsed Gallium Nitride Power Amplifier for Radar Applications," 2016 IEEE Compound Semiconductor Integrated Circuit Symposium (CSICS), Oct. 2016, (4 pages).

M. Roberg et al., "40W Ka-Band Single and Dual Output GaN MMIC Power Amplifiers on SiC," 2018 IEEE BiCMOS and Compound Semiconductor Integrated Circuits and Technology Symposium (BCICTS), Oct. 2018, (pp. 140-143).

Antcliffe M et al: "Gate-Recessed AlGaN—GaN HEMTs for High-Performance Millimeter-Wave Applications", IEEE Electron Device Letters, IEEE, vol. 26, No. 6, Jun. 1, 2005 (Jun. 1, 2005), pp. 348-350,XP011132383, ISSN: 0741-3106, DOI: 10.1109/LED.2005.848107.

Dammann M. etal: "Reliability status of GaN transistors and MMICs in Europe", Reliability Physics Symposium (IRPS), 2010 IEEE International, IEEE, Piscataway, NJ, USA, May 2, 2010 (May 2, 2010), pp. 129-133, XP031692348, ISBN: 978-1-4244-5430-3.

PCT Written Opinion of the International Searching Authority, dated Oct. 29, 2020 for corresponding PCT International Application No. PCT/US2020/037391 (14 pages).

PCT International Search Report, dated Oct. 29, 2020 for corresponding PCT International Application No. PCT/US2020/037391 (7 pages).

PCT Invitation to Pay Additional Fees and, Where Applicable, Protest Fee, including Annex to Form PCT/ISA/206, Communication Relating to the Results of the Partial International Search, dated Sep. 1, 2020 for corresponding PCT International Application No. PCT/US2020/037391 (10 pages).

Ando, et al., "30-GHz-Band Over 5-W Power Performance of Short-Channel AlGaN/GaN Heterojunction FETs", IEEE Transactions on Microwave Theory and Techniques, vol. 53, No. 1, Jan. 2005, pp. 74-80.

J.S. Moon et al., "Gate-Recessed AlGaN—GaN HEMTs for High-Performance Millimeter-Wave Applications", IEEE Electron Device Letters, vol. 26, No. 6, Jun. 2005, pp. 348-350.

Chakraborty et al., "High-Power AlGaN/GaN HEMTs for Ka-Band Applications", IEEE Electron Device Letters, vol. 26, No. 11, Nov. 2005, pp. 781-783.

* cited by examiner

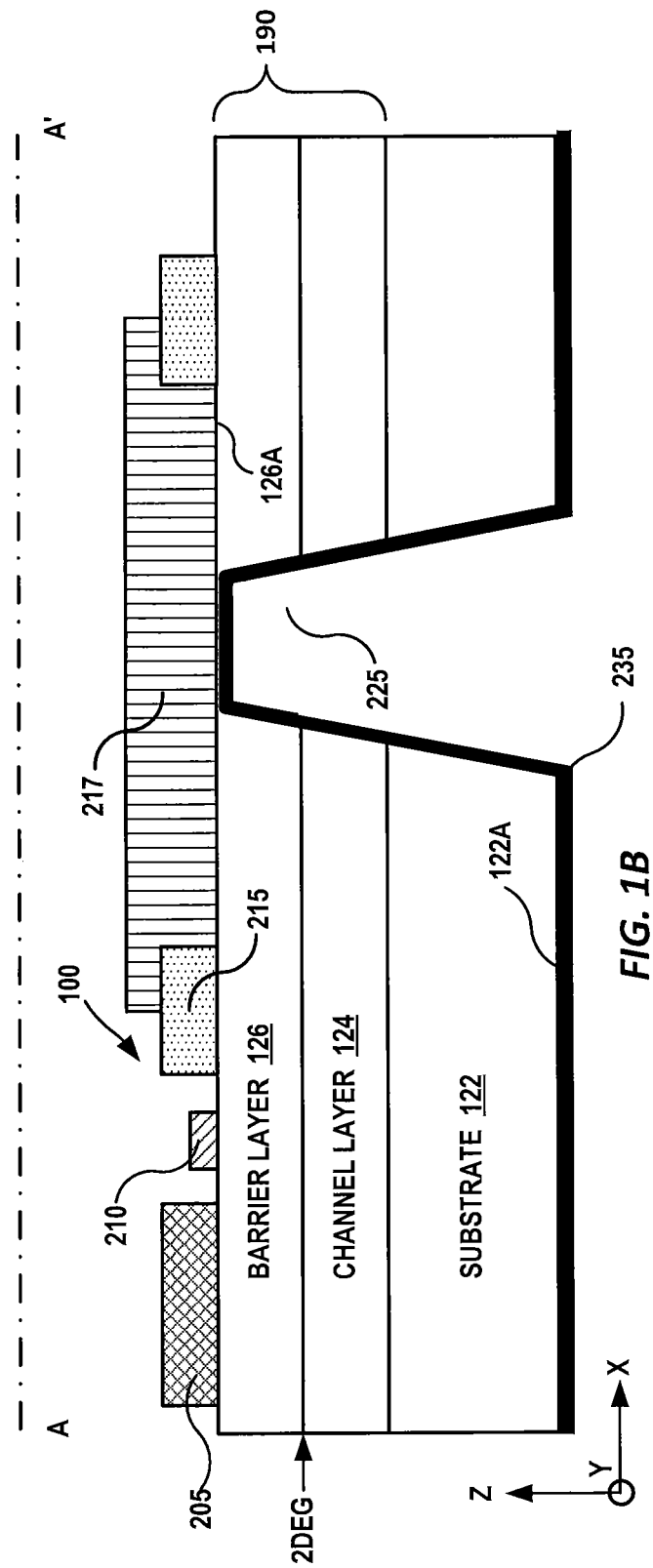

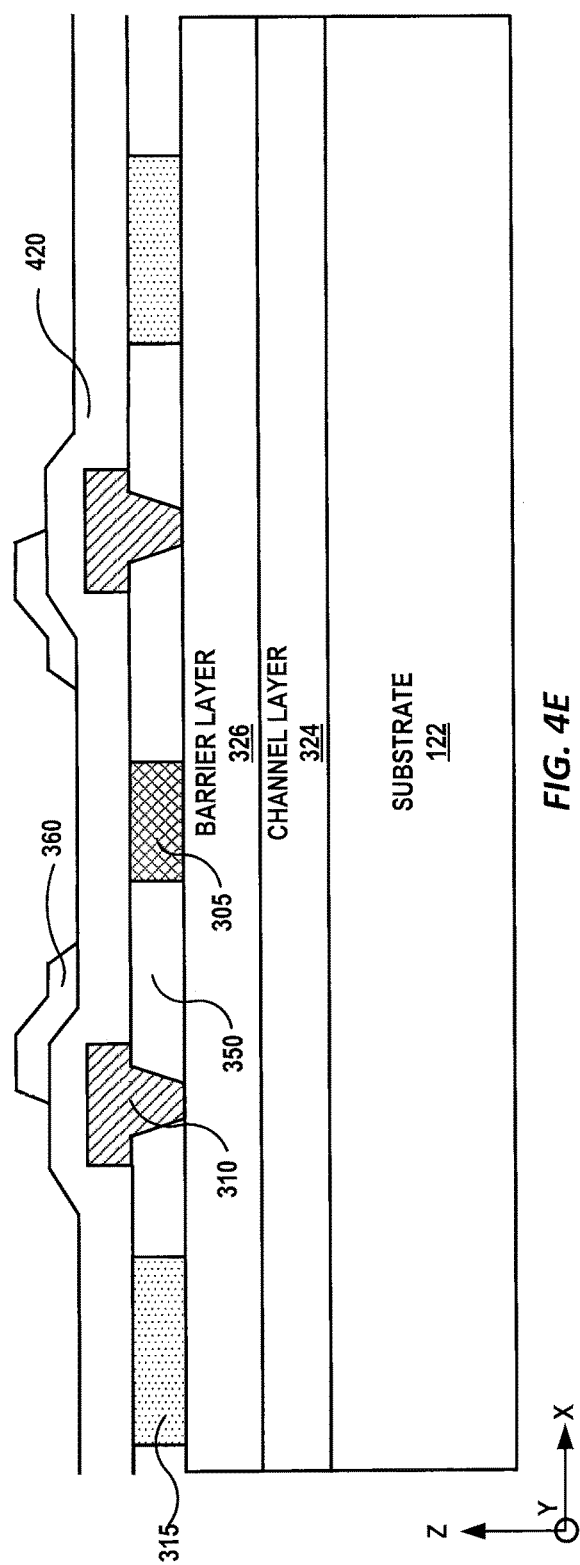
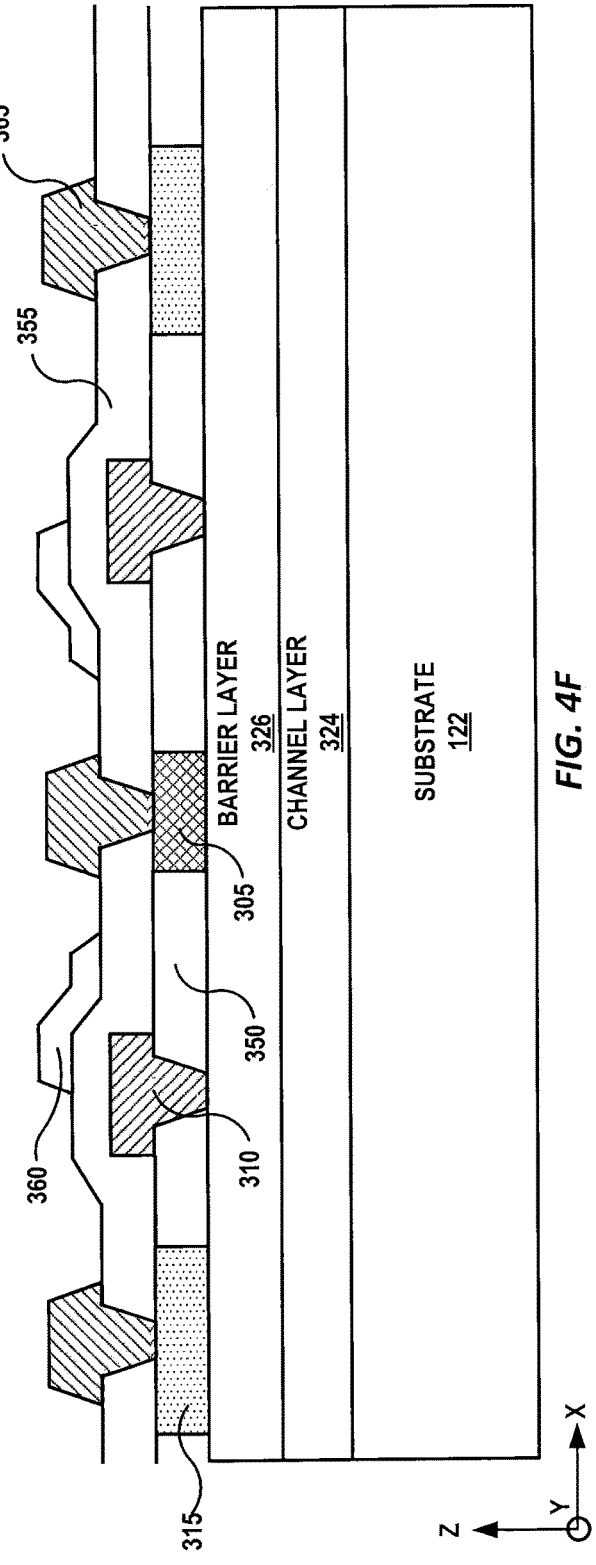

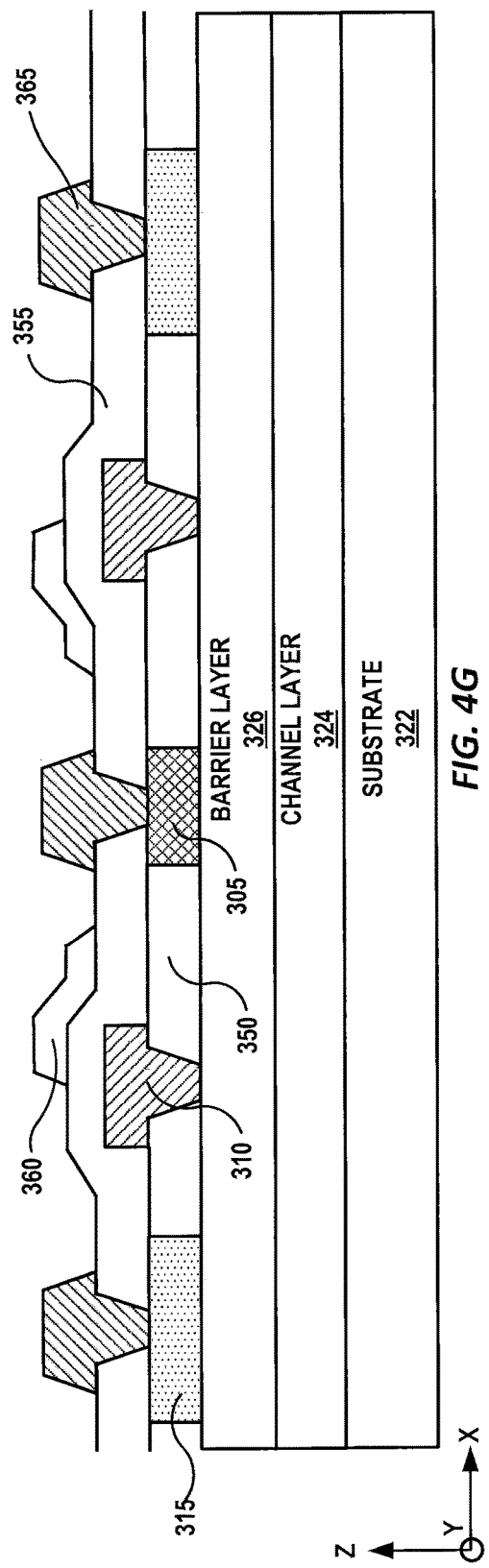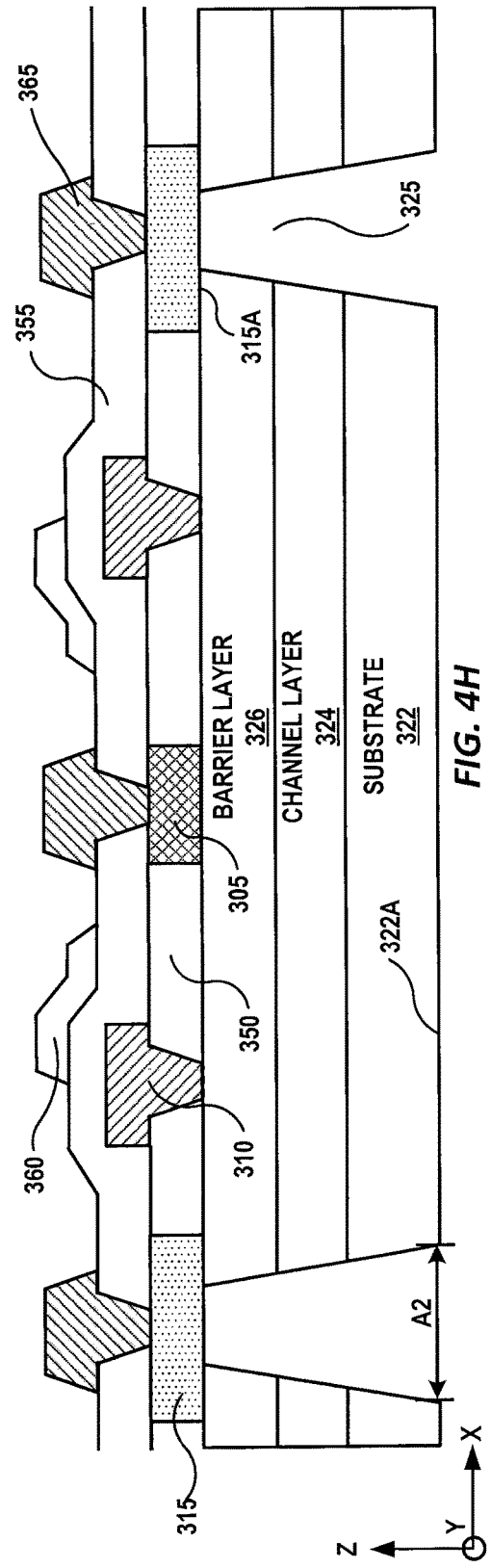

HIGH ELECTRON MOBILITY TRANSISTORS AND POWER AMPLIFIERS INCLUDING SAID TRANSISTORS HAVING IMPROVED PERFORMANCE AND RELIABILITY

CROSS-REFERENCE TO RELATED APPLICATION

This application is a continuation-in-part application of, and claims priority to, U.S. application Ser. No. 16/440,427, filed Jun. 13, 2019, the entire content of which is incorporated by reference herein.

FIELD

The inventive concepts described herein relate to semiconductor devices and, more particularly, to high electron mobility transistors.

BACKGROUND

Electronic devices formed in lower bandgap semiconductor materials such as silicon and gallium arsenide have found wide application in lower power and (in the case of silicon) lower frequency applications. These semiconductor materials may be less well suited for higher power and/or high frequency applications, however, because of their relatively small bandgaps (e.g., 1.12 eV for silicon and 1.42 eV for gallium arsenide at room temperature) and/or relatively small breakdown voltages.

For high power, high temperature, and/or high frequency applications, devices formed in wide bandgap semiconductor materials such as silicon carbide (2.996 eV bandgap for alpha silicon carbide at room temperature) and the Group III nitrides (e.g., 3.36 eV bandgap for gallium nitride at room temperature) are often used. These materials, typically, have higher electric field breakdown strengths and higher electron saturation velocities as compared to gallium arsenide and silicon.

A device of particular interest for high power and/or high frequency applications is the High Electron Mobility Transistor (HEMT). HEMT devices may offer operational advantages in a number of applications. In operation, a two-dimensional electron gas (2DEG) is formed in a HEMT device at the heterojunction of two semiconductor materials with different bandgap energies, where the smaller bandgap material has a higher electron affinity. The 2DEG is an accumulation layer in the smaller bandgap material and can contain a very high sheet electron concentration. Additionally, electrons that originate in the wider-bandgap semiconductor material transfer to the 2DEG layer, allowing a high electron mobility due to reduced ionized impurity scattering. This combination of high carrier concentration and high carrier mobility can give the HEMT a very large transconductance and may provide a strong performance advantage over metal oxide semiconductor field effect transistors (MOSFETs) for high-frequency applications.

High electron mobility transistors fabricated in Group III-nitride based material systems have the potential to generate large amounts of radio frequency (RF) power because of the combination of material characteristics that includes the aforementioned high breakdown fields, wide bandgaps, large conduction band offset, and/or high saturated electron drift velocity.

Thus, HEMT device may be advantageously utilized in a power amplifier (PA). Power amplifiers, including power amplifiers utilizing HEMT devices, often experience a trade-off between output power and bandwidth. Internal inefficiencies, such as parasitic capacitances, can impact the switching speed of the device. Smaller transistor geometries can achieve higher operating frequencies, but the smaller dimensions may result in reduced current (and power) capacity.

Improving operating characteristics of the amplifier may be assist in efficiently using the bandwidth that is available. For example, the linearity of the power amplifier may be useful in preserving the integrity of the complex modulation formats that are sometimes used to achieve high data rates. For example, some modulation schemes may rely on the receiver being able to differentiate variations in the signal's amplitude, and linearity in a power amplifier is useful in preserving the amplitude variation in the signal. If the transmitted signal is distorted, for example, by gain compression of the power amplifier at a particular output power, then the receiver may have difficulty decoding information that is based on the amplitude portion of the modulation.

SUMMARY

Embodiments described herein provide improved GaN-based HEMT devices and improved power amplifier comprising such HEMT devices.

Pursuant to some embodiments of the present invention, a power amplifier includes a GaN-based high electron mobility transistor (HEMT) device, and a power added efficiency (PAE) of the power amplifier is greater than 32% at an output power at 1 dB compression (P1dB) during operation of the power amplifier between 26.5 GHz and 30.5 GHz.

In some embodiments, the power amplifier is configured to generate a power density greater than 3.5 W/mm while operating at 30 GHz.

In some embodiments, the P1dB value of the power amplifier is within 1 dB of maximum measured power during operation of the power amplifier between 26 GHz and 30.5 GHz.

In some embodiments, a ratio of quiescent drain current to power output is approximately 12.5 mA/W or less.

In some embodiments, the GaN-based HEMT device further includes a channel layer and a barrier layer, sequentially stacked on a substrate, a source contact comprising a first ohmic portion on the barrier layer, and a via extending in the channel layer, barrier layer, and substrate to the first ohmic portion of the source contact.

In some embodiments, a combined thickness of the substrate, channel layer, and barrier layer is between 40 μm and 80 μm.

In some embodiments, the power amplifier further includes a first stage configured to provide gain compression and a second stage configured to provide gain expansion.

In some embodiments, the first stage is biased in class A mode, and the second stage is biased in class AB mode.

In some embodiments, a drive ratio between the first stage and the second stage is approximately 1:2.

Pursuant to some embodiments of the present invention, a power amplifier includes a GaN-based high electron mobility transistor (HEMT) device configured to operate for greater than 1000 hours in a high-temperature-reverse-bias (HTRB) operation at 84 V drain bias.

In some embodiments, a power added efficiency (PAE) of the power amplifier is greater than 32% at an output power at 1 dB compression (P1dB) during operation of the power amplifier between 26.5 GHz and 30.5 GHz.

In some embodiments, the P1dB value of the power amplifier is within 1 dB of maximum measured power during operation of the power amplifier between 26 GHz and 30.5 GHz.

In some embodiments, the HTRB operation is operated with a temperature of 150° C.

In some embodiments, after operating the HTRB operation for 1000 hours a gate leakage of the HEMT device is between $1\times10^{-4}$ and $1\times10^{-3}$ A.

In some embodiments, a ratio of quiescent drain current to power output is approximately 12.5 mA/W or less.

In some embodiments, the GaN-based HEMT device includes a channel layer and a barrier layer sequentially stacked on a substrate, a source contact comprising a first ohmic portion on the barrier layer, and a via extending in the channel layer, barrier layer, and substrate to the first ohmic portion of the source contact.

In some embodiments, a combined thickness of the substrate, channel layer, and barrier layer is between 40 μm and 80 μm.

In some embodiments, the power amplifier further includes a gate contact on the barrier layer, wherein the gate contact comprises a first portion and a second portion on the first portion, and where the second portion extends beyond one or more sidewalls of the first portion.

In some embodiments, the second portion of the gate contact extends beyond a sidewall of the first portion of the gate contact towards the source contact by a distance that is between 0.5 μm and 0.15 μm.

In some embodiments, the power amplifier further includes a drain contact on the barrier layer, and the second portion of the gate contact extends beyond a sidewall of the first portion of the gate contact towards the drain contact by a distance that is between 0.5 μm and 0.15 μm.

In some embodiments, the first portion of the gate contact comprises a lower surface that is adjacent the barrier layer, and a length of the lower surface of the first portion of the gate contact is between 120 nm and 180 nm.

In some embodiments, the power amplifier further includes a first insulating layer on the barrier layer, and the second portion of the gate contact is on the first insulating layer.

In some embodiments, the power amplifier further includes a drain contact on the barrier layer and in the first insulating layer, a second insulating layer on the first insulating layer and the drain contact, and a field plate on the second insulating layer, where the field plate extends beyond a sidewall of the second portion of the gate contact towards the drain contact by a distance that is between 0.3 μm and 0.5 μm.

In some embodiments, the power amplifier is configured to operate in the Ka band.

Pursuant to some embodiments of the present invention, a GaN-based high electron mobility transistor (HEMT) device is configured to operate for greater than 1000 hours in a high-temperature-reverse-bias (HTRB) operation at 84 V drain bias.

In some embodiments, the HTRB operation is operated with a temperature of 150° C.

In some embodiments, after operating the HTRB operation for 1000 hours a gate leakage of the HEMT device is between $1\times10^{-4}$ and $1\times10^{-3}$ A.

In some embodiments, the GaN-based HEMT further includes a channel layer and a barrier layer sequentially stacked on a substrate, a source contact comprising a first ohmic portion on the barrier layer, and a via extending in the channel layer, barrier layer, and substrate to the first ohmic portion of the source contact.

In some embodiments, a combined thickness of the substrate, channel layer, and barrier layer is between 40 μm and 80 μm.

In some embodiments, the GaN-based HEMT further includes a gate contact on the barrier layer, where the gate contact comprises a first portion and a second portion on the first portion, and the second portion extends beyond one or more sidewalls of the first portion.

In some embodiments, the second portion of the gate contact extends beyond a sidewall of the first portion of the gate contact towards the source contact by a distance that is between 0.5 μm and 0.15 μm.

In some embodiments, the GaN-based HEMT further includes a drain contact on the barrier layer, and the second portion of the gate contact extends beyond a sidewall of the first portion of the gate contact towards the drain contact by a distance that is between 0.5 μm and 0.15 μm.

In some embodiments, the first portion of the gate contact comprises a lower surface that is adjacent the barrier layer, and a length of the lower surface of the first portion of the gate contact is between 120 nm and 180 nm.

In some embodiments, the GaN-based HEMT further includes a first insulating layer on the barrier layer and the second portion of the gate contact is on the first insulating layer.

In some embodiments, the GaN-based HEMT further includes a drain contact on the barrier layer and in the first insulating layer, a second insulating layer on the first insulating layer and the drain contact, and a field plate on the second insulating layer, where the field plate extends beyond a sidewall of the second portion of the gate contact towards the drain contact by a distance that is between 0.3 μm and 0.5 μm.

In some embodiments, the HEMT device is configured to operate in the Ka band.

BRIEF DESCRIPTION OF THE DRAWINGS

FIG. 1B is a schematic cross-sectional view taken along line A-A' of FIG. 1A.

FIGS. 4A to 4I illustrate a method of fabricating a HEMT device, according to embodiments of the present invention.

DETAILED DESCRIPTION

Embodiments of the present inventive concepts are described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the present invention are directed to high electron mobility transistors that may exhibit improved device density and switching performance.

Figure 1A:
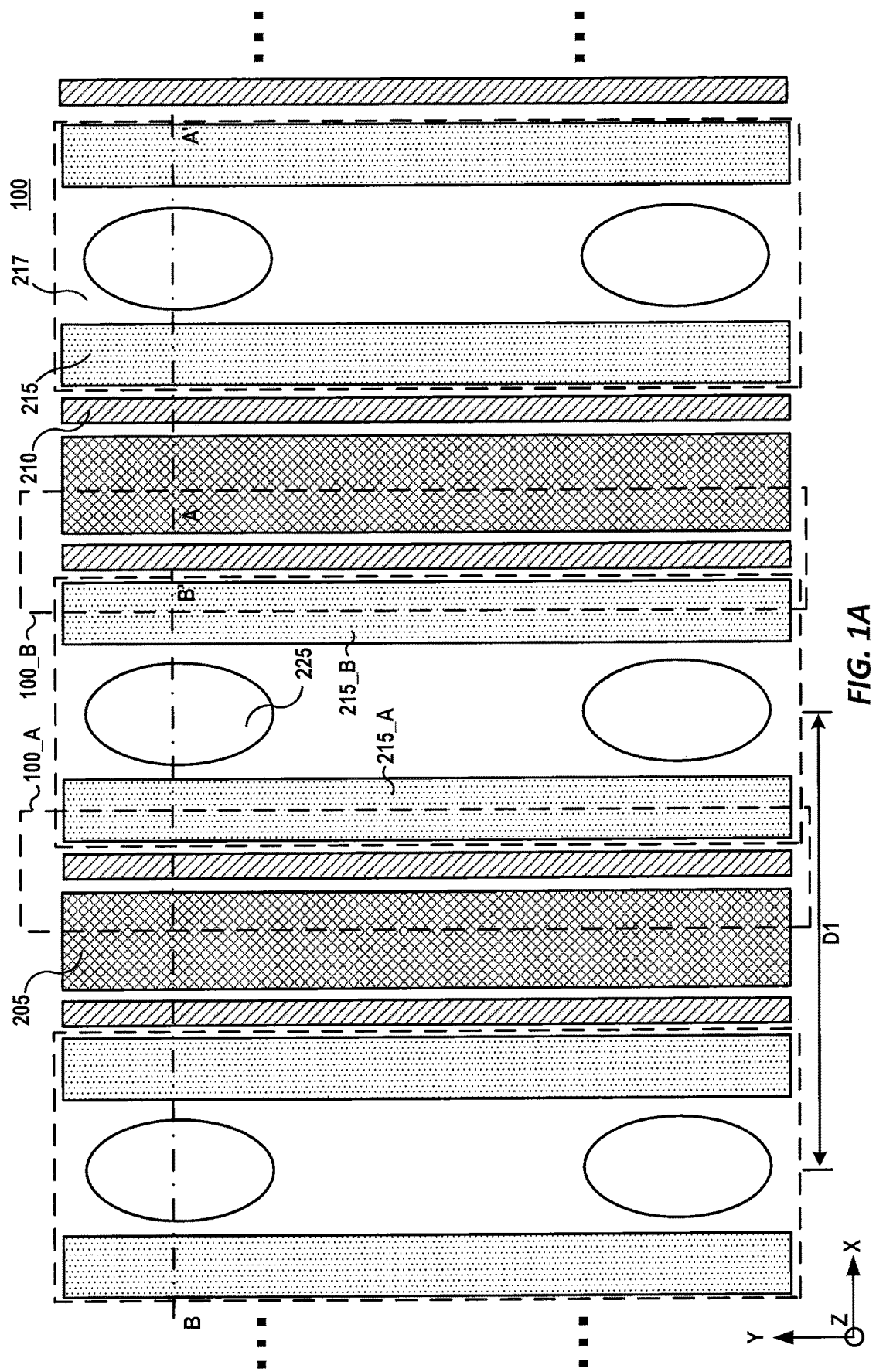
FIG. 1A is a schematic plan view of a conventional high electron mobility transistor.
Figure 1C:
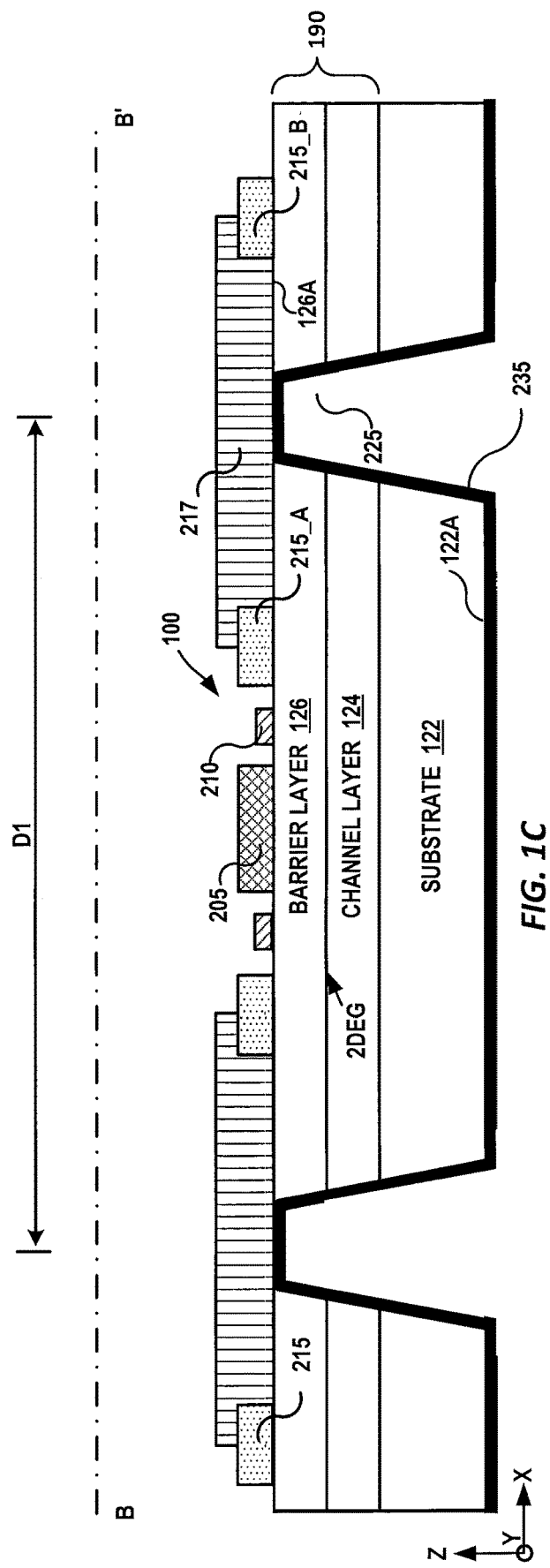
FIG. 1C is a schematic cross-sectional view taken along line B-B' of FIG. 1A.

FIG. 1A is a schematic plan view of a conventional high electron mobility transistor 100, while FIG. 1B is a schematic cross-sectional view of the high electron mobility transistor 100 taken along line A-A' of FIG. 1A and FIG. 1C is a schematic cross-sectional view of the high electron mobility transistor 100 taken along line B-B' of FIG. 1A. As shown in FIGS. 1A-1C, the high electron mobility transistor 100 may be formed on a substrate 122 such as, for example, a silicon carbide substrate. A channel layer 124 is formed on the substrate 122. A barrier layer 126 is formed on the channel layer 124 opposite the substrate 122. The channel layer 124 may include, for example, gallium-nitride (GaN) and the barrier layer 126 may include, for example, aluminum gallium-nitride (AlGaN).

The channel layer 124, and barrier layer 126 may together form a semiconductor structure 190 on the substrate 122. A source contact 215 and a drain contact 205 are formed on an upper surface of the barrier layer 126 and are laterally spaced apart from each other. The source contact 215 and the drain contact 205 may form an ohmic contact to the barrier layer 126.

A gate contact 210 is formed on the upper surface of the barrier layer 126 between the source contact 215 and the drain contact 205. A two-dimensional electron gas (2DEG) layer is formed at a junction between the channel layer 124 and the barrier layer 126 when the HEMT device 100 is biased to be in its conducting or "on" state. The 2DEG layer acts as a highly conductive layer that allows current to flow between the source and drain regions of the device that are beneath the source contact 215 and the drain contact 205, respectively.

The source contact 215 may be coupled to a reference signal such as, for example, a ground voltage. The coupling to the reference signal may be provided by a via 225 that extends from a lower surface 122A of the substrate 122, through the substrate 122 to an upper surface 126A of the barrier layer. A metallization layer 217 may be deposited on the via 225 and on two adjacent source contacts 215 to electrically connect the two adjacent source contacts 215. The metallization layer may be formed of a conductive metal.

The via 225 may expose a surface of the metallization layer 217. A backmetal layer 235 may be formed on the lower surface 122A of the substrate 122 and on side walls of the via 225. The backmetal layer 235 may directly contact the metallization layer 217. Thus, the backmetal layer 235, and a signal coupled thereto, may be electrically connected to the two adjacent source contacts 215.

The HEMT device 100 may be made up of a plurality of transistor unit cells, examples of which are designated as 100_A and 100_B in FIG. 1A. Respective ones of the transistor unit cells 100_A, 100_B may include a source contact 215, a drain contact 205, and a gate contact 210. A first ohmic source contact (e.g., 215_A) of a first one of the transistor unit cells 100_A may be separate from a second ohmic source contact (e.g., 215_B) of a second one of the transistor unit cells 100_B. The source contact 215, drain contact 205, and gate contact 210 may only represent a subset of the total number of source contacts 215, drain contacts 205, and gate contacts 210 of the HEMT device 100.

Referring to FIG. 1A, a size of the resulting HEMT device 100 may be impacted by a source-to-source distance D1 between adjacent ones of the source contacts 215 and/or vias 225. As illustrated in FIGS. 1A and 1C, the distance D1 may be measured (e.g., in the X direction of FIG. 1A) between adjacent ones one of the vias 225 and/or between adjacent ones of the combination of two adjacent source contacts 215 interconnected by the metallization layer 217. The distance D1 may be, in some embodiments, a center-to-center distance. For example, in some embodiments, D1 may be measure from a center of a first via 225 to a center of a second via 225 that is adjacent in the X direction. In conventional devices, the distance D1 may be 120 μm or more.

The present invention results from a realization that a dimension of a semiconductor device may be decreased by directly connecting a via to a source contact without the requirement of an interconnecting metallization layer, such as the interconnecting metallization layer 217 illustrated in FIGS. 1B and 1C. The substrate may also be thinned to allow for a reduction in the horizontal cross-sectional area of the via, further reducing the area of the device. In addition to the density improvements that may result from reducing the area of the device, an overall parasitic capacitance may also be decreased. A reduced parasitic capacitance may lead to additional improvements in switching frequency of the resulting circuit.

Figure 2A:
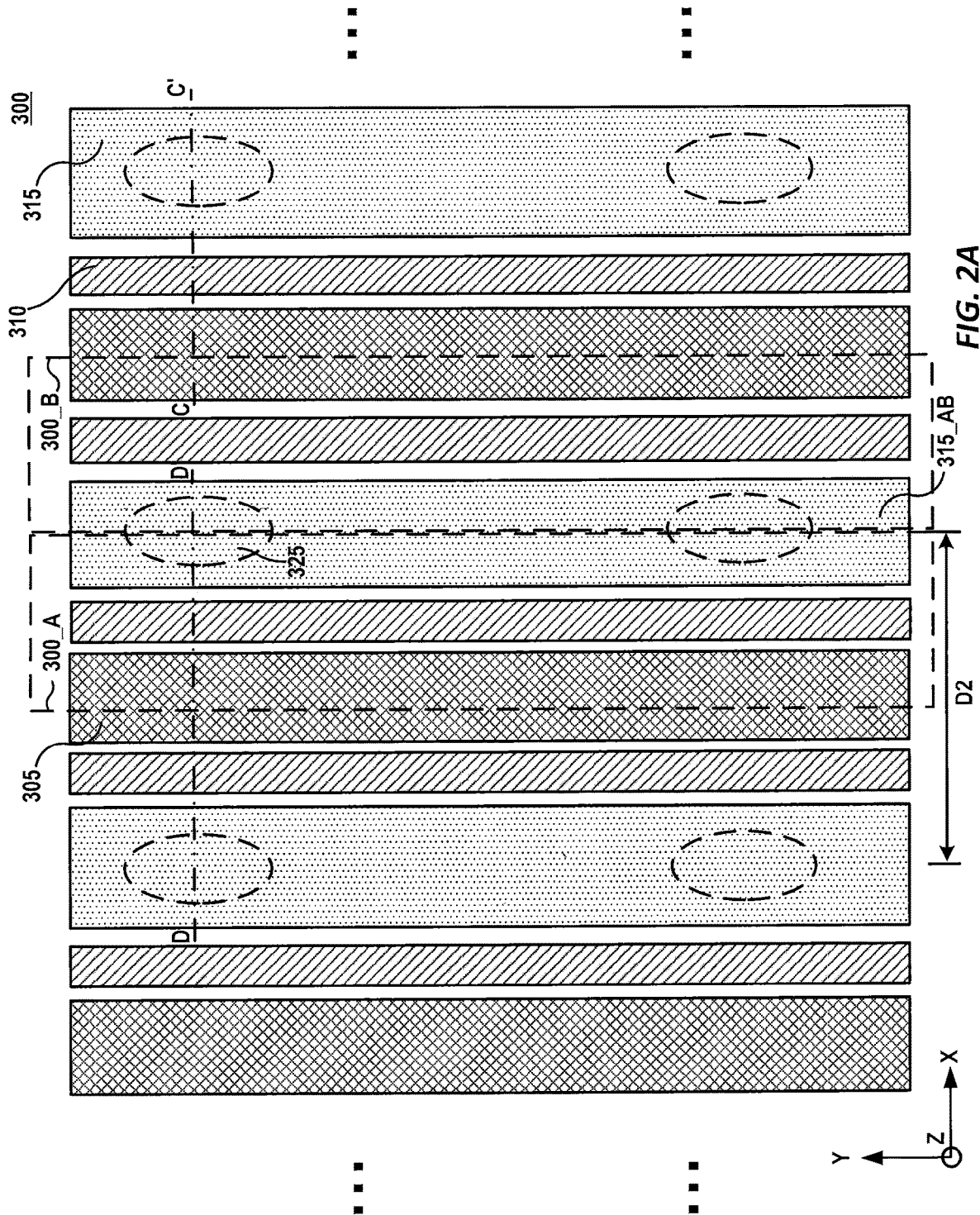
FIG. 2A is a schematic plan view of a HEMT device according to embodiments of the present invention.
Figure 2B:
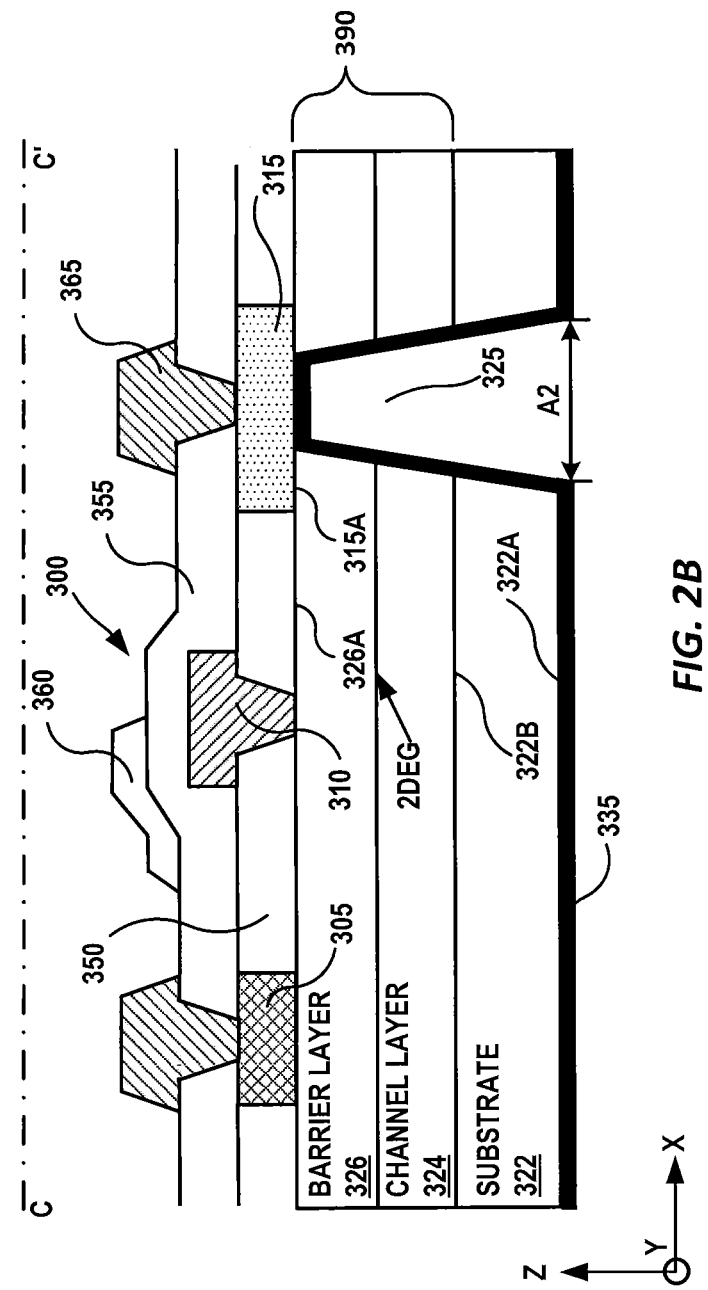
FIG. 2B is a schematic cross-sectional view of the HEMT device taken along line C-C' of FIG. 2A.
Figure 2C:
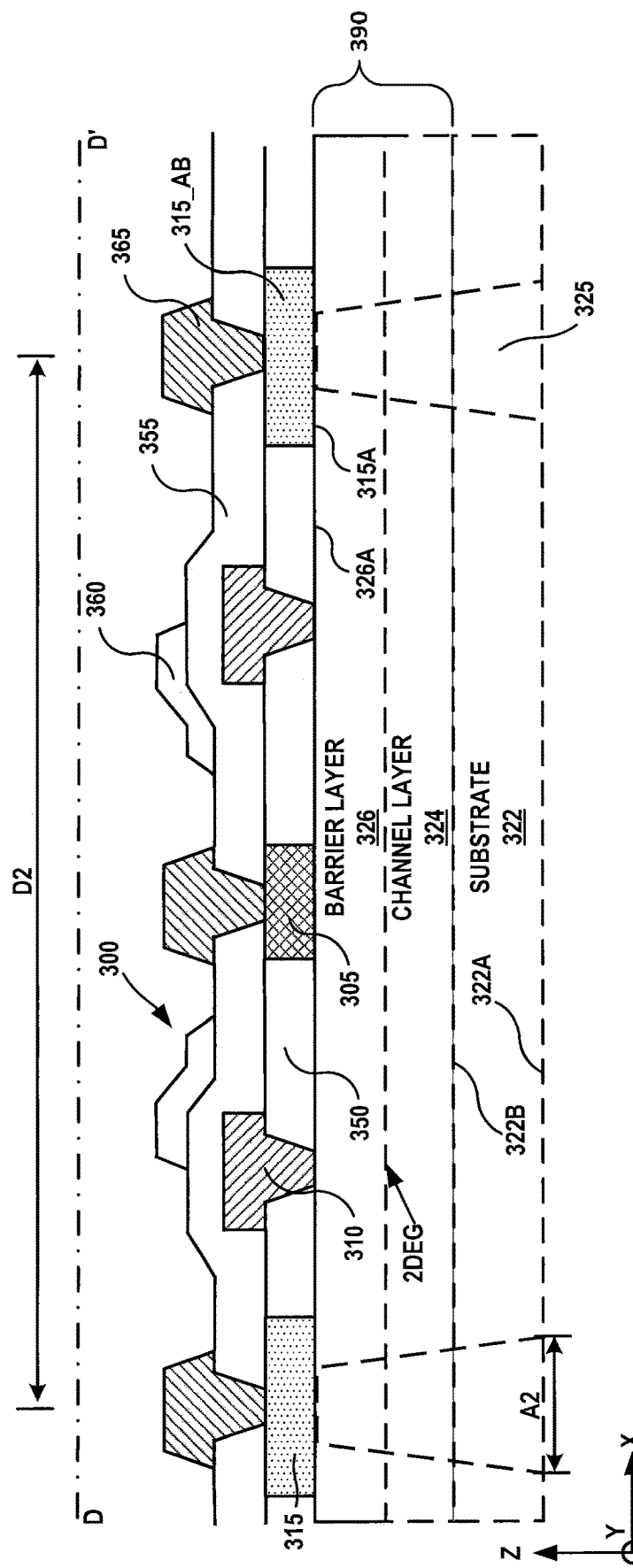
FIG. 2C is a schematic cross-sectional view of the HEMT device taken along line D-D' of FIG. 2A.

FIG. 2A is a schematic plan view of a HEMT device 300 according to embodiments of the present invention, while FIG. 2B is a schematic cross-sectional view of the HEMT device 300 taken along line C-C' of FIG. 2A and FIG. 2C is a schematic cross-sectional view of the HEMT device 300 taken along line D-D' of FIG. 2A. FIGS. 2A, 2B, and 2C are intended to represent structures for identification and description and are not intended to represent the structures to physical scale. In addition, though FIGS. 2A, 2B, and 2C are illustrated so as to allow for general comparison with the structures of FIGS. 1A, 1B, and 1C, it will be understood that the scale of FIGS. 2A-2C is not intended to be identical to that of FIGS. 1A-1C.

As shown in FIGS. 2A-2C, a semiconductor structure 390, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

In some embodiments of the present invention, the silicon carbide bulk crystal of the substrate 322 may have a resistivity equal to or higher than about $1 \times 10^5$ ohm-cm at room temperature. Exemplary SiC substrates that may be used in some embodiments of the present invention are manufactured by, for example, Cree, Inc., of Durham, N.C., the assignee of the present invention, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a silicon carbide wafer, and the HEMT device 300 may be formed, at least in part, via wafer-level processing, and the wafer may then be diced to provide a plurality of individual high electron mobility transistors 300.

The substrate 322 may have a lower surface 322A and an upper surface 322B. In some embodiments, the substrate 322 of the HEMT device 300 may be a thinned substrate 322. In some embodiments, the thickness of the substrate 322 (e.g., in a vertical Z direction in FIG. 2B) may be 100 µm or less. In some embodiments, the thickness of the substrate 322 may be 75 µm or less. In some embodiments, the thickness of the substrate 322 may be 50 µm or less.

A channel layer 324 is formed on the upper surface 322B of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials.

In some embodiments, the channel layer 324 may be a Group III nitride, such as $Al_xGa_{1-x}N$, where $0 \leq x < 1$, provided that the energy of the conduction band edge of the channel layer 324 is less than the energy of the conduction band edge of the barrier layer 326 at the interface between the channel and barrier layers 324, 326. In certain embodiments of the present invention, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 µm. The channel layer 324 may also be a multi-layer structure, such as a superlattice or combinations of GaN, AlGaN or the like. The channel layer 324 may be under compressive strain in some embodiments.

In some embodiments, the barrier layer 326 is MN, AlInN, AlGaN or AlInGaN or combinations of layers thereof. The barrier layer 326 may comprise a single layer or may be a multi-layer structure. In particular embodiments of the present invention, the barrier layer 326 may be thick enough and may have a high enough aluminum (Al) composition and doping to induce a significant carrier concentration at the interface between the channel layer 324 and the barrier layer 326 through polarization effects when the barrier layer 326 is buried under ohmic contact metal. The barrier layer 326 may, for example, be from about 0.1 nm to about 30 nm thick, but is not so thick as to cause cracking or substantial defect formation therein. Barrier layer thicknesses in the range of 15-30 nm are common. In certain embodiments, the barrier layer 326 is undoped or doped with an n-type dopant to a concentration less than about $10^{19}$ $cm^{-3}$. In some embodiments of the present invention, the barrier layer 326 is $Al_xGa_{1-x}N$ where $0<x<1$. In particular embodiments, the aluminum concentration is about 25%. However, in other embodiments of the present invention, the barrier layer 326 comprises AlGaN with an aluminum concentration of between about 5% and less than about 100%. In specific embodiments of the present invention, the aluminum concentration is greater than about 10%. The channel layer 324 and/or the barrier layer 326 may be deposited, for example, by metal-organic chemical vapor deposition (MOCVD), molecular beam epitaxy (MBE), or hydride vapor phase epitaxy (HVPE). As discussed above with respect to the conventional HEMT device 100, a 2DEG layer is induced in the channel layer 324 at a junction between the channel layer 324 and the barrier layer 326. The 2DEG layer acts as a highly conductive layer that allows conduction between the source and drain regions of the device that are beneath the source contact 315 the drain contact 305, respectively. The channel layer 324 and the barrier layer 326 form the semiconductor structure 390.

While semiconductor structure 390 is shown with channel layer 324 and barrier layer 326 for purposes of illustration, semiconductor structure 390 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface 322B of the substrate 322 to provide an appropriate crystal structure transition between the silicon carbide substrate 322 and the remainder of the HEMT device 300. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HYPE.

A source contact 315 and a drain contact 305 may be formed on an upper surface 326A of the barrier layer 326 and may be laterally spaced apart from each other. A gate contact 310 may be formed on the upper surface 326A of the barrier layer 326 between the source contact 315 and the drain contact 305. The material of the gate contact 310 may be chosen based on the composition of the barrier layer 326, and may, in some embodiments, be a Schottky contact. Conventional materials capable of making a Schottky contact to a gallium nitride based semiconductor material may be used, such as, for example, nickel (Ni), platinum (Pt), nickel silicide ($NiSi_x$), copper (Cu), palladium (Pd), chromium (Cr), tungsten (W) and/or tungsten silicon nitride (WSiN).

The source contact 315 and the drain contact 305 may include a metal that can form an ohmic contact to a gallium nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), $NiSi_x$, titanium silicide (TiSi), titanium nitride (TiN), WSiN, Pt and the like. In some embodiments, the source contact 315 may be an ohmic source contact 315. Thus, the source contact 315 and the drain contact 305 may contain an ohmic contact portion in direct contact with the barrier layer 326. In some embodiments, the source contact 315 and/or the drain contact 305 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

The source contact 315 may be coupled to a reference signal such as, for example, a ground voltage. The coupling to the reference signal may be provided by a via 325 that extends from a lower surface 322A of the substrate 322, through the substrate 322 to an upper surface 326A of the barrier layer. The via 325 may expose a bottom surface of the ohmic portion 315A of the source contact 315. A backmetal layer 335 may be formed on the lower surface 322A of the substrate 322 and on side walls of the via 325. The backmetal layer 335 may directly contact the ohmic portion 315A of the source contact 315. In some embodiments a contact area between the backmetal layer 335 and the bottom surface of the ohmic portion 315A of the source contact 315 may be fifty percent or more of an area of the bottom surface of the ohmic portion 315A of the source contact 315. Thus, the backmetal layer 335, and a signal coupled thereto, may be electrically connected to the source contact 315.

In some embodiments, as illustrated in FIG. 2A, the via 325 may have an oval or circular cross-section when viewed in a plan view. However, the present invention is not limited thereto. In some embodiments, a cross-section of the via 325 may be a polygon or other shape, as will be understood by one of ordinary skill in the art. In some embodiments, dimensions of the via (e.g., a length and/or a width) may be such that a largest cross-sectional area A2 of the via 325 is 1000 µm$^2$ or less. The cross-sectional area A2 may be taken in a direction that is parallel to the lower surface 322A of the substrate 322 (e.g., the X-Y plane of FIG. 2B). In some embodiments, the largest cross-sectional area A2 of the via 325 may be that portion of the via 325 that is adjacent the lower surface 322A of the substrate 322 (e.g., the opening of the via 325). For example, in some embodiments, a greatest width (e.g., in the X direction in FIG. 2A) may be 16 µm and a greatest length (e.g., in the Y direction in FIG. 2A) may be 40 µm, though the present invention is not limited thereto. The largest cross-sectional area A2 of the via 325 according to embodiments of the present invention may be reduced from that of the conventional device (such as that illustrated in FIGS. 1A-1C), where the largest cross-sectional area of the via may be 35 µm by 75 µm or larger. In some embodiments, the reduction in the cross-sectional area A2 of the via 325 may be accomplished at least in part based on the reduced thickness of the substrate 322. In some embodiments, sidewalls of the via 325 may be inclined and/or slanted with respect to the lower surface 322A of the substrate 322.

In some embodiments, the source contact 315, the drain contact 305, and the gate contact 310 may be formed as a plurality of source contacts 315, drain contacts 305, and gate contacts 310 on the substrate 322. Referring to FIG. 2A, a plurality of drain contacts 305 and source contacts 315 may be alternately arranged on the substrate 322. A gate contact 310 may be disposed between adjacent drain contacts 305 and source contacts 315 to form a plurality of transistor unit cells, examples of which are designated as 300_A and 300_B in FIG. 2A. Respective ones of the transistor unit cells 300_A, 300_B may include a source contact 315, a drain contact 305, and a gate contact 310. An ohmic source contact (e.g., 315_AB) of a first one of the transistor unit cells 300_A may be shared with of a second one of the transistor unit cells 300_B. FIG. 2A illustrates a subset of the source contacts 315, drain contacts 305, and gate contacts 310 for ease of discussion, but it will be understood that the HEMT device 300 may have additional structures, including additional source contacts 315, drain contacts 305, and gate contacts 310, that are not illustrated in FIG. 2A.

In some embodiments, each of the a plurality of source contacts 315, drain contacts 305, and gate contacts 310 on the substrate 322 may extend in a first direction (e.g., the Y direction of FIG. 2A). A distance D2 measured (e.g., in the X direction of FIGS. 2A and 2C) between adjacent source contacts 315 with at least one drain contact 305 therebetween may be reduced from the conventional HEMT device, such as the HEMT device 100 illustrated in FIGS. 1A and 1B. In some embodiments, the distance D2 between adjacent source contacts 315 having a drain contact 305 therebetween may be 90 μm or less. In some embodiments, the distance D2 between adjacent source contacts 315 having a drain contact 305 therebetween may be 75 μm or less. In some embodiments, the distance D2 between adjacent source contacts 315 may be 60 μm or less. In some embodiments, the distance D2 between adjacent source contacts 315 may be 50 μm or less. In some embodiments, a plurality of vias 325 may be connected to respective ones of the source contacts 315. The distance D2 may be, in some embodiments, a center-to-center distance between the source contacts 315 and/or the vias 325. For example, in some embodiments, the distance D2 may be measured from a center (e.g., in the X direction) of a first source contact 315 to a center of a second source contact 315 that is adjacent in the X direction. The distance D2 may extend from the center of the first source contact 315, across a drain contact 305, to the center of the second source contact 315. In some embodiments, the distance D2 may extend from a center of an ohmic portion of the first source contact 315 to a center of an ohmic portion of the second source contact 315 that is adjacent in the X direction. In some embodiments, D2 may be measured from a center of a first via 325 that is connected to the first source contact 315 to a center of a second via 325 that is connected to the second source contact 315 that is adjacent in the X direction.

As will be understood by one of ordinary skill in the art, a HEMT transistor may be formed by the active region between the source contact 315 and the drain contact 305 under the control of a gate contact 310 between the source contact 315 and the drain contact 305. As illustrated in FIG. 2A, the HEMT device 300 may include adjacent HEMT unit transistors 300_A, 300_B sharing a source contact 315. By sharing the source contact 315 between adjacent HEMT transistors and reducing a size of the via 325, the distance D2 measured between adjacent source contacts 315 with at least one drain contact 305 therebetween may be reduced from the source to source distance (see FIGS. 1A and 1C, D1) of the conventional HEMT device 100.

In some embodiments, a width of the source contact 315 and/or source region may also be reduced from the conventional HEMT device 100. In some embodiments, for example, a width of the source contact 315 (e.g., in the X direction of FIGS. 2A-2C) may be within 75% to 125% of the width of the drain contact 305. In other words, by reducing the size of the via 325, a width of the source contact 315 may be reduced between two adjacent gate contacts 310.

Referring again to FIGS. 2B and 2C, the HEMT device 300 may include a first insulating layer 350 and a second insulating layer 355. The first insulating layer 350 may directly contact the upper surface of the semiconductor structure 390 (e.g., contact the upper surface 326A of the barrier layer 326). The second insulating layer 355 may be formed on the first insulating layer 350. It will also be appreciated that more than two insulating layers may be included in some embodiments. The first insulating layer 350 and the second insulating layer 355 may serve as passivation layers for the HEMT device 300.

The source contact 315, the drain contact 305, and the gate contact 310 may be formed in the first insulating layer 350. In some embodiments, at least a portion of the gate contact 310 may be on the first insulating layer. In some embodiments, the gate contact 310 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 305, gate contact 310, and source contact 315.

Field plates 360 may be formed on the second insulating layer 355. At least a portion of a field plate 360 may be on the gate contact 310. At least a portion of the field plate 360 may be on a portion of the second insulating layer 355 that is between the gate contact 310 and the drain contact 305. The field plate 360 can reduce the peak electric field in the HEMT device 300, which can result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is hereby incorporated herein in its entirety by reference.

Metal contacts 365 may be disposed in the second insulating layer 355. The metal contacts 365 may provide interconnection between the drain contact 305, gate contact 310, and source contact 315 and other parts of the HEMT device 300. Respective ones of the metal contacts 365 may directly contact respective ones of the drain contact 305 and/or source contact 315. The metal contacts 365 may contain metal or other highly conductive material, including, for example, copper, cobalt, gold, and/or a composite metal. For ease of illustration, the second insulating layer 355, the field plates 360, and the metal contacts 365 are not illustrated in FIG. 2A.

The HEMT device 300 of FIGS. 2A, 2B, and 2C results in a grouping of HEMT transistors having a reduced spacing. By sharing the source contact 315 between adjacent ones of the HEMT transistors and reducing a size of the via 325 connecting the source contact 315 to the backmetal layer 335, a spacing between adjacent source contacts 315 of the HEMT transistors may be reduced. A reduction of the spacing may result in a decrease in the overall parasitic capacitance of the HEMT device 300. A reduced parasitic capacitance may lead to additional improvements in switching frequency of the HEMT device 300.

In FIG. 2C, for ease of discussion, the backmetal layer 335 is omitted and the structure of the vias 325 and semiconductor structure 390 are illustrated as dashed lines. One of ordinary skill in the art will recognize that the reduced spacing D2 between adjacent source contacts may be achieved using an alternate configuration of the vias 325 and/or the semiconductor structure 390 than that illustrated in FIGS. 2A-2C.

Figure 3:
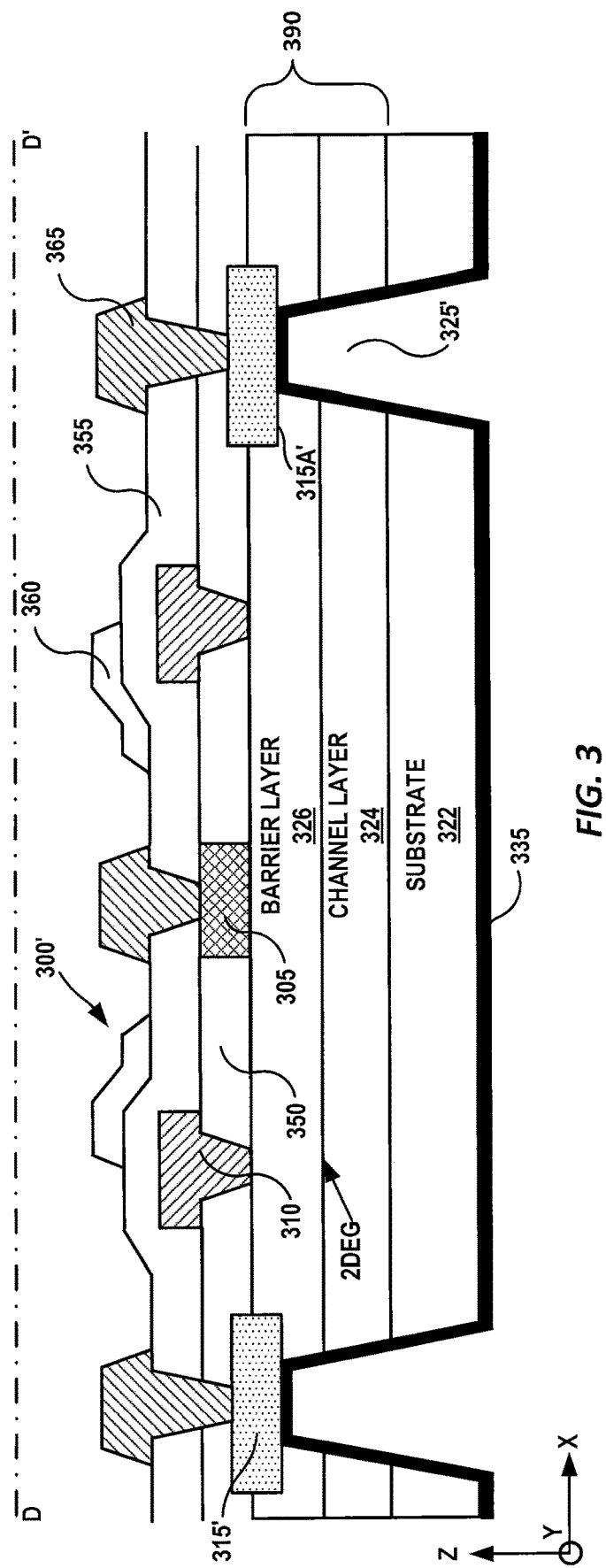
FIG. 3 is a schematic cross-sectional view of an additional embodiment of a HEMT device taken along line D-D' of FIG. 2A, according to embodiments of the present invention.

FIG. 3 is a schematic cross-sectional view of an additional embodiment of a HEMT device 300' taken along line D-D' of FIG. 2A, according to embodiments of the present invention. Portions of FIG. 3 are substantially the same or similar as those illustrated in FIGS. 2B and 2C, and a repeat description thereof will be omitted for brevity. The HEMT device 300' may share a substantially similar plan view as that of the HEMT device 300 of FIG. 2A and, as such, a duplicate illustration thereof is omitted.

Referring to FIG. 3, the HEMT device 300' may have source contacts 315' that are recessed with respect to a surface of the barrier layer 326. A bottom surface 315A' of the ohmic portion of the source contact 315' may be lower (e.g., nearer the substrate 322) than an uppermost surface of the barrier layer 326. Sidewalls and/or lateral surfaces of the source contact 315' may be in contact with portions of the barrier layer 326. In some embodiments, as illustrated in FIG. 3, the via 325 may extend through the barrier layer 326 to directly contact the bottom surface 315A' of the ohmic portion of the source contact 315'. An uppermost portion of the backmetal layer 335 within the via 325' (e.g., a portion of the backmetal layer 335 that is farthest from the substrate 322) may be lower than an upper surface 326A of the barrier layer 326. The uppermost portion of the backmetal layer 335 may directly contact the bottom surface 315A' of the ohmic portion of the source contact 315'.

Though only the source contact 315 is illustrated as being recessed in FIG. 3, the present invention is not limited thereto. In some embodiments, the gate contact 310 and/or the drain contact 305 may also be recessed with respect to the top surface of the barrier layer 326.

FIGS. 4A to 4I illustrate a method of fabricating a HEMT device, such as the HEMT device 300 of FIGS. 2A, 2B, and 2C, according to embodiments of the present invention.

Figure 4A:
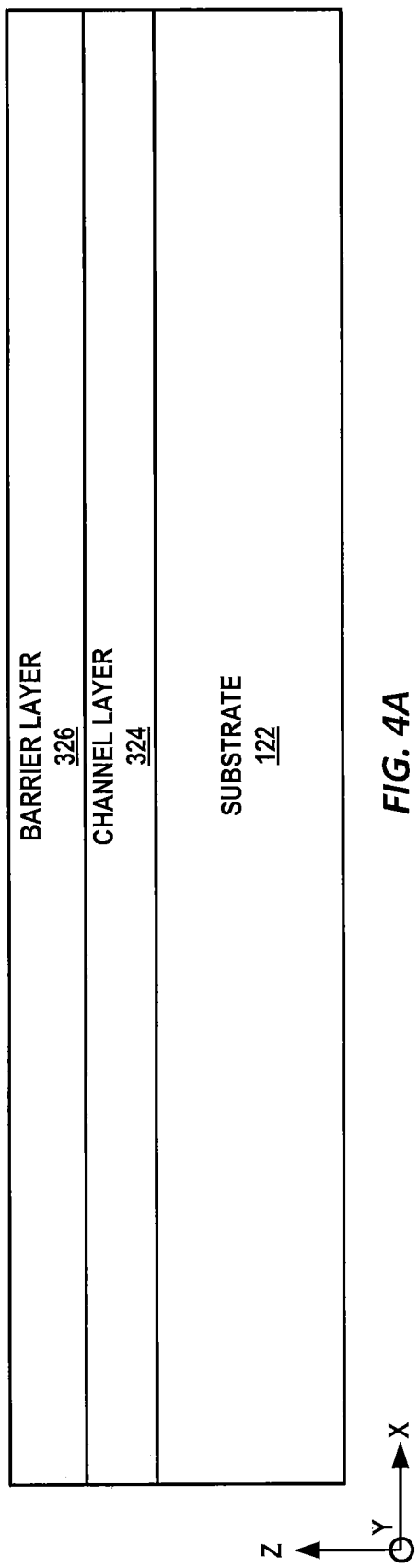

Referring now to FIG. 4A, a substrate 122 is provided on which a semiconductor structure may be formed. A channel layer 324 is formed on the substrate 122, and a barrier layer 326 is formed on the channel layer 324. The substrate 122 may be a semi-insulating silicon carbide (SiC) substrate that may be, for example, the 4H polytype of silicon carbide. Other silicon carbide candidate polytypes may include the 3C, 6H, and 15R polytypes. A thickness of the substrate 122 may be 100 μm or greater.

Silicon carbide has a much closer crystal lattice match to Group III nitrides (which may be employed in the channel layer 324 and/or the barrier layer 326) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance.

It is to be understood that, although silicon carbide may be employed as a substrate, embodiments of the present invention may utilize any suitable substrate for the substrate 122, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

Optional buffer, nucleation and/or transition layers (not shown) may also be provided on the substrate 122. For example, an AlN buffer layer may be provided to provide an appropriate crystal structure transition between a silicon carbide substrate and the remainder of the device. Additionally, strain balancing transition layer(s) may also be provided.

Still referring to FIG. 4A, a channel layer 324 is provided on the substrate 122. The channel layer 324 may be deposited on the substrate 122 using buffer layers, transition layers, and/or nucleation layers as described above. The channel layer 324 may be under compressive strain. Furthermore, the channel layer 324 and/or buffer, nucleation, and/or transition layers may be deposited by MOCVD, MBE, and/or HVPE. In some embodiments of the present invention, the channel layer 324 may be a Group III-nitride layer.

The barrier layer 326 may be a Group III-nitride layer. In certain embodiments of the present invention, the barrier layer 326 may be a highly-doped n-type layer. For example, the barrier layer 326 may be doped to a concentration of less than about $10^{19}$ cm$^{-3}$.

In some embodiments of the present invention, the barrier layer 326 may have a thickness, Al composition, and/or doping sufficient to induce a significant carrier concentration at the interface between the channel layer 324 and the barrier layer 326 through polarization effects when the barrier layer 326 is buried under ohmic contact metal. Also, the barrier layer 326 may be thick enough to reduce or minimize scattering of electrons in the channel due to ionized impurities deposited at the interface between the barrier layer 326 and a subsequently formed first protective layer.

In some embodiments, the channel layer 324 and the barrier layer 326 may have different lattice constants. For example, the barrier layer 326 may be a relatively thin layer having a smaller lattice constant than the channel layer 324, such that the barrier layer 326 "stretches" at the interface between the two. Accordingly, a pseudomorphic HEMT (pHEMT) device may be provided.

Figure 4B:
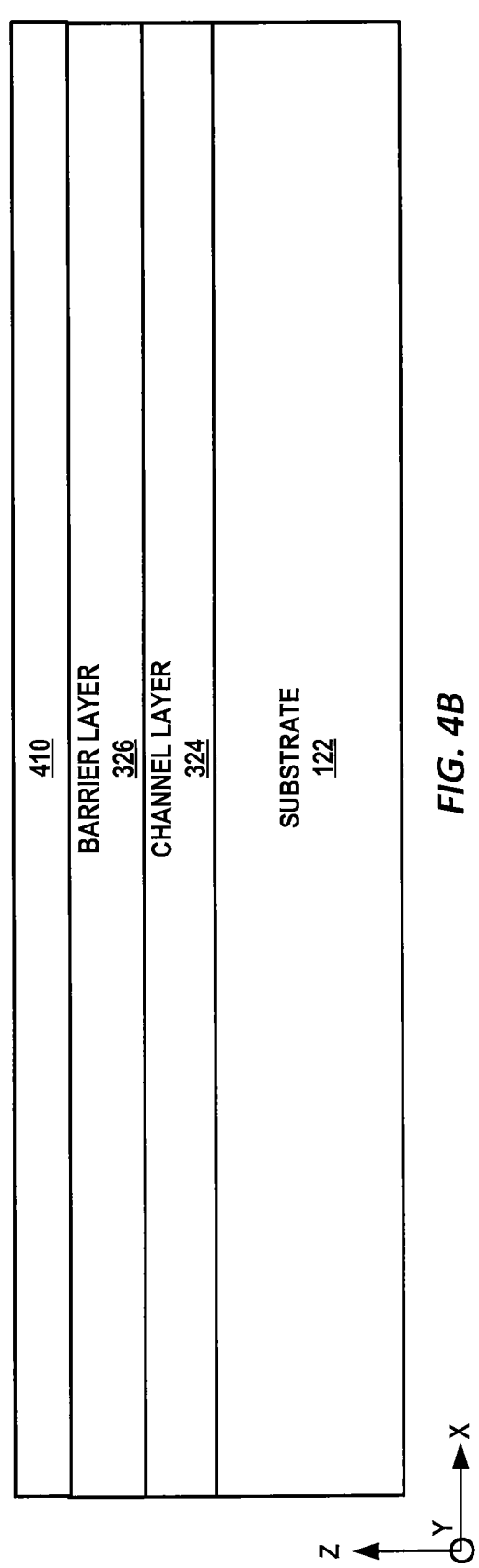

Referring to FIG. 4B, a first protective layer 410 is formed on the barrier layer 326. The first protective layer 410 may be dielectric material, such as silicon nitride ($Si_xN_y$), aluminum nitride (AlN), silicon dioxide ($SiO_2$), and/or other suitable protective material. Other materials may also be utilized for the first protective layer 410. For example, the first protective layer 410 may also include magnesium oxide, scandium oxide, aluminum oxide and/or aluminum oxynitride. Furthermore, the first protective layer 410 may be a single layer or may include multiple layers of uniform and/or non-uniform composition.

The first protective layer 410 may be blanket formed on the barrier layer 326. For example, the first protective layer 410 may be a silicon nitride (SiN) layer formed by high quality sputtering and/or plasma-enhanced chemical vapor deposition (PECVD), The first protective layer 410 may be sufficiently thick so as to protect the underlying barrier layer 326 during a subsequent anneal of ohmic contacts.

Figure 4C:
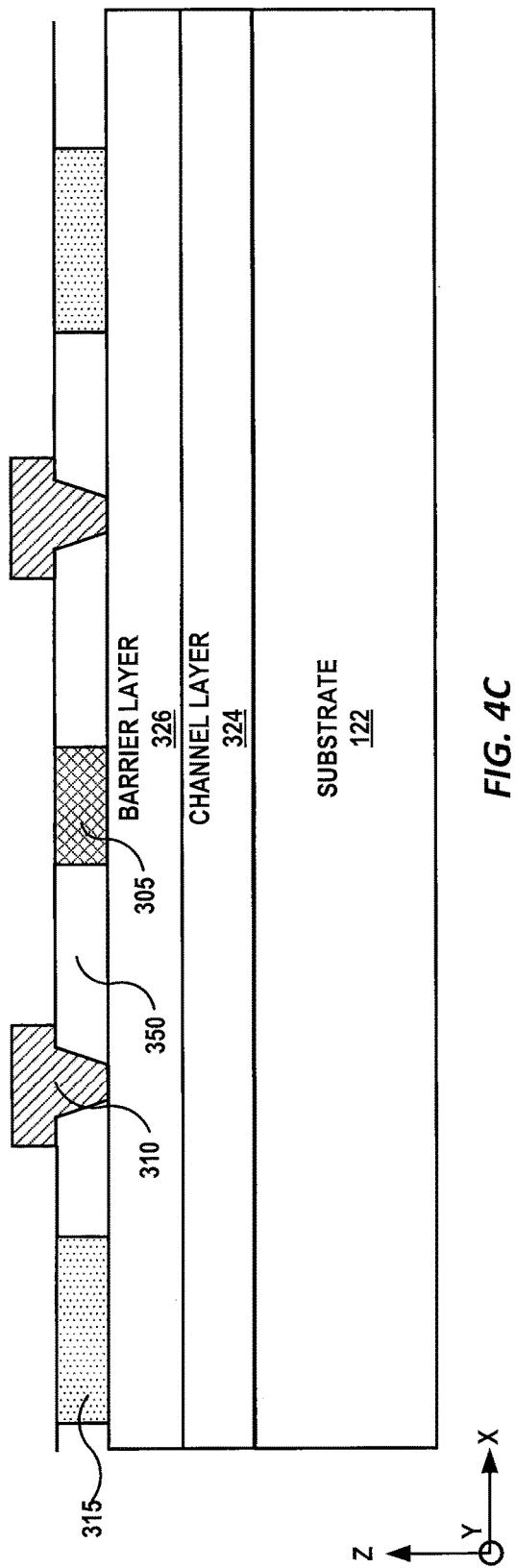

Referring to FIG. 4C, the first protective layer 410 (see FIG. 4B) may be patterned to form source contacts 315, gate contacts 310, and drain contacts 305. For example, the first protective layer 410 may be patterned to form windows which expose the barrier layer 326 for placement of the source contact 315 and the drain contacts 305. The windows may be etched utilizing a patterned mask and a low-damage etch with respect to the barrier layer 326. Ohmic metal may be formed on the exposed portions of the barrier layer 326. The ohmic metal may be annealed to provide the source contacts 315 and the drain contacts 305.

The first protective layer 410 may also be patterned to provide the gate contacts 310. The first protective layer 410 may be etched to form windows which expose the barrier layer 326 for placement of the gate contact 310. The gate contacts 310 may be formed within the etched windows, and may extend through the first protective layer 410 to contact the exposed portion of the barrier layer 326. Suitable gate materials may depend on the composition of the barrier layer 326. However, in certain embodiments, conventional materials capable of making a Schottky contact to a nitride based semiconductor material may be used, such as Ni, Pt, $NiSi_x$, Cu, Pd, Cr, TaN, W, and/or WSiN. Portion of the gate contacts 310 may extend on a surface of the first protective layer 410. The formation of the source contacts 315, gate contacts 310, and drain contacts 305 may result in the patterning of the first protective layer 410 of FIG. 4B to form the first insulating layer 350.

Though the source contact 315 is illustrated as being on the top surface of the barrier layer 326 in FIG. 4C, it will be understood that the source contacts 315, gate contacts 310, and/or drain contacts 305 may be formed within recesses in the top surface of the barrier layer 326. Such a configuration may result in an embodiment similar to that illustrated in FIG. 3.

Figure 4D:
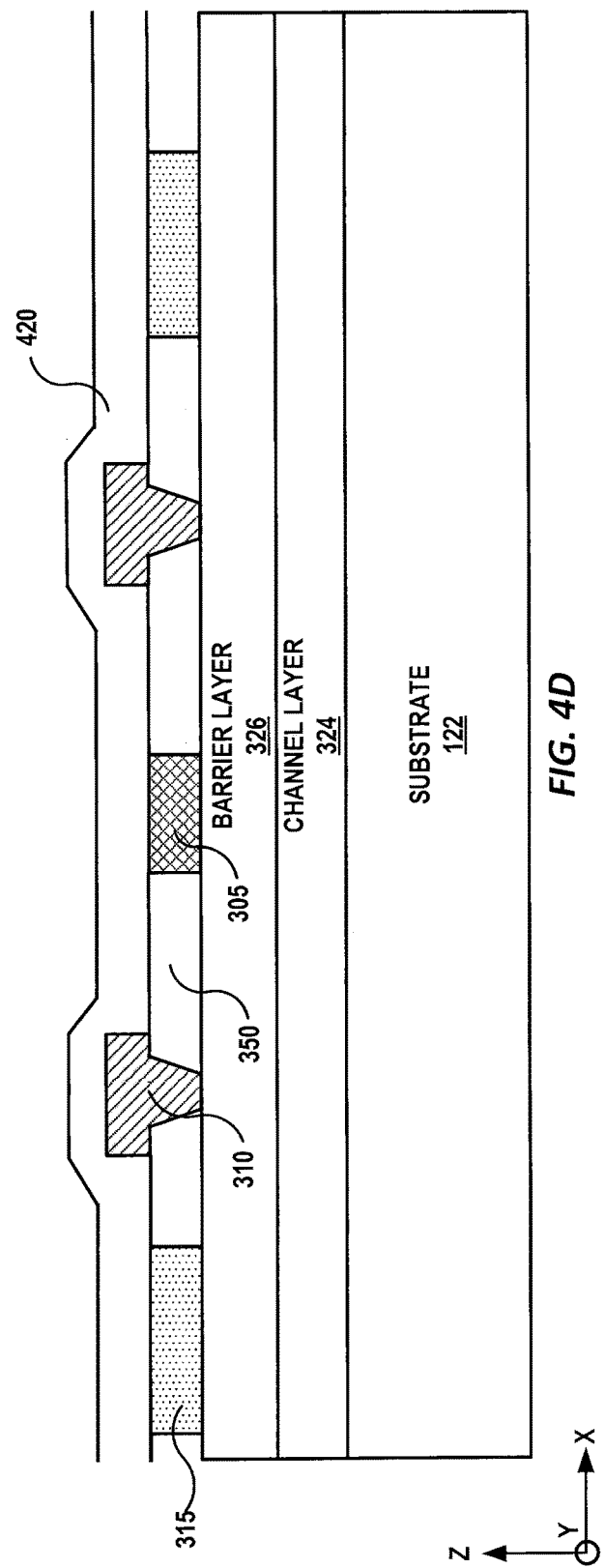

Referring to FIG. 4D, a second protective layer 420 may be formed on the first insulating layer 350, the source contacts 315, gate contacts 310, and drain contacts 305. The second protective layer 420 may be a dielectric layer. In some embodiments, the second protective layer 420 may have a different dielectric index than the first insulating layer 350.

Referring to FIG. 4E, field plates 360 may be formed on the second protective layer 420. The field plate 360 may overlap the gate contact 310 (e.g., in the Z direction of FIG. 4E) and may extend a distance on the region between the gate and the drain (i.e., the gate-drain region). An overlap of the field plate 360 over the gate contact 310 and the distance the field plate 360 extends on the gate-drain region can be varied for optimum results. In some embodiments, the field plate 360 can be electrically connected to gate contact 310, and it is understood that field plate structures other than those illustrated in the figures may be used without deviating from the invention.

Referring to FIG. 4F, the second protective layer 420 may be patterned to form the metal contacts 365. For example, the second protective layer 420 may be patterned to form windows which expose the source contacts 315 and/or the drain contacts 305 for placement of the metal contacts 365. The windows may be etched utilizing a patterned mask and a low-damage etch with respect to the source contacts 315 and/or the drain contacts 305. Conductive metal may be formed on the exposed portions of the source contacts 315 and/or the drain contacts 305 to form the metal contacts 365. The formation of the metal contacts 365 may result in the patterning of the second protective layer 420 of FIG. 4E to form the second insulating layer 355.

Referring to FIG. 4G, the substrate 122 (see FIG. 4F) may be thinned to form the thinned substrate 322. In some embodiments, the thickness of the substrate 322 is reduced using a grinder, such as an in-feed or creep feed grinder. In other embodiments, the thickness of the substrate 322 is reduced using lapping, chemical or reactive ion etching or combinations of these approaches with or without grinding. In still other embodiments, etching may be used to treat the backside of the substrate 322 to reduce damage to the substrate 322 that may result from the thinning operation. Methods of thinning a wafer are described, for example, in commonly assigned U.S. Pat. Nos. 7,291,529; 7,932,111; 7,259,402; and 8,513,686, the disclosures of which are incorporated herein by reference in their entirety.

In some embodiments according to the invention, the substrate 322 is thinned to a thickness of between about 40 µm to about 100 µm. In other embodiments, the substrate 322 is thinned to a thickness of between about 40 µm to about 75 µm.

Referring to FIG. 4H, via 325 may be formed in the substrate 322, the channel layer 324 and the barrier layer 326. The via 325 may be formed by wet or dry etching. In some embodiments, the via 325 may be anisotropically etched such that sidewalls of the via 325 are inclined with respect to a top surface of the substrate 322. The via 325 may expose a bottom surface of the ohmic portion 315A of the source contact 315. In some embodiments, the source contact 315 may serve as an etch stop material during the formation of the via 325.

Due to the anisotropic etching, a largest cross-sectional area A2 of the via 325 may be at that portion of the via 325 that is adjacent the lower surface 322A of the substrate 322 (e.g., the opening of the via 325). In some embodiments, the anisotropic etching may result in the largest cross-sectional area A2 of the via being related to a thickness of the substrate 322, as thicker substrates 322 may result in wider openings of the via 325. Thus, thinning the substrate 322, as described with respect to FIG. 4G, may result in additional benefits due to the reduction of the cross-sectional area A2 of the via 325.

Figure 4I:
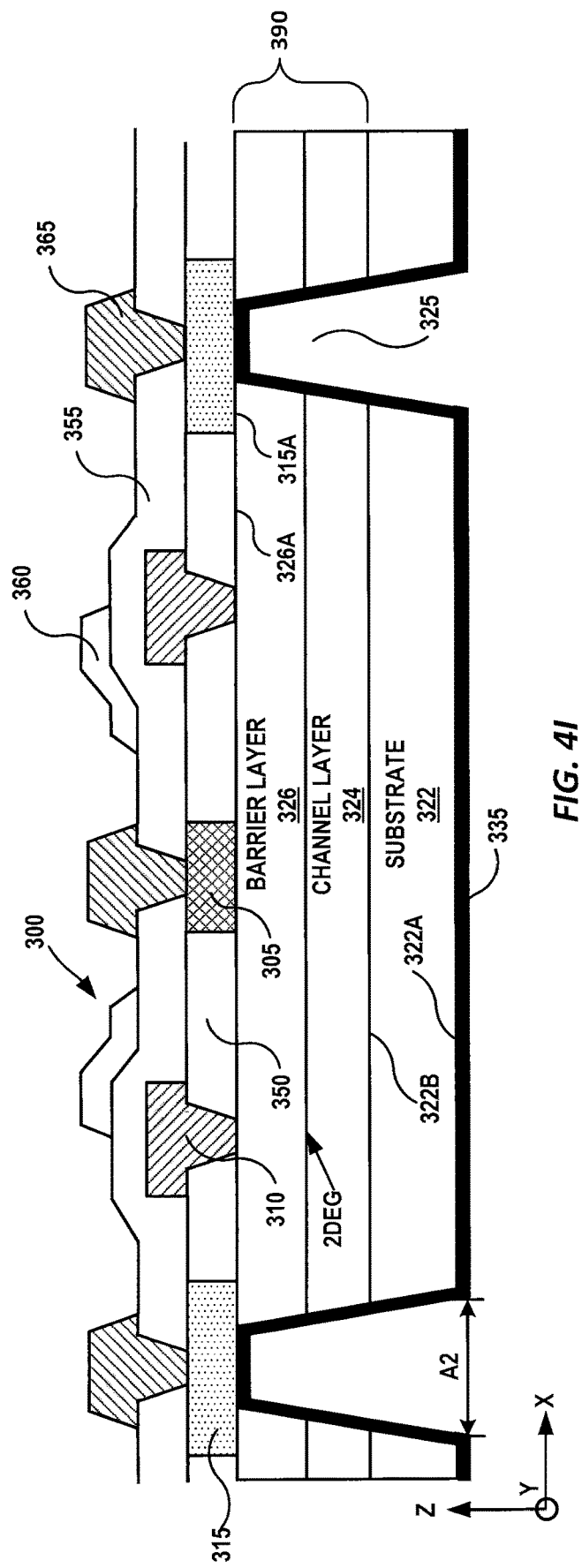

Referring to FIG. 4I, after formation of the via, backmetal layer 335 may be deposited on the lower surface 322A of the substrate 322, sidewalls of the via 325, and the bottom surface of the ohmic portion 315A of the source contact 315. Thus, the backmetal layer 335 may directly contact ohmic portions of the source contact 315. The backmetal layer 335 may include a conductive metal such as, for example, titanium, platinum, and/or gold.

Figure 5:
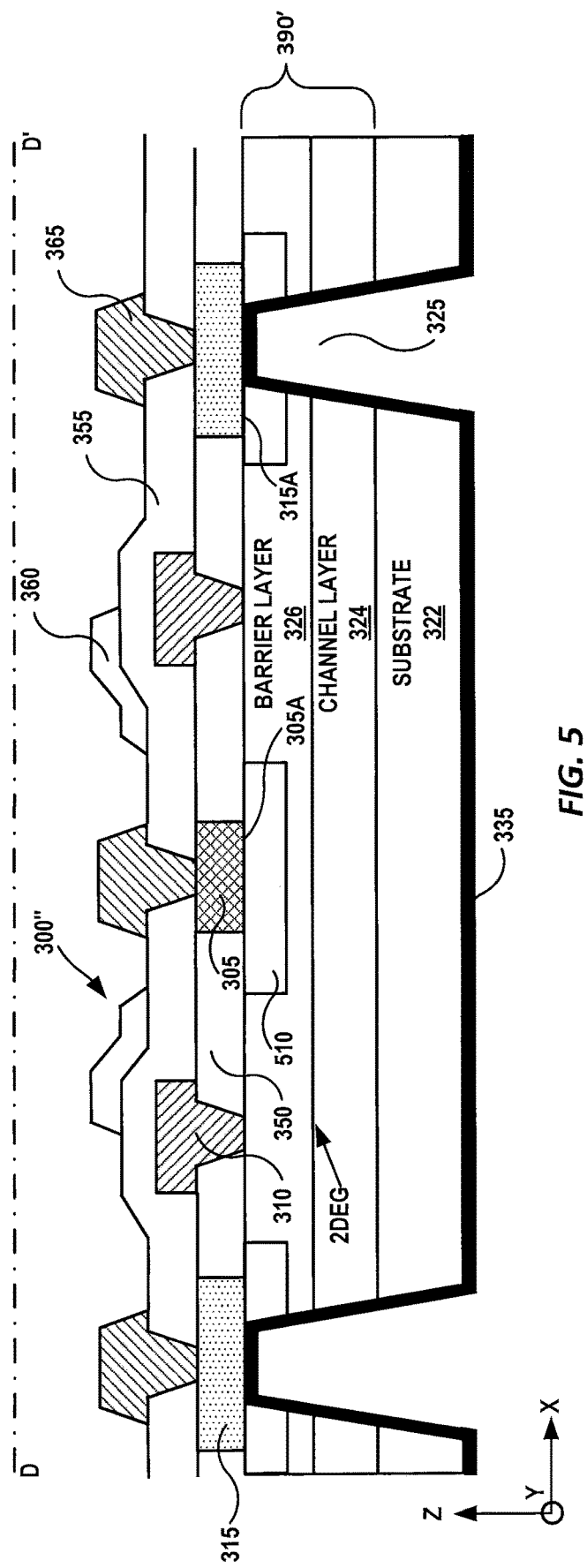
FIG. 5 is a schematic cross-sectional view of an additional embodiment of a HEMT device taken along line D-D' of FIG. 2A, according to embodiments of the present invention.

FIG. 5 is a schematic cross-sectional view of an additional embodiment of a HEMT device 300" taken along line D-D' of FIG. 2A, according to embodiments of the present invention. Portions of FIG. 5 are substantially the same or similar as those illustrated in FIGS. 2B and 2C, and a repeat description thereof will be omitted for brevity. The HEMT device 300" may share a substantially similar plan view as that of the HEMT device 300 of FIG. 2A and, as such, a duplicate illustration thereof is omitted.

Referring to FIG. 5, the HEMT device 300" may have well regions 510 in the barrier layer 326 beneath one or more of the source contacts 315 and/or drain contacts 305. A bottom surface 315A of the ohmic portion of the source contact 315 and/or bottom surface 305A of the ohmic portion of the drain contact 305 may be in contact with respective ones of the well regions 510. The well regions 510 may be formed by performing a doping implant on the barrier layer 326. In some embodiments, the well regions 510 may be doped to have a higher doping concentration than the barrier layer 326. For example, when the barrier layer 326 is an n-type layer, the well region 510 may be doped to have a higher concentration of n-type dopants (e.g., an $N^+$ or $N^{++}$) than the barrier layer 326. In some embodiments, the implanting of the dopants to form the well regions 510 may be performed after the formation of the barrier layer 326 but before the formation of the source contacts 315 and/or the drain contacts 305.

In some embodiments, the via 325 may be formed to pass through the well region 510 under the source contact 315. Thus, a portion of the backmetal layer 335 on sidewalls of the via 325 may directly contact portions of one of the well regions 510. Though the well region 510 is illustrated in FIG. 5 as being on both sides of the via 325, the present invention is not limited thereto. In some embodiments, the well region 510 may only be on one side of the via 325. In some embodiments, the via 325 may be separated from the bottom surface 315A of the ohmic portion of the source contact 315 with portions of the well region 510 disposed between the via 325 and the bottom surface 315A of the ohmic portion of the source contact 315.

In addition, though FIG. 5 illustrates the via 325 as directly contacting the well region 510, the present invention is not limited thereto. In some embodiments a separation may be provided between the well region 510 and the via 325 and/or the backmetal layer 335.

HEMT devices according to embodiments described herein may demonstrate marked improvement over conventional devices. For example, HEMT devices according to embodiments described herein may exhibit output power density greater than 3 W/mm and peak power added efficiency (PAE) above 35% at 30 GHz. Small signal measurements at 28 V of devices according to embodiments described herein may demonstrate a cut off frequency beyond 30 GHz and a 10 GHz small signal gain larger than 20 dB. In addition, HEMT devices according to embodiments described herein may exhibit high voltage robustness under high-temperature reverse bias (HTRB) at 84 V/150° C. with zero failures and negligible performance change after 1000 hours.

HEMT devices according to embodiments described herein may include a substrate and epitaxy that may be designed for 30 GHz RF performance while maintaining robustness and high reliability. For example, a semiconductor structure of an example HEMT device according to embodiments described herein may include an AlN nucleation layer, an Fe-doped insulating GaN layer, an AlN barrier layer, and a 15-nm cap layer of undoped $Al_{0.24}Ga_{0.76}N$.

Figure 6A:
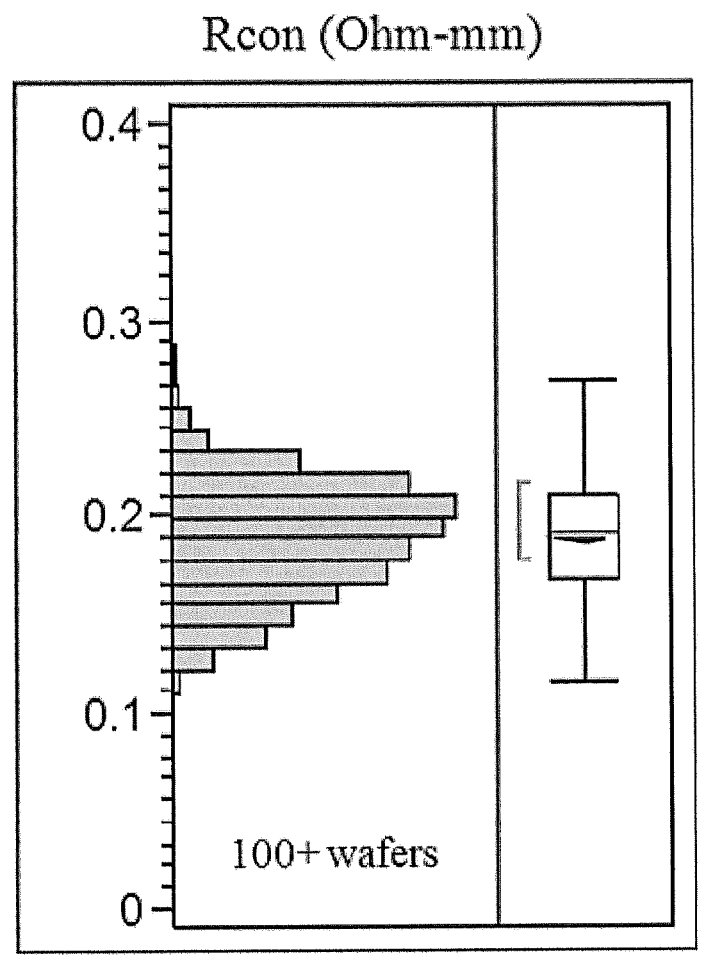
FIGS. 6A, 6B, and 6C illustrate characteristics of an example HEMT device according to embodiments described herein.
Figure 6B:
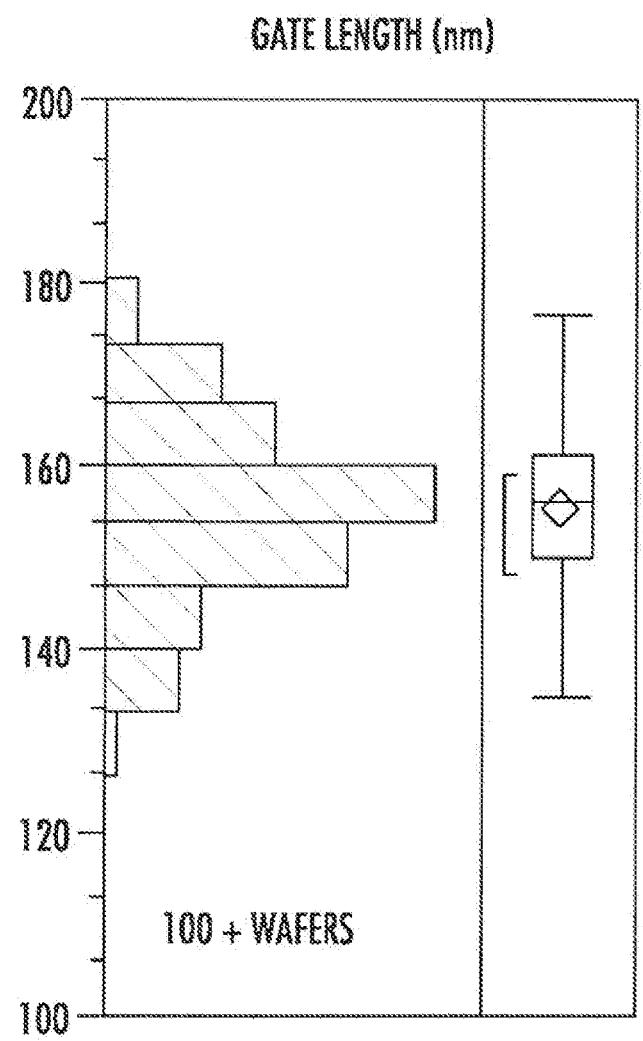
Figure 6C:
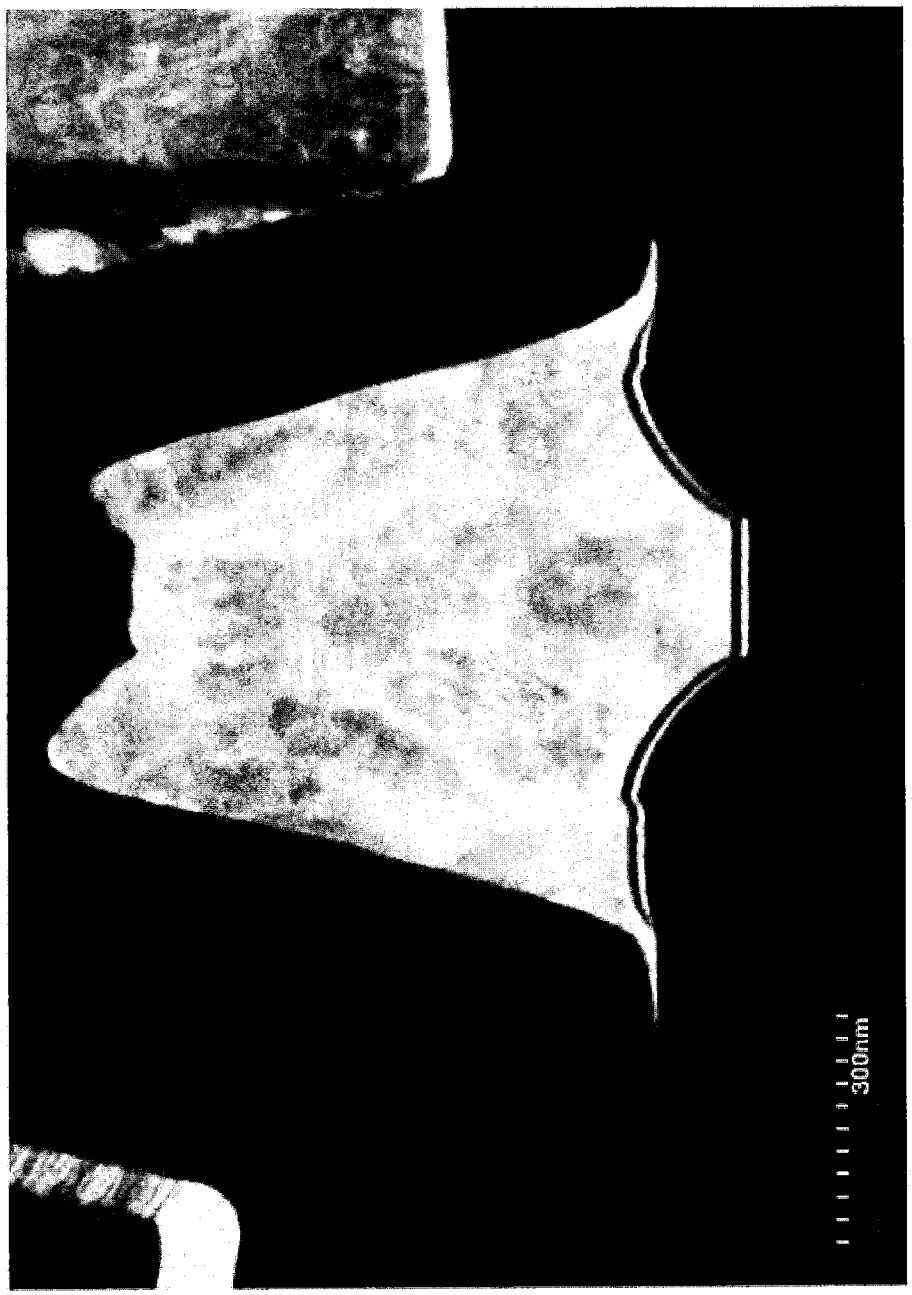

FIGS. 6A, 6B, and 6C illustrate characteristics of example HEMT devices according to embodiments described herein. As illustrated in FIG. 6A, the source/drain ohmic contacts of the example devices may be designed to provide very smooth morphology, enabling consistent fine-line lithography, and a well-controlled distribution centered at 0.2 Ω-mm for the contact resistance. This may be a 0.2 Ω-mm reduction compared to 0.25-μm processes, and may provide improvements in the peak current density, on-state resistance, and knee voltage of the example devices. FIG. 6B illustrates gate lengths of respective ones of the example devices. The 150-nm gate length dimensions shown in FIG. 6B (measured by Atomic Force Microscopy) were fabricated with an i-line lithography spacer method such as that described in "*An Optical 0.25 μm GaN HEMT Technology on 100 mm SiC for RF Discrete and Foundry MMIC Products*" by S. Wood et al. (2013 CS MANTECH Technical Digest, pp. 127-130, May 2013). A gate reduction technique produced gate lengths below the optical lithography limits while maintaining cross wafer repeatability. The control capability of the gate length with i-line lithography makes this process economically scalable beyond 100-mm-diameter GaN-on-SiC substrates. FIG. 6C illustrates a cross-section of the 150-nm gate of the example device.

TABLE I

Example Device Performance
GaN 150-nm Device Performance

| | | |
|---|---|---|
| Peak Drain Current | 1.2 A/mm | Vd = 10 V<br>Vg = 2 V |
| Max Transconductance | 470 mS/mm | Vd = 10 V |
| Pinch-off Voltage | −2 V | Vd = 10 V<br>Id = 1 mA/mm |
| Breakdown Voltage | >84 V | Vg = −8 V<br>Id = 1 mA/mm |
| $f_{T\_28\ V}$ | >30 GHz | Vd = 28 V<br>Idq = 100 mA/mm |
| $f_{T\_10\ V}$ | 40 GHz | Vd = 10 V<br>Idq = 100 mA/mm |
| Max. Available Gain (10 GHz) | >20 dB | Vd = 28 V<br>Idq = 100 mA/mm |

TABLE I-continued

Example Device Performance
GaN 150-nm Device Performance

| | | |
|---|---|---|
| Output Power (10 GHz) | 5 W/mm | Vd = 28 V<br>Idq = 100 mA/mm |
| Output Power (30 GHz) | 3.5 W/mm | Vd = 28 V<br>Idq = 100 mA/mm |
| PAE (30 GHz) | >30% | Vd = 28 V<br>Idq = 100 mA/mm |

Figure 7:
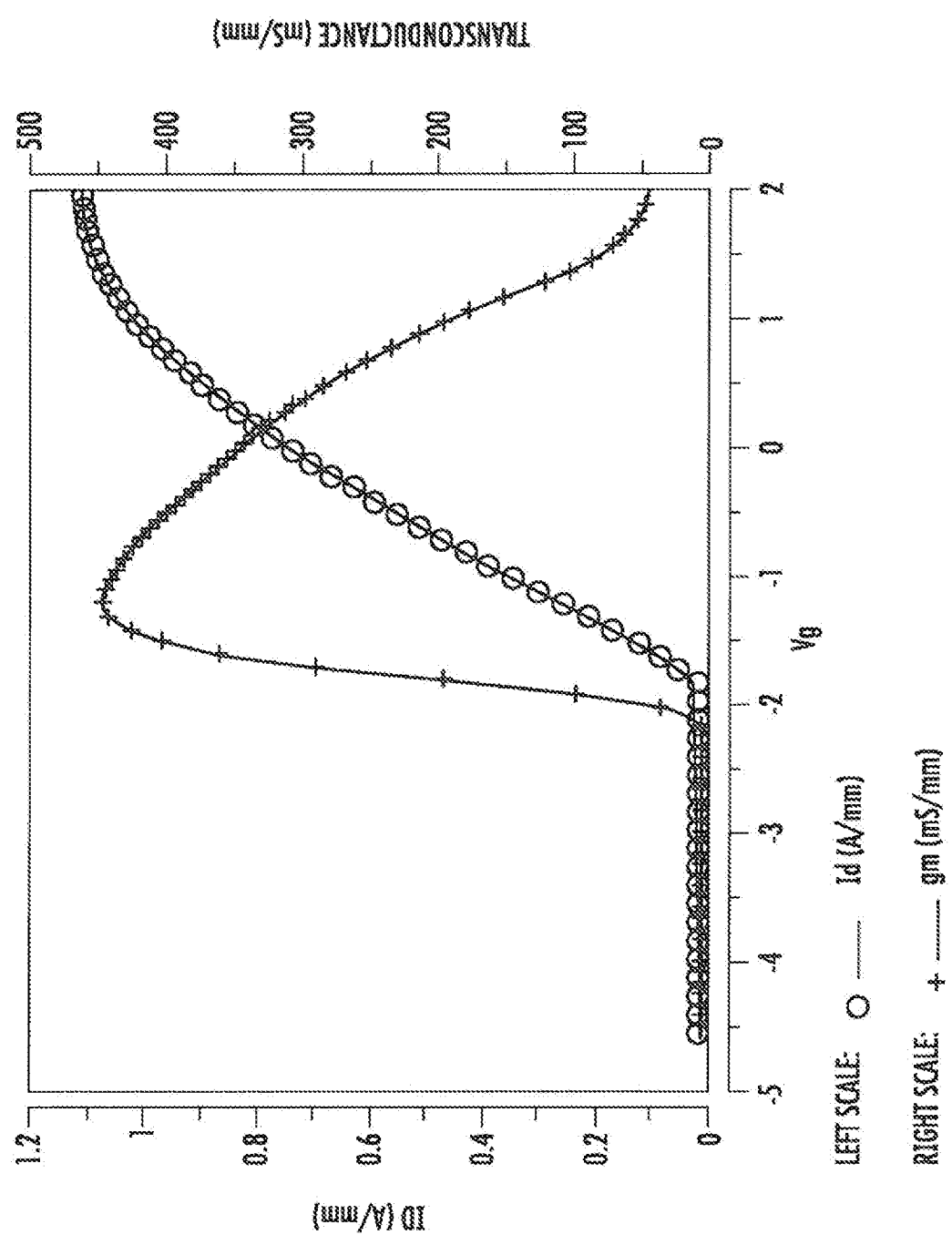
FIG. 7 is a graph of transfer curves of example HEMT devices according to embodiments described herein.

Table 1 contains measurements derived from devices constructed according to embodiments described herein. Standard electrical DC and RF characteristics shown in Table I were obtained on wafer. The small signal cut-off frequency and small signal gain were extracted from the s-parameters at 2 GHz. The transfer curves measured on devices with a 3.6 mm total gate periphery are shown in FIG. 7. The transfer curves exhibit a maximum current density above 1.2 A/mm and peak transconductance 470 mS/mm. The HEMT off-state properties are characterized by pinch-off voltage of −2 V, measured at 10 V and 1 mA/mm on the drain. The minimum breakdown voltage rating is 84 V at a gate voltage of −8V and a maximum drain current of 1 mA/mm.

Figure 8:
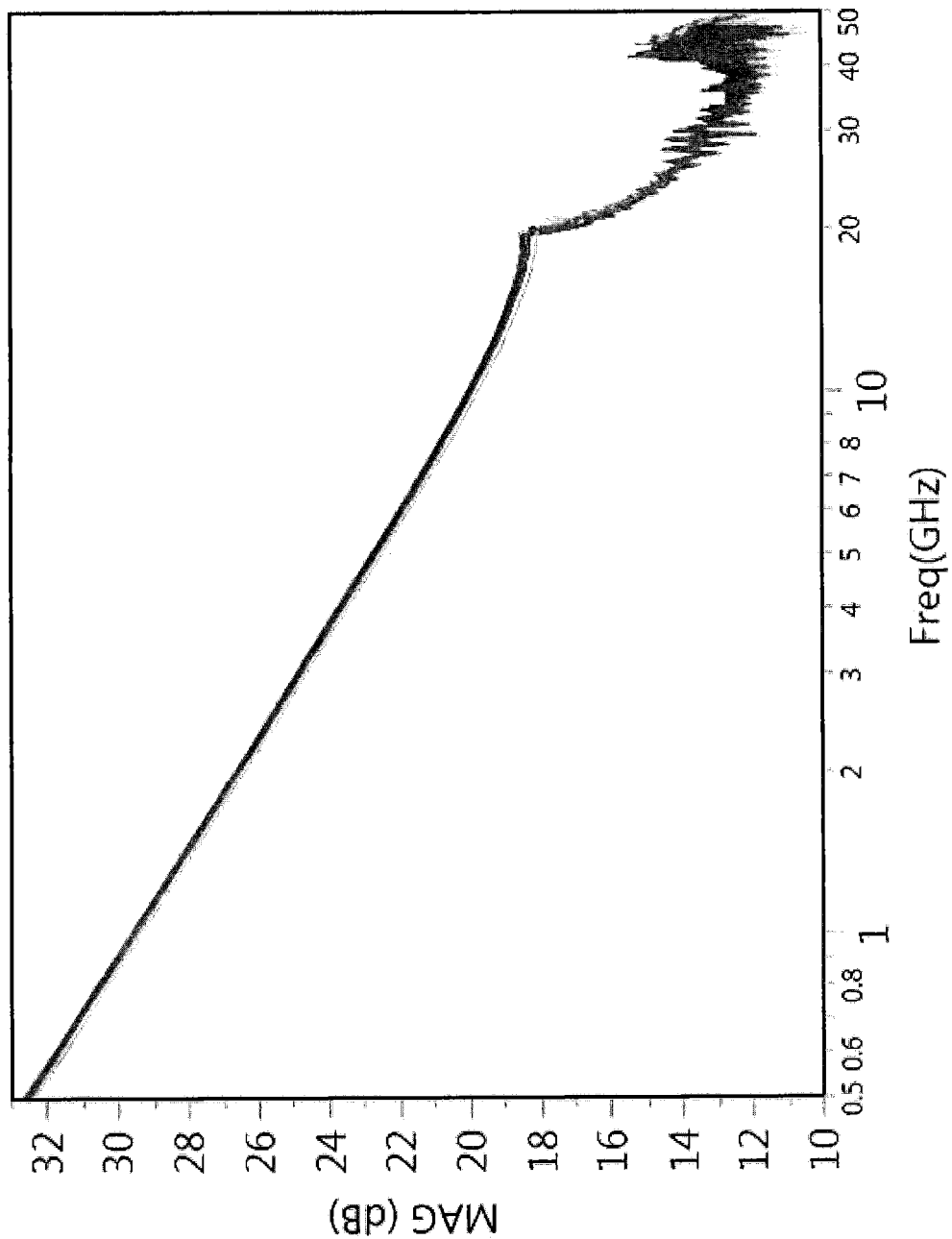
FIG. 8 is a graph of the variability of on-wafer small signal gain of example HEMT devices according to embodiments described herein.
Figure 9A:
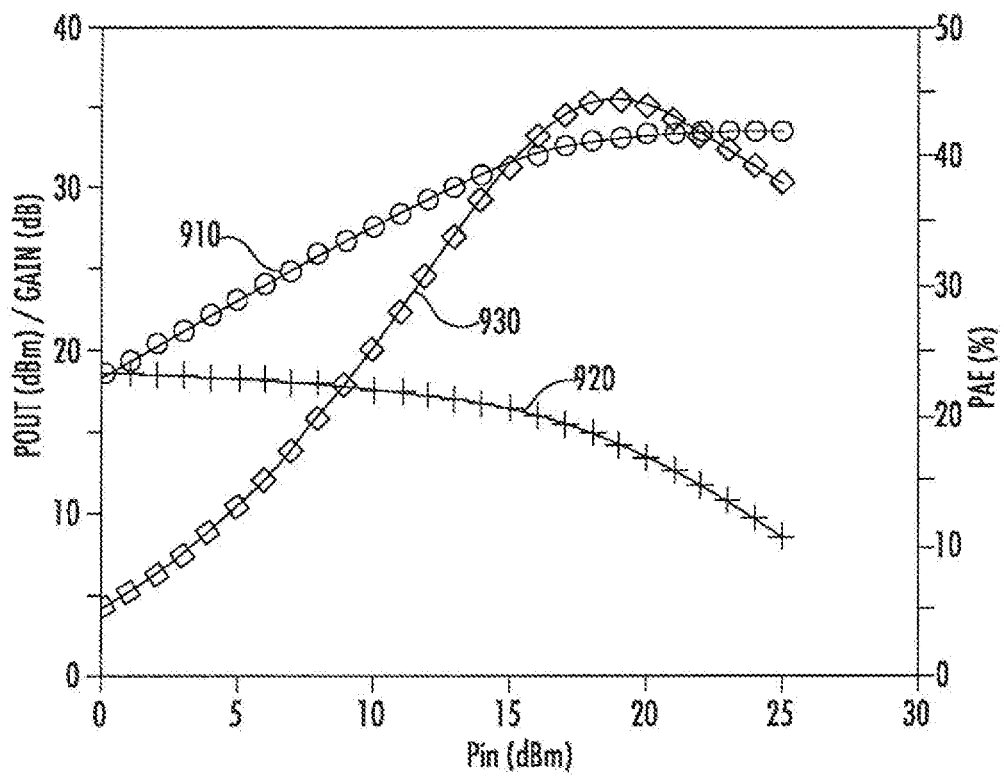
FIGS. 9A and 9B are graphs of 10 GHz and 30 GHz power sweeps of example HEMT devices according to embodiments described herein.
Figure 9B:
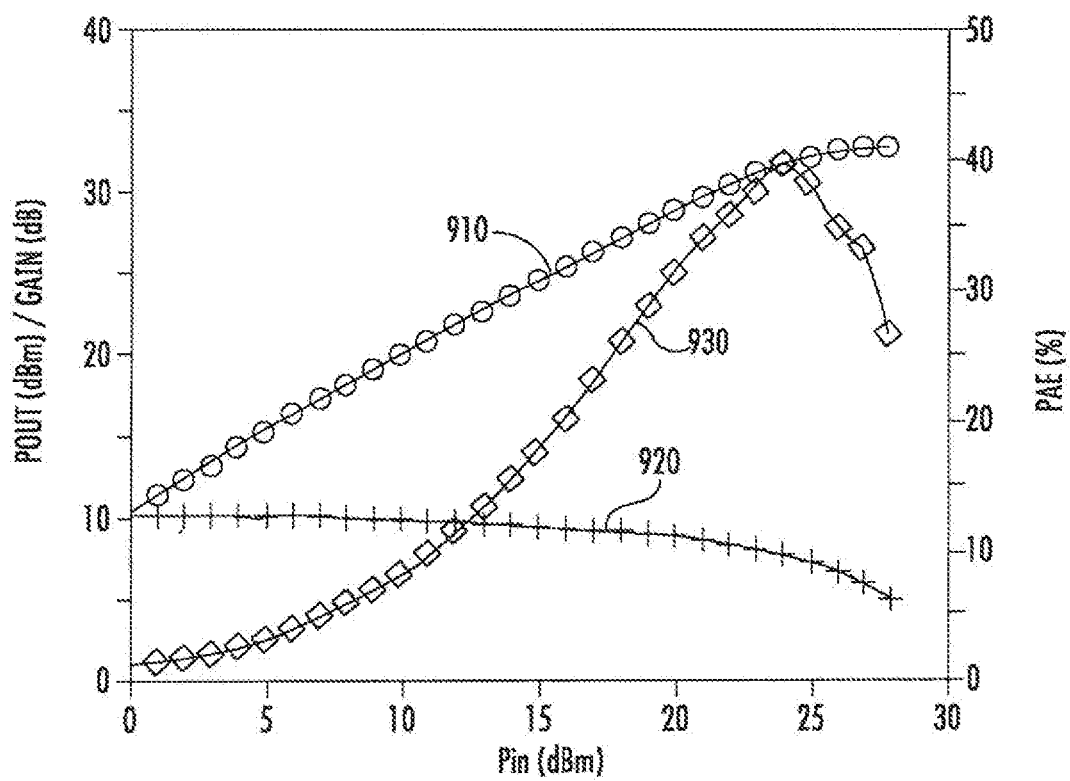

Multi-fingered devices (6×75 μm) according to embodiments described herein were used to characterize the performance of the 150-nm technology. The devices were biased at room temperature with a quiescent current and drain voltage of Id=100 mA/mm and Vd=28 V, respectively. FIG. 8 is a graph of variations in Maximum Available Gain (MAG) for sample devices according to embodiments described herein. FIG. 8 illustrates that on-wafer variation of the small signal MAG measured on 6×75 μm devices is minimal for 20 test sites. The variability of on-wafer small signal gain, as shown in FIG. 8, was a direct result of the ability to maintain a consistent gate length. FIGS. 9A and 9B are graphs of 10 GHz (FIG. 9A) and 30 GHz (FIG. 9B) power sweeps for a 6×75 μm FET biased at 28 V and 100 mA/mm. Continuous wave (CW) power sweeps were performed at 10 GHz and 30 GHz to determine the maximum output power (Pout) 910, gain 920, and peak power added efficiency (PAE) 930, shown in FIGS. 9A and 9B. This technology demonstrated power densities>5 W/mm at 10 GHZ and >3.5 W/mm at 30 GHz with PAE=45% and 39%, respectively. Furthermore, when biased at 10V, the devices demonstrate cut-off frequencies of 40 GHz.

Figure 10A:
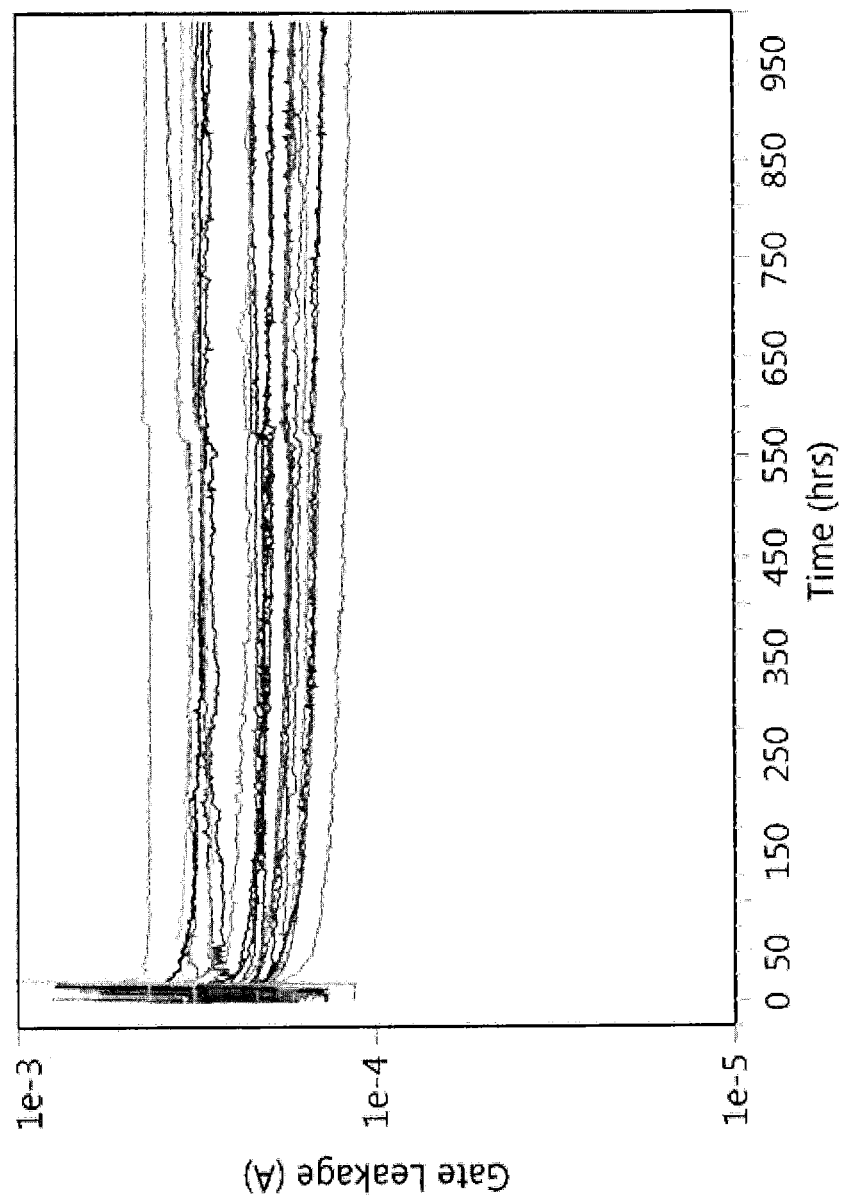
FIGS. 10A and 10B illustrate the results of high-temperature reverse bias (HTRB) testing of example HEMT devices according to embodiments described herein.
Figure 10B:
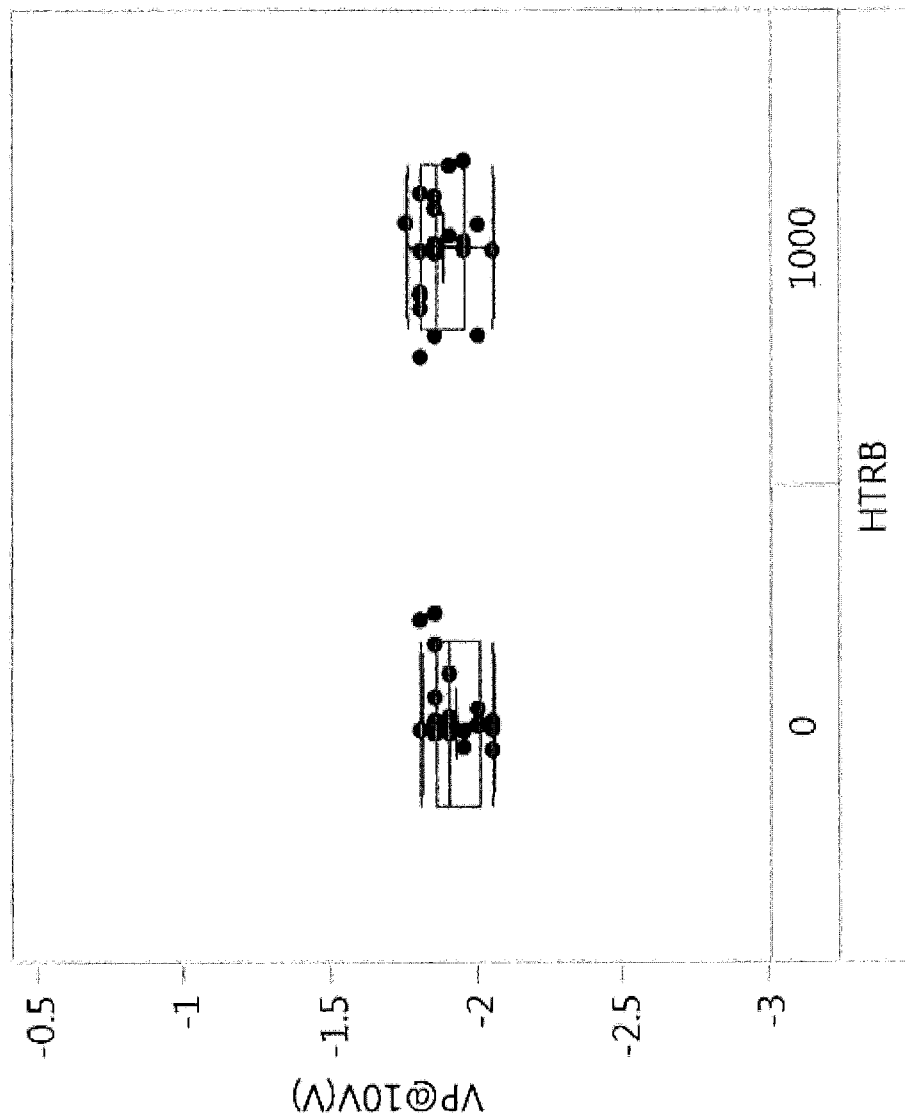

The reliability and lifetime of the technology associated with embodiments described herein was evaluated with 3.6-mm periphery devices to demonstrate the maturity of the technology. HTRB systems check the ability of the devices to withstand a reverse bias while being subjected to an increased ambient temperature that meets or exceeds the maximum temperature that the parts are rated to withstand. HTRB operations are described, for example, in U.S. patent application Ser. No. 11/080,905, filed Mar. 15, 2005 and entitled "GROUP III NITRIDE FIELD EFFECT TRANSISTORS (FETs) CAPABLE OF WITHSTANDING HIGH TEMPERATURE REVERSE BIAS TEST CONDITIONS," the disclosure of which is incorporated herein by reference as if set forth fully herein. Twenty devices were run for 1000 hours on an HTRB system with a plate temperature of 150° C. The standard off-state bias conditions were Vg=−8 V and Vd=84 V. FIGS. 10A and 10B illustrate the results of the test, including in-situ gate leakage of the 84V 1000 hour HTRB (FIG. 10A) and parametric change of pinch-off voltage (FIG. 10B). In-situ gate leakage was monitored throughout the test. The devices demonstrated negligible performance degradation and zero device fails, shown in FIGS. 10A and 10B. For example, as illustrated in FIG. 10A, in-situ gate leakage remained between $1\times10^{-4}$ and $1\times10^{-3}$ A at the completion of the HTRB test. These examples provide validation of a 150-nm Ka-band GaN HEMT that is capable of enduring 84V HTRB for the standard 1000 hour test.

Figure 11A:
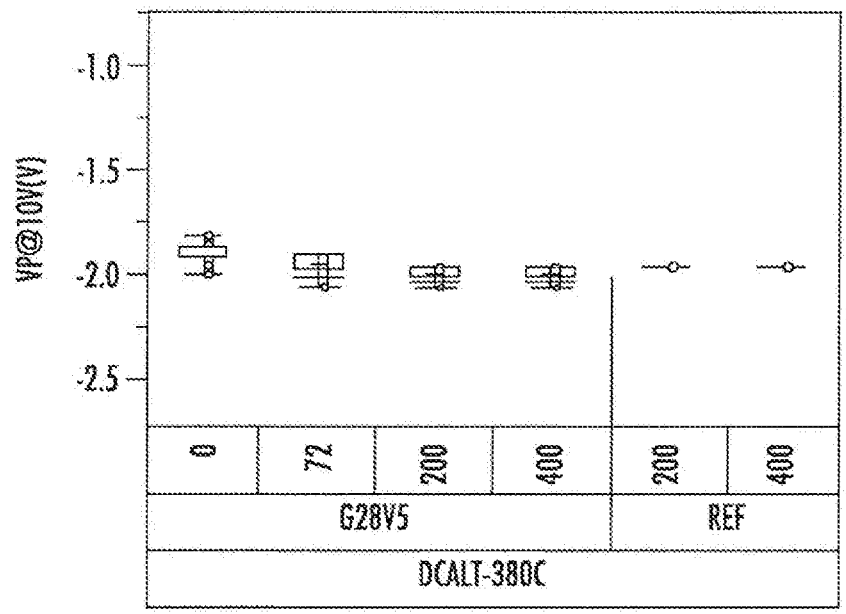
FIGS. 11A to 11C illustrate the results of accelerated life testing of example HEMT devices according to embodiments described herein.
Figure 11B:
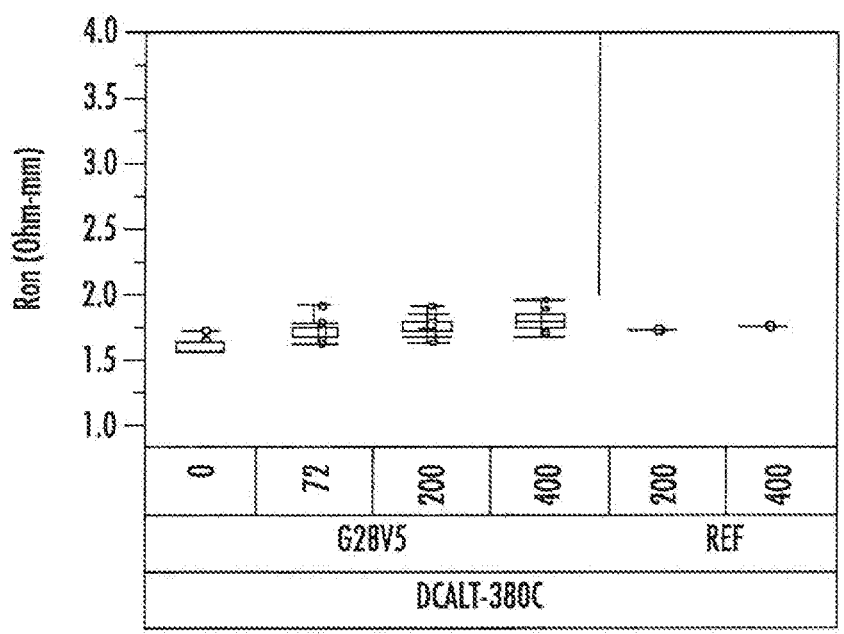
Figure 11C:
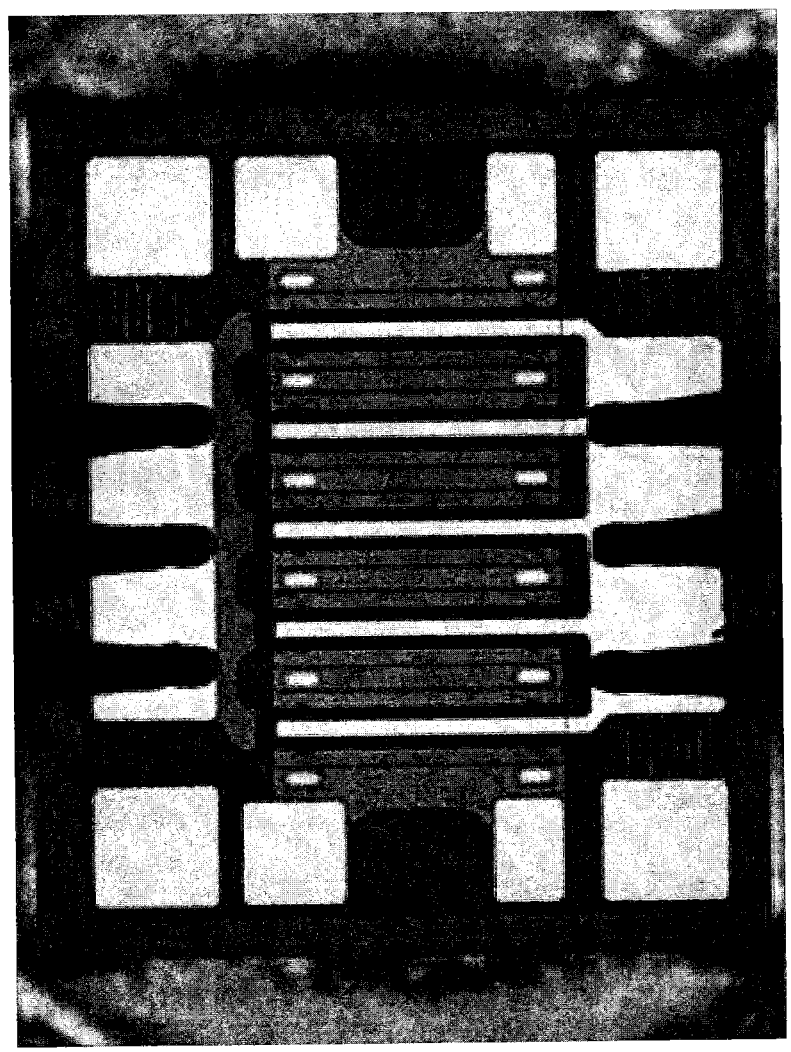
Figure 12:
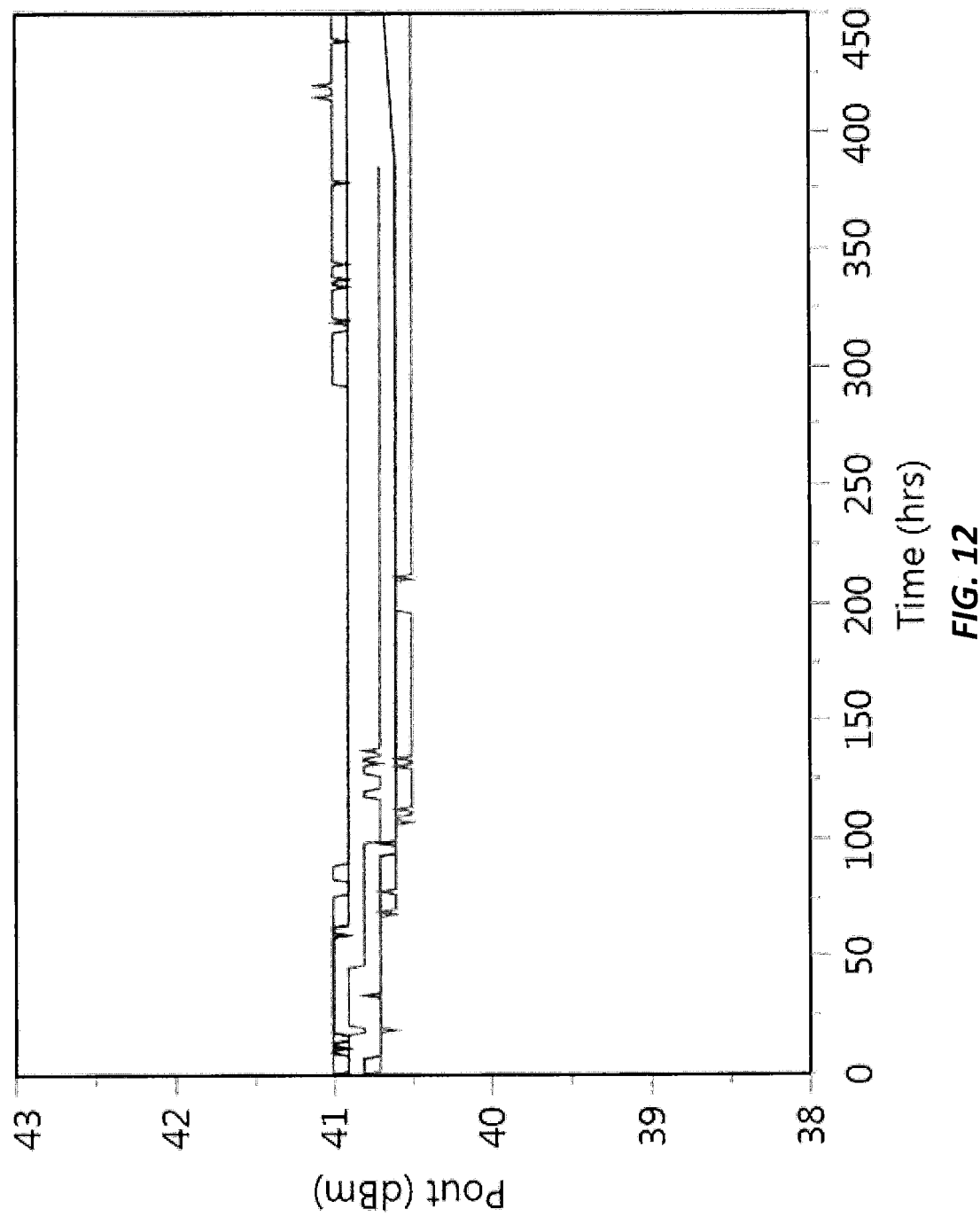
FIG. 12 illustrates output power during accelerated life testing of example HEMT devices according to embodiments described herein.

Preliminary reliability testing was conducted for 380° C. junction temperature on large periphery devices (3.6 mm), including DC accelerated life tests (DC-ALT). FIGS. 11A and 11B illustrate the parametric changes of the pinch-off voltage (FIG. 11A) and on-resistance (FIG. 11B) during 380° C. ALT. FIG. 11C illustrates a 3.6 mm device according to embodiments described herein after 400 hours ALT testing. The DC-ALT bias conditions were Vd=28 V and 6 W/mm dissipation. FIGS. 11A and 11B illustrate the 380° C. DC ALT reliability test and shift analysis of the contract resistance and pinch-off voltage. All devices demonstrated device stability throughout testing. The RF accelerated lifetime testing (3.5 GHz) was conducted at 325° C. on large periphery devices (3.6 mm). FIG. 12 illustrates in-situ monitoring of output power for 3.5 GHz RF ALT at 325° C. for example devices according to embodiments described herein. The monitored output power, shown in FIG. 12, demonstrated minimal degradation and zero failures after 400 hours.

The embodiments described herein include a 150-nm GaN HEMT technology for MMIC foundry design, and may provide competitive performance up through 30 GHz. In some embodiments, the HEMT device may be biased at 28 V, but the embodiments described herein are not limited thereto. In some embodiments, the HEMT device may be biased at greater than 15V, e.g., 20V. The optically-defined, i-line 150-nm gate may provide outstanding power and PAE for many Ka-band and Ku-band applications. The high voltage off-state HTRB reliability testing described herein confirms the robustness of the technology with negligible performance degradation. Multiple temperature accelerated life testing was used to evaluate the potential life time of the technology.

Figure 13:
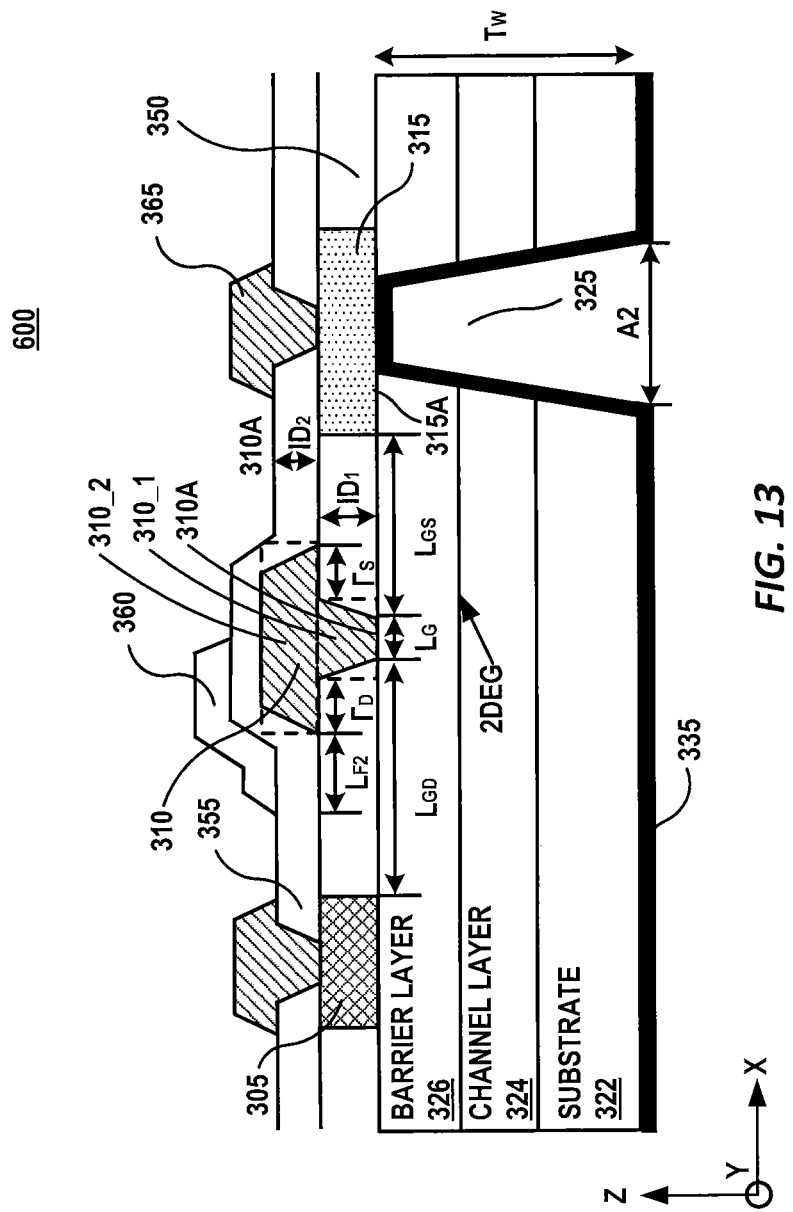
FIG. 13 illustrates an embodiment of a HEMT device capable of providing performance improvements over conventional devices.

FIG. 13 illustrates an example embodiment of an improved HEMT device 600 according to embodiments described herein. Referring to FIG. 13, example dimensions for the device 600 are illustrated that provide performance identical and/or substantially similar to that described herein. The device 600 may include elements discussed herein with respect to, for example, FIGS. 2B, 2C, and 3, among others. As such, a repetitive discussion thereof will be omitted. In FIG. 13, elements sharing the same reference number with those of previous figures are intended to refer to the same or similar elements.

Referring to FIG. 13, the channel layer 324 may be formed on the substrate 322, and the barrier layer 326 may be formed on the channel layer 324. A first insulating layer 350 may be formed on the barrier layer 326 and a second insulating layer 355 may be formed on the first insulating layer 350. A thickness ID1 of the first insulating layer 350 may be between 100 nm and 150 nm. In some embodiments, the thickness ID1 of the first insulating layer 350 may be approximately 130 nm. In some embodiments, the first insulating layer 350 may comprise SiN. A thickness ID2 of the second insulating layer 355 may be between 180 nm and 220 nm. In some embodiments, the thickness ID2 of the second insulating layer 355 may be approximately 200 nm. In some embodiments, the first insulating layer 350 and the second insulating layer 355 may have a combined thickness of approximately 330 nm. The thickness of the first insulating layer 350 may affect the gate-to-source capacitance and the gate-to-drain capacitance, which can impact the switching speed of the device 600. Similarly, the thickness of the second insulating layer 355 may affect gate-to-drain capacitance, which can impact the switching speed and gain of the device 600.

A source contact 315 and a drain contact 305 may be formed in the first insulating layer 350 on the barrier layer 326. The source contact 315 may include an ohmic portion having a bottom surface 315A on the barrier layer 326. In some embodiments, the bottom surface 315A of the ohmic portion of the source contact 315 may extend below a top surface of the barrier layer 326, as illustrated in FIG. 3. The via 325 may be formed in the substrate 322, the channel layer 324, and the barrier layer 326 to contact the bottom surface 315A of the ohmic portion of the source contact 315. The via 325 may include a backmetal layer 335. In some embodiments, a thickness of the wafer $T_W$ (e.g., the thickness of the substrate 322, the channel layer 324, and the barrier layer 326) may be between 40 μm to about 100 μm. In some embodiments, the wafer thickness $T_W$ may be between 40 μm to about 80 μm. In some embodiments, the wafer thickness $T_W$ may be approximately 75 μm. Reducing the wafer thickness $T_W$ may allow for the formation of a via 325 with a smaller cross-section A2, which may reduce the overall size of the device 600 and reduce inductance. In some embodiments, a largest cross-sectional area A2 of the via 325 is 1000 μm$^2$ or less.

A gate contact 310 may be formed in the first insulating layer 350, portions of which may be under the second insulating layer 355. In FIG. 13, the gate contact 310 is illustrated using a different shape than that of, for example, the gate contact 310 of FIGS. 2B, 2C, and 3, among others. It will be understood that the present invention is not limited to a particular shape of the gate contact 310, and that other shapes of the gate contact 310, as well as the other elements of the device 600, are possible without deviating from the embodiments described herein.

The gate contact 310 may include a first portion 310_1 within the first insulating layer 350 and a second portion 310_2, on the first portion 310_1, that is in the second insulating layer 355. A width of the second portion 310_2 of the gate contact 310 may exceed that of the first portion 310_1. In some embodiments, the second portion 310_2 of the gate contact 310 may extend beyond one or more sidewalls of the first portion 310_1 of the gate contact 310, such that the gate contact 310 forms a T-shaped gate and/or a gamma gate. On the drain side of the gate contact 310, the second portion 310_2 of the gate contact 310 may extend beyond a sidewall of the first portion 310_1 of the gate contact 310 towards the drain contact 305 by a first distance $\Gamma_D$. The distance $\Gamma_D$ may be between 0.05 μm and 0.15 μm. In some embodiments, $\Gamma_D$ may be approximately 0.1 μm. On the source side of the gate contact 310, the second portion 310_2 of the gate contact 310 may extend beyond a sidewall of the first portion 310_1 of the gate contact 310 towards the source contact 315 by a second distance $\Gamma_S$. The distance $\Gamma_S$ may be between 0.05 μm and 0.15 μm. In some embodiments, $\Gamma_S$ may be approximately 0.1 μm. The first distance $\Gamma_D$ may affect gate-to-drain capacitance of the device 600, which can impact the switching speed and gain of the device 600. The second distance $\Gamma_S$ may affect gate-to-source capacitance of the device 600, which can impact the switching speed of the device 600.

The first portion 310_1 of the gate contact 310 may include a lower surface 310A adjacent the barrier layer 326. A length of the lower surface 310A of the gate contact 310, designated as $L_G$ in FIG. 13, may be between 120 nm and 180 nm. In some embodiments, $L_G$ may be approximately 150 nm. The length $L_G$ may represent a length of an interface between the gate contact 310 and the barrier layer 326. The length $L_G$ may affect transconductance and gate parasitics which may impact switching and efficiency of the device 600. A side and/or edge of the lower surface 310A of the gate contact 310 that is closest to the drain contact 305 may be separated from the edge (e.g., the closest edge) of the drain contact 305 by a distance $L_{GD}$, as illustrated in FIG. 13. The distance $L_{GD}$ between the lower surface 310A of the gate contact 310 and the drain contact 305 may be between 1.75 µm and 2.25 µm. In some embodiments, $L_{GD}$ may be approximately 1.98 µm. A side and/or edge of the lower surface 310A of the gate contact 310 that is closest to the source contact 315 may be separated from the edge (e.g., the closest edge) of the source contact 315 by a distance $L_{GS}$, as illustrated in FIG. 13. The distance $L_{GS}$ between the lower surface 310A of the gate contact 310 and the source contact 315 may be between 0.5 µm and 0.7 µm. In some embodiments, $L_{GS}$ may be approximately 0.6 µm. The distances $L_{GD}$ and $L_{GS}$ may contribute to the on-resistance of the device 600, which may impact the device efficiency. In some embodiments, the gate contact 310 may be closer to the source contact 315 than the drain contact 305.

A field plate 360 may be formed on the second insulating layer 355 and the gate contact 310. Metal contacts 365 may be formed in the second insulating layer 355 to electrically connect to the source contact 315 and the drain contact 305, respectively. On the drain side of the gate contact 310, the field plate 360 may extend beyond a sidewall of the second portion 310_2 of the gate contact 310 towards the drain contact 305, as illustrated in FIG. 13, by a distance $L_{F2}$. In some embodiments, the distance $L_{F2}$ may refer to a distance by which the field plate 360 extends beyond an outermost portion of the second portion 310_2 of the gate contact 310 that is closest to the drain contact 305. The distance $L_{F2}$ may be between 0.4 µm and 0.5 µm. In some embodiments, $L_{F2}$ may be approximately 0.4 µm. The extension distance $L_{F2}$ of the field plate 360 beyond the gate contact 310 may affect the gate-to-source capacitance and the breakdown voltage of the device 600, which may impact the voltage rating and switching speed of the device 600.

One ore more of the dimensions discussed with respect to FIG. 13 may contribute to an improvement of the device 600. In some embodiments, the configuration of the device 600 may allow the device to achieve the performance and improvements over conventional devices discussed herein. For example, the embodiments described herein provide an optically-defined sub-200 nm (e.g., 120 nm to 200 nm) GaN HEMT technology that has improved RF and reliability performance. For example, embodiments provided herein may have an output power density at an operating frequency of 30 GHz that is greater than or equal to 3.5 W/mm. In some embodiments, the output power density at 30 GHz that is between 3.5 W/mm and 4.0 W/mm. Embodiments provided herein may have a peak Power Added Efficiency (PAE) that is greater than 30% at an operating frequency of 30 GHz. Embodiments provided herein may have a transistor cut-off frequency that is greater than 30 GHz and/or may be able to perform a 1000 hour HTRB—150° C. at 84V drain bias.

A 28V Ka-band MMIC was designed and fabricated utilizing HEMT devices according to embodiments described herein. The GaN MMICs utilize microstrip lines on 3-mil (e.g. 75 µm) silicon carbide (SiC) with passive components such as dielectrically-supported bridge metal, 180 pF/mm² MIM capacitors, 12 Ω/sq. thin film resistors, and compact through-wafer source slot vias. This MMIC design was used to demonstrate the capability of the technology described herein to meet the requirements for 5G telecom mm-wave and aerospace-defense applications. The demand for more bandwidth is creating more commercial applications for the Ka-band. Satellite communications, point-to-point communications, 5G, and military radar are all applications that use or plan to use the Ka-band. The high power density and high breakdown voltage of GaN-on-SiC make it of particular interest for power amplifiers. Most GaN power amplifiers start compressing well before saturated power is achieved. MMIC power amplifiers based on embodiments described herein may display high efficiency, low quiescent bias, and low gain compression representing an improvement in the state of the art.

Figure 14:
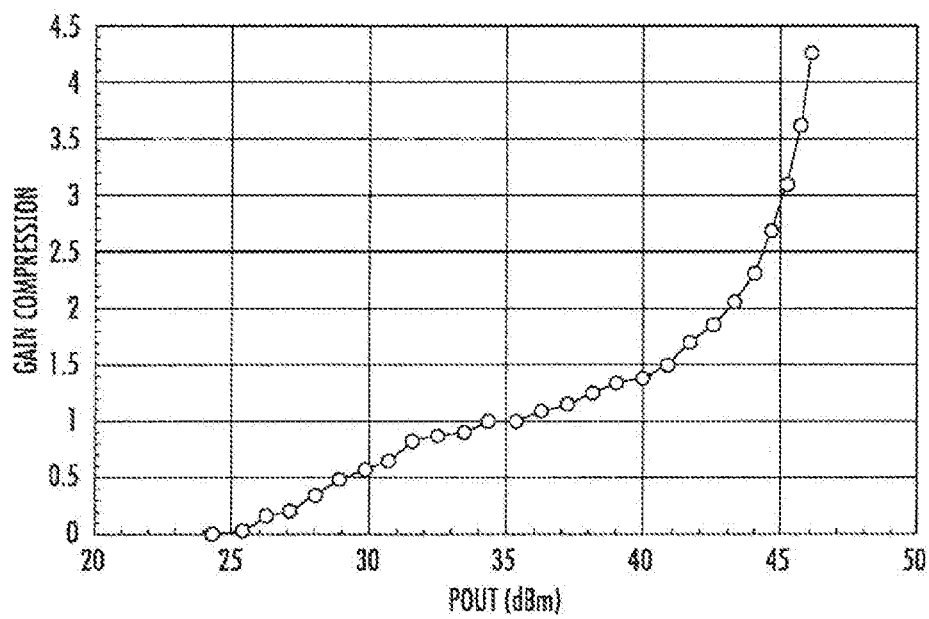
FIG. 14 is a graph of gain compression as a function of output power for a conventional GaN amplifier.

Conventional GaN amplifiers typically have soft gain compression that starts well before saturated power is achieved. A plot of the gain compression versus output power (Pout) of a typical GaN amplifier is illustrated in FIG. 14. As illustrated in FIG. 14, the 1 dB compression point, also known as P1dB, is about 10 dB below the saturated power of the amplifier. P1dB, the output power at 1 dB compression, refers to the output power level at which the gate of the device decreases 1 dB from its constant (e.g., linear) value.

Figure 15:
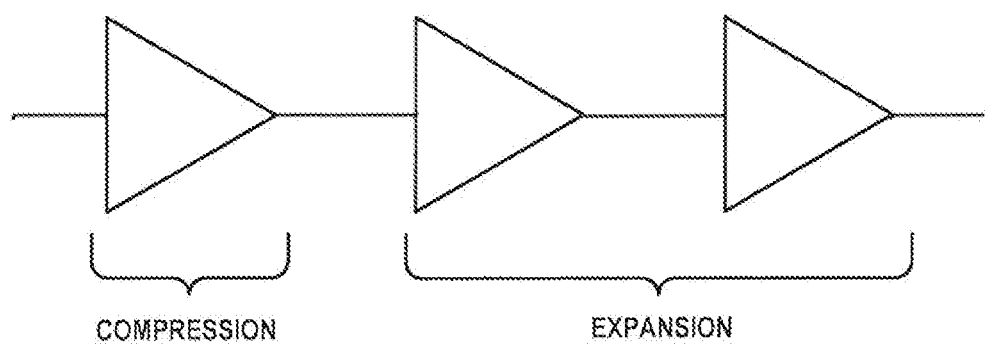
FIG. 15 is a schematic illustration of a multi-stage monolithic microwave integrated circuit (MMIC) device according to embodiments described herein.

MMIC devices according to embodiments described herein may combine a gain compression driver stage with one or more gain expansion output stages. A schematic illustration of the MMIC device stages is illustrated in FIG. 15. FIG. 15 illustrates a three-stage amplifier having one gain compression stage and two gain expansion stages, but the embodiments described herein are not limited thereto. In some embodiments, the MMIC device may have more or fewer than three stages. In some embodiments, the gain compression portion of the MMIC device may include more than one stage. In some embodiments, the gain expansion portion of the MMIC device may include more, or fewer, than two stages.

In some embodiments, the gain compression driver stage may be biased in class A mode and/or the gain expansion stages may be biased in class AB mode. The gain compression stage may tend to cancel the gain expansion of the output stage(s). Reducing the bias of a gain stage of the device close to pinch off may make the stage have gain expansion and high efficiency. Increasing the bias of a gain stage may make the stage have gain compression and have lower efficiency due to the increased current. Thus, the output stages may be selected to be the low bias, gain expansion stages, to contribute to providing an improved combination of efficiency and low compression. These techniques in conjunction with the process enhancements for the configuration of the underlying devices, such as those described herein, create an amplifier with significantly reduced gain compression, high efficiency, and low quiescent current. Examples of improved performance and the associated HEMT devices that can achieve this performance are described herein.

In some embodiments, the MMIC device according to embodiments described herein may provide improved RF performance. For example, in some embodiments, the MMIC device may provide output power at 30 GHz that is greater than 3.5 W/mm, a peak Power Added Efficiency (PAE) that is greater than 30% at 30 GHz, a transistor cut-off frequency that is greater than 30 GHz, low gain compression, and/or Power Added Efficiency at P1dB that is greater than 30%. In some embodiments, the MMIC device according to embodiments described herein may provide improved reliability performance. For example, in some embodiments, the MMIC device may be capable of performing a 1000 hour HTRB—150° C. at 84V drain bias.

MMIC devices according to embodiments described herein may be based on GaN-on-SiC devices. The GaN-on-SiC substrate and epitaxy may be targeted for 30 GHz RF performance and 28V operation. A 150 nm gate may be optically defined using an i-line lithography spacer method. The 150 nm gate may refer to a gate length (e.g., $L_G$ as illustrated in FIG. 13) on the device, though the embodiments described herein are not limited to this gate length. In some embodiments, the gate length may be less than 200 nm (e.g., 120 nm to 180 nm). High Temperature Reverse Bias (HTRB) stress tests were performed to confirm the robustness and reliability of the process technology described herein. The HEMT devices were subjected to 84 V HTRB for 1000 hours with negligible performance degradation and zero device failures. The wafer thickness (e.g., $T_W$ as illustrated in FIG. 13) is 75 μm. Through substrate vias, such as via 325 described herein, are available and can be placed within 50 μm of each other. The MMIC process also includes 180 pF/mm² MIM capacitors, 12 Ω/sq thin film resistors, and vias in the HEMT source pads. The $I_{DSS0}$ for the process is approximately 700 mA/mm.

The MMIC may be configured to operate in frequencies of the Ka band, which include frequencies in the electromagnetic spectrum from 26.5-40 gigahertz (GHz). For example, the target frequency range for the MMIC PA may be 26.5-30.5 GHz, which may cover several potential 5G millimeter wave bands, though the present embodiments are not limited thereto. In some embodiments, MMIC devices according to embodiments described herein may operate in the Ku band (12-18 GHz). Other design goals for the MMIC may include a saturated power greater than 4 W, at least 25 dB of small-signal gain, and PAE greater than 30% over the band. In addition, low gain compression was desired for better P1dB than a typical 3-stage GaN amplifier.

As illustrated in FIG. 15, the MMIC PA may have three stages. In some embodiments, the first stage may be a 6×50 μm device, the second stage may have two 6×50 μm devices, and the third stage may have four 6×50 μm devices. This constitutes a 1:2 drive ratio for each stage.

Typical GaN amplifiers have considerable gain compression and can start compressing well before saturated power (Psat) is achieved. The Psat value may provide a measurement of a point of operation of the amplifier at which diminishing returns begin with respect to the gain provided. For example, beyond Psat, the gain provided for a given input may begin to decrease (i.e., exhibits gain compression). As used herein, Psat refers to the operating point on the amplifier at which the gain compression exceeds 3 dB. A design goal for some MMIC devices according to embodiments described herein was to improve the 1 dB compression power (P1dB) compared to typical 3-stage, high-efficiency, GaN amplifiers. To accomplish this, the first stage may be biased separately from the last two stages and may be biased in class A mode, which may help to increase gain. The last two stages may be biased in class AB mode for efficiency. In some embodiments, the first stage is biased at 36 mA, which corresponds to 120 mA/mm. In some embodiments, the last two stages are biased at 20 mA/mm, for a combined 36 mA. In some embodiments, the overall quiescent current of the amplifier is 72 mA. The class A operation of the initial stage(s) (e.g., the first stage of FIG. 15) may tend to provide gain compression, while the class AB operation of the latter stage(s) (e.g., the last two stages of FIG. 15) may tend to provide gain expansion. These two different effects may be used to reduce the soft gain compression that is typically found in a GaN amplifier. The drain voltage for the design and operation may be 28 V, though the embodiments described herein are not limited thereto.

Figure 16:
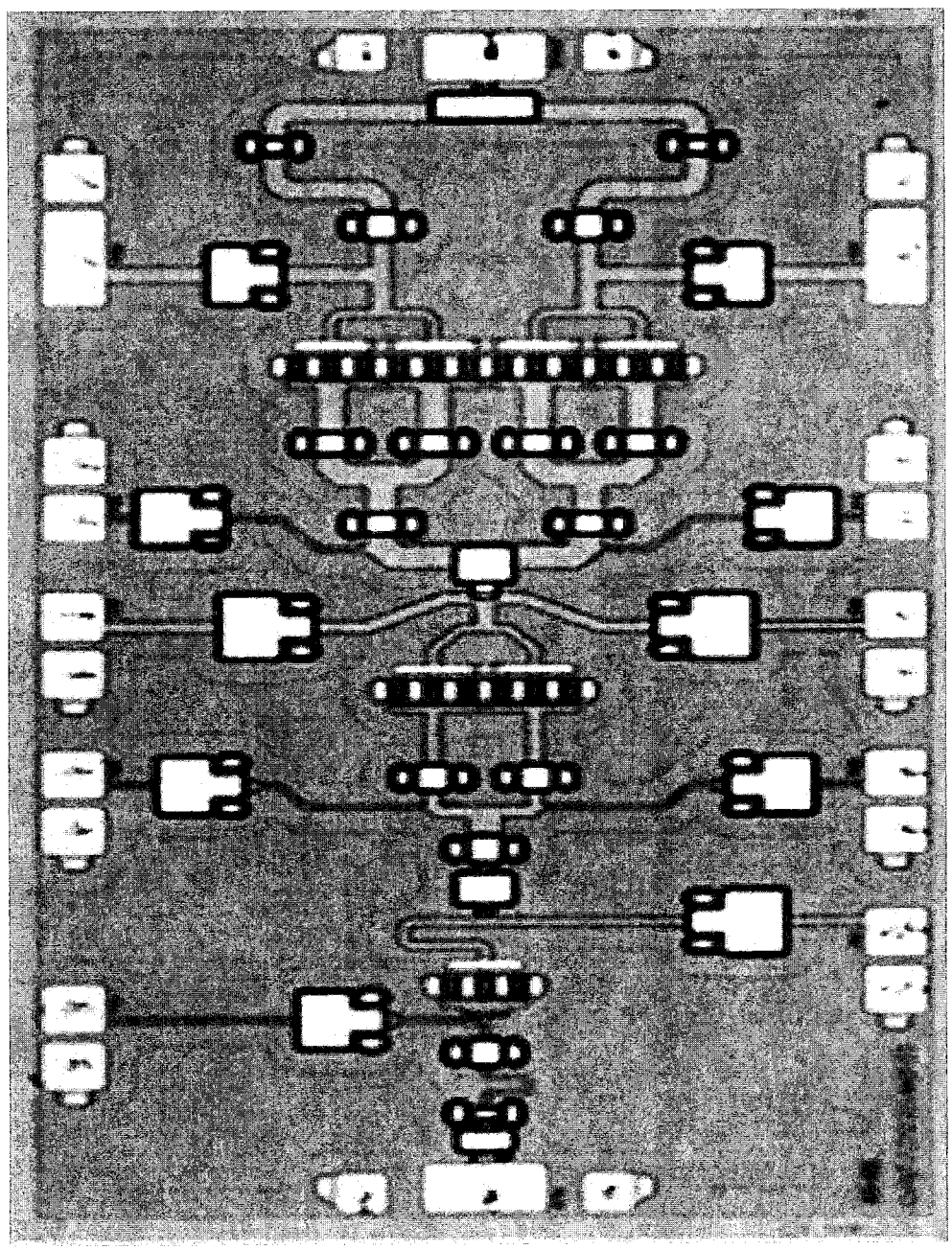
FIG. 16 is a photo of an example MMIC according to embodiments described herein.

The output load impedance may be determined by load pull data and circuit simulation. The matching networks may have high pass and low pass elements to provide a broad band of operation. EM simulation and tuning may be used to improve the matching circuits for the best overall circuit performance. FIG. 16 illustrates a photo of a completed MMIC according to some embodiments described herein, though the photo is of an example device only, and is not intended to limit the embodiments.

Figure 17A:
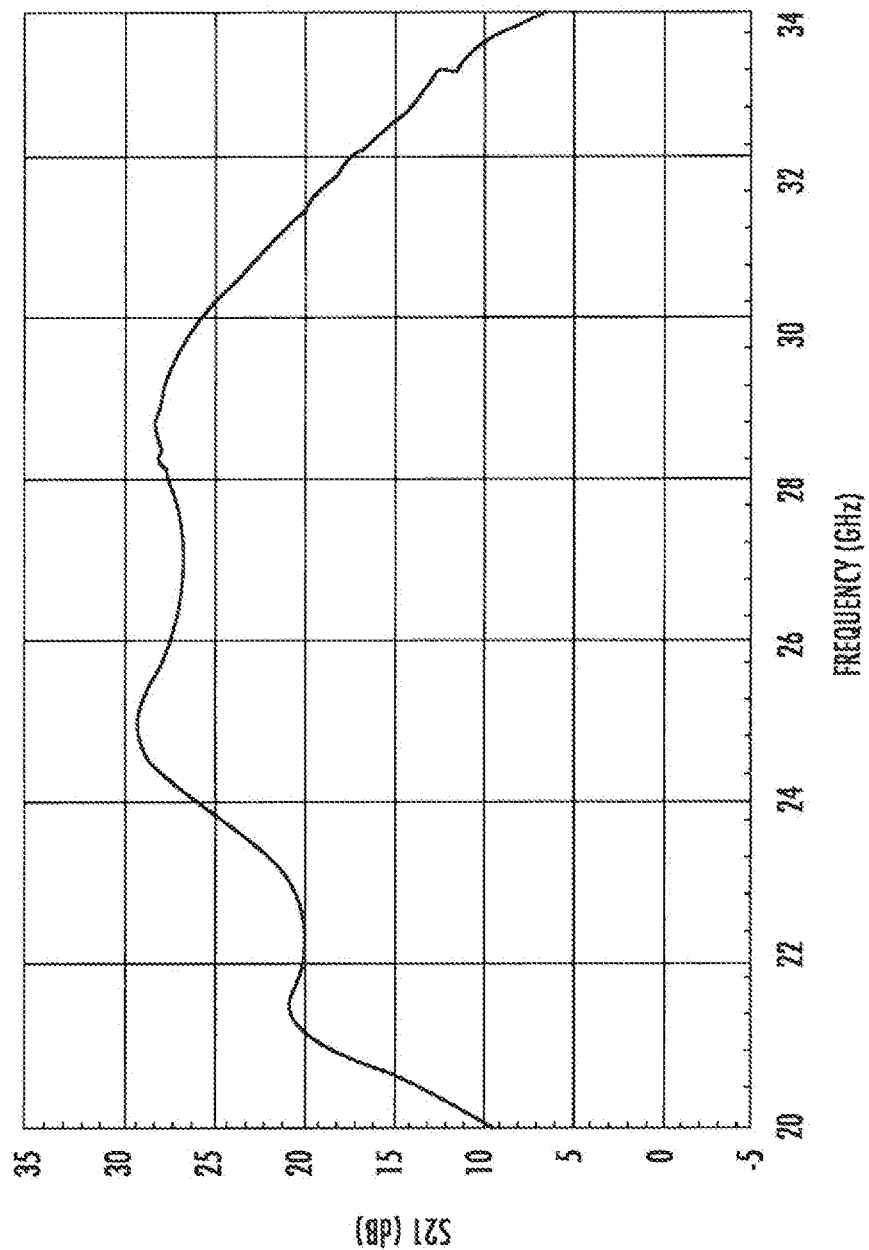
FIGS. 17A, 17B, and 17C are graphs of S-parameters of a device according to embodiments described herein.
Figure 17B:
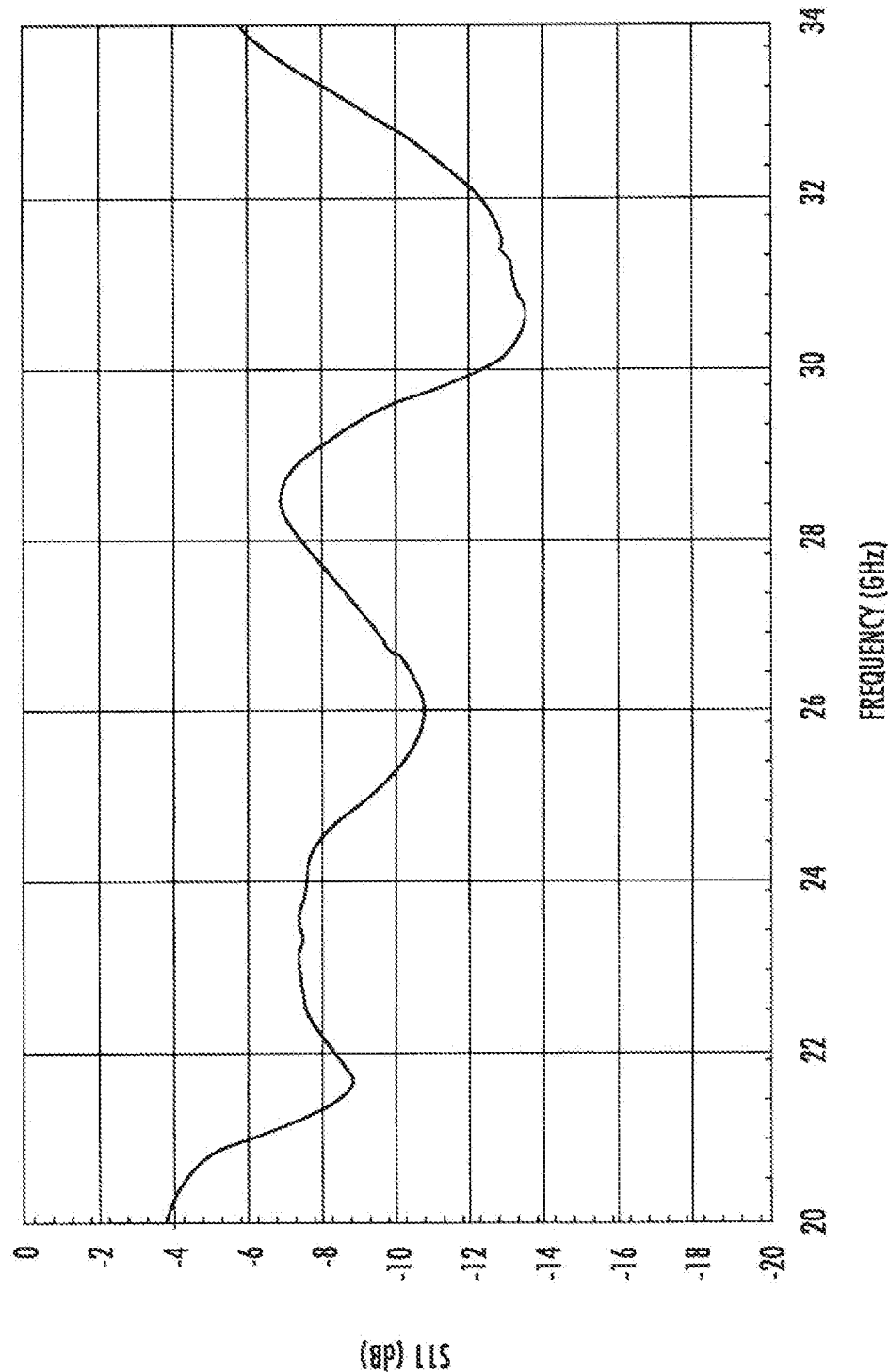
Figure 17C:
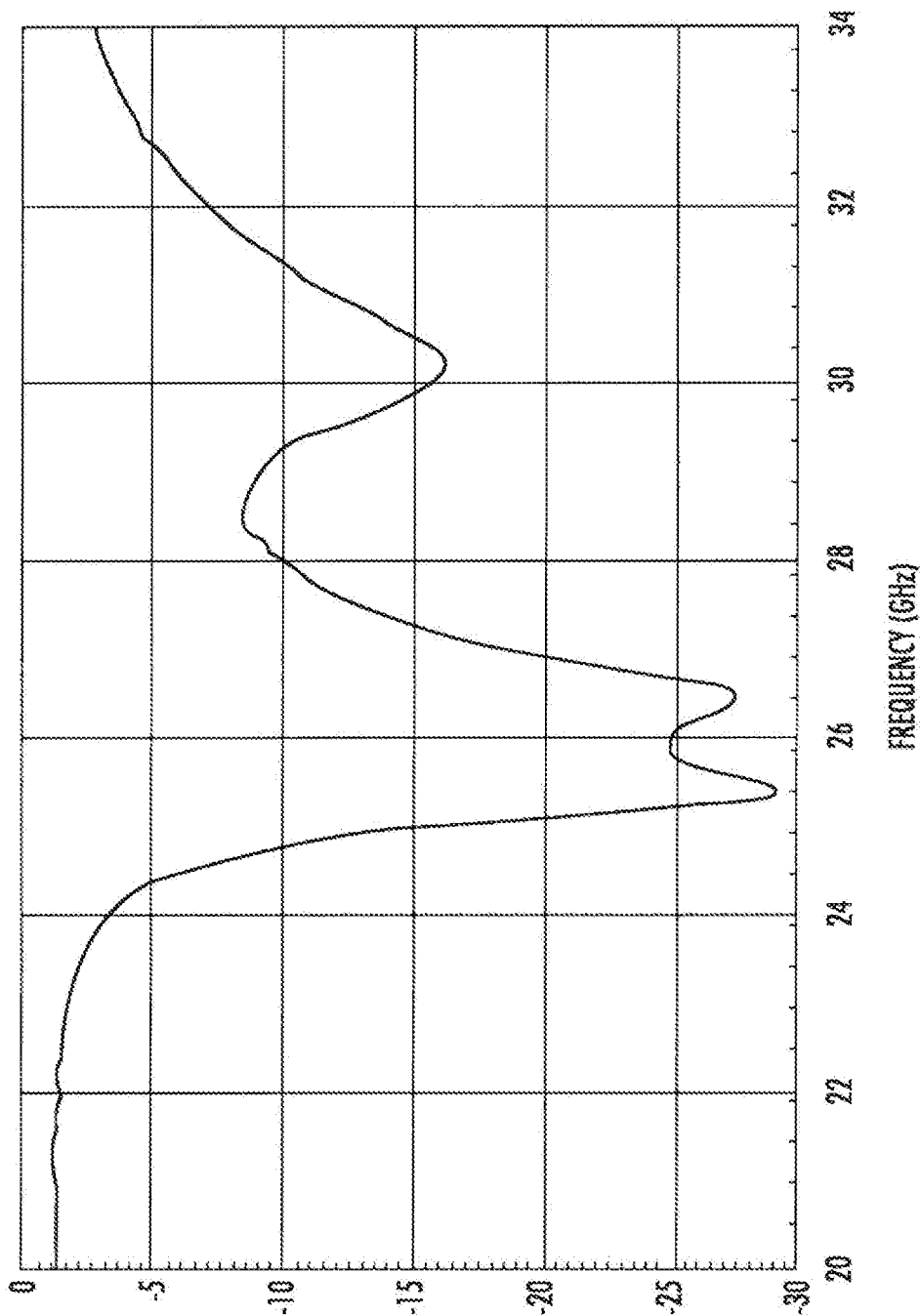

After wafer fabrication, the S-parameters may be measured on-wafer. FIGS. 17A, 17B, and 17C are graphs of S-parameters of a device according to the embodiments described herein. The S-parameters shown here are measured on 120 devices across a wafer. The lines of the graphs of FIGS. 17A-17C represent the mean of the data. FIG. 17A shows S21 over a wafer, FIG. 17B shows S11 over a wafer, and FIG. 17C shows S22 over a wafer. The S-parameters indicate very good broadband performance.

Figure 18A:
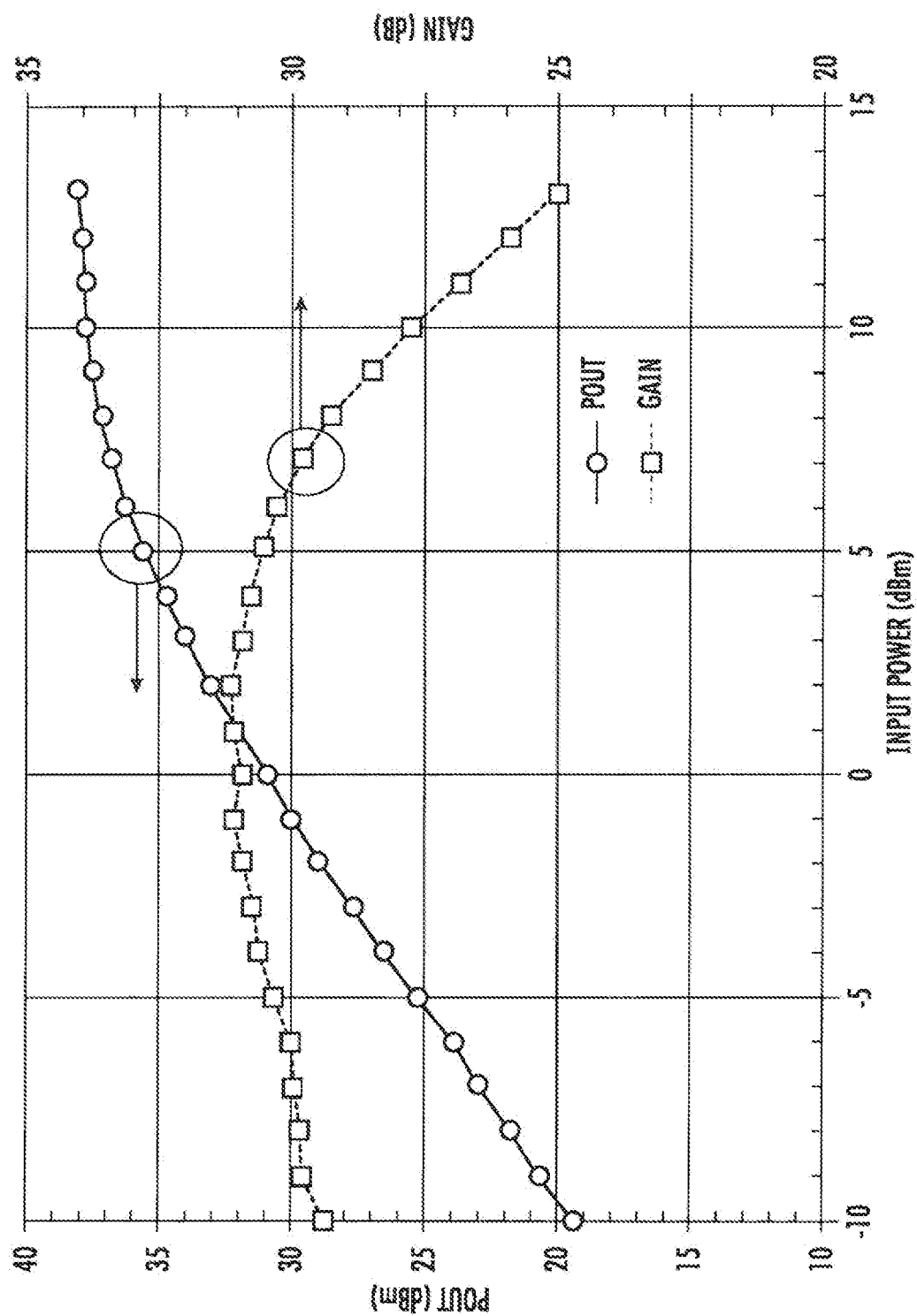
FIGS. 18A, 18B, and 18C are graphs of power measurements of devices according to embodiments described herein.
Figure 18B:
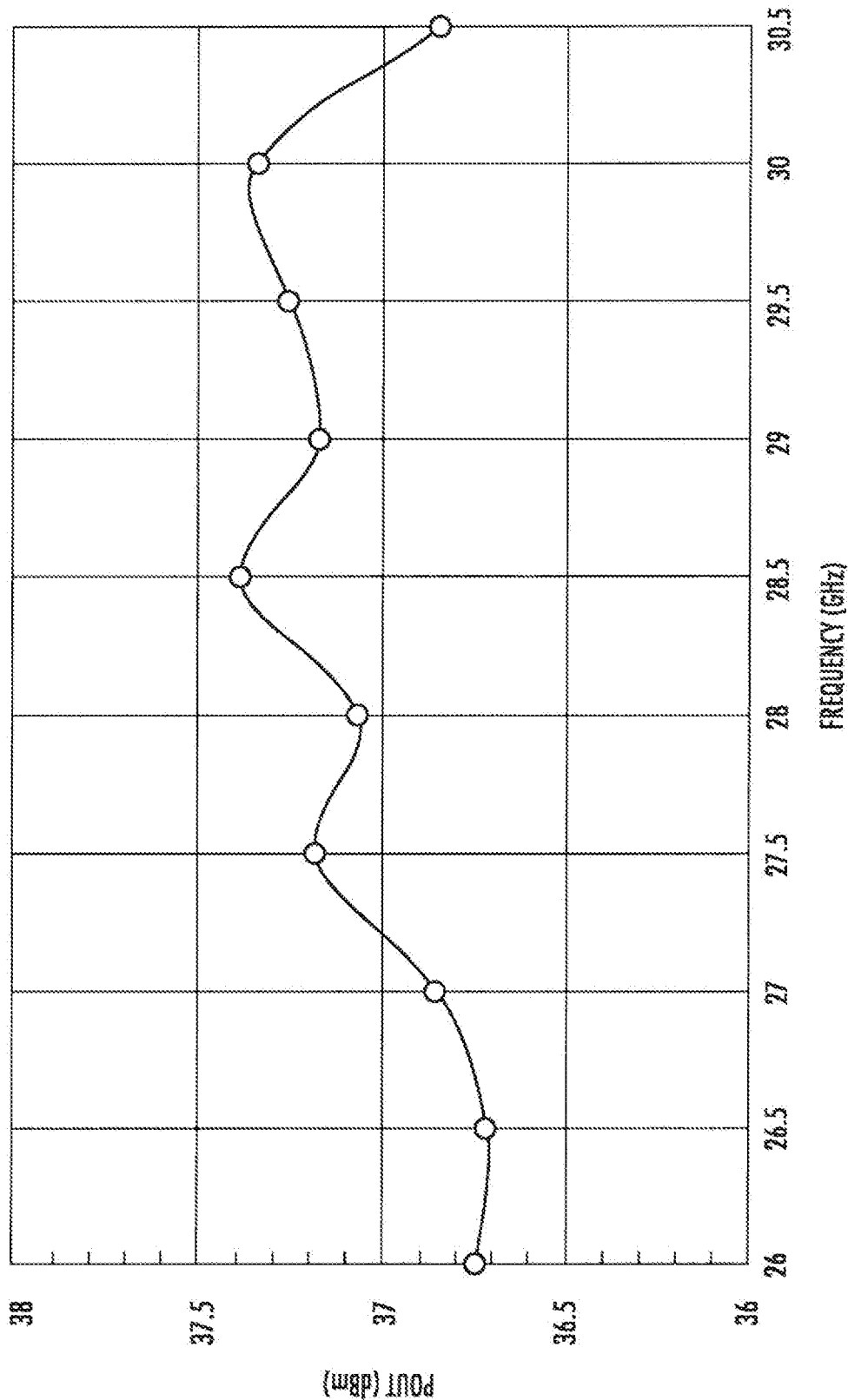
Figure 18C:
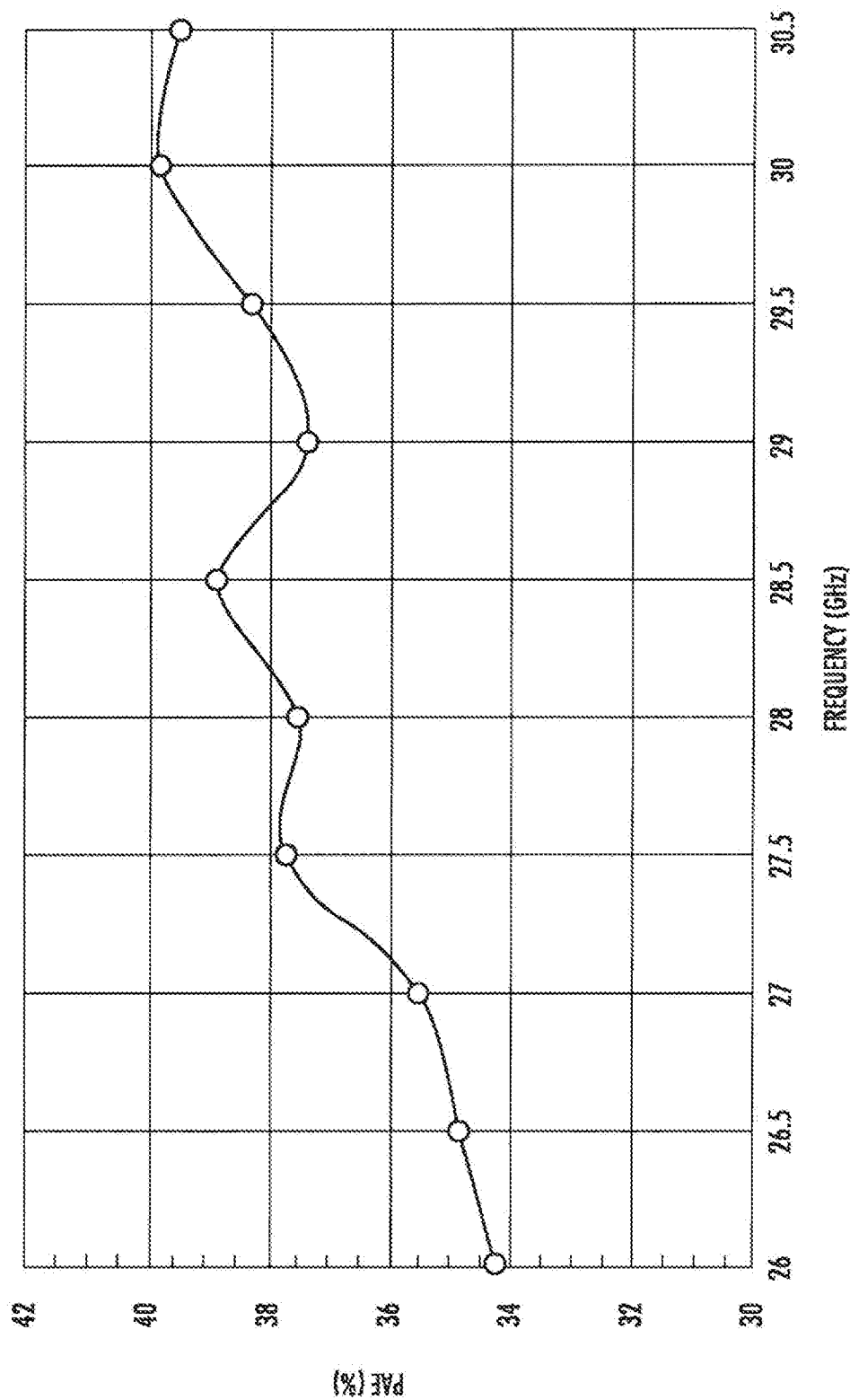

FIGS. 18A, 18B, and 18C are graphs of power measurements of devices according to embodiments described herein. Power sweep testing was done on five devices across the wafer from 26 GHz to 30.5 GHz. The power and PAE results presented are the averages of these five devices. Power measurements were done on-wafer using a power pulse. The duty-cycle of the pulse was 1% and the duration was 10 μs. These are standard on-wafer pulsed-power parameters to avoid over heating the wafers during testing. FIG. 18A shows output power (Pout) versus input power (Pin) at 28.5 GHz, the middle of the band. The associated gain versus input power is also plotted in FIG. 18A. The gain is relatively flat over swept input power, which is desirable for linearity.

FIG. 18B shows output power (Pout) at maximum PAE over an example band of frequencies of operation, and the corresponding maximum PAE is shown in FIG. 18C. The 4 W output power and 30% PAE goals have been exceeded in the example illustrated in FIG. 18B. In addition, the examples illustrated in FIG. 18C show that PAE is excellent across the band and approaches 40% at 30 GHz. The PAE measurements compare very favorably with previously published results. A comparison of power and PAE according to some embodiments described herein to previously published work is shown in Table 2.

TABLE 2

| Ref # | Freq (GHz) | Power (W) | PAE (%) | Vdd (V) | Idq (mA) |
|---|---|---|---|---|---|
| [A] | 29.5 | 5.8 | 34 | 20 | 280 |
| [B] | 26-30 | 36-40 | 32 | 28 | — |
| [C] | 30 | 4.5 | 33 | 15 | 900 |
| [D] | 35 | 5.9 | 38-41 | 24 | — |
| [E] | 28 | 40 | 25.9 | 28 | 525 |
| Examples of this Disclosure | 30 | 5.75 | 39.8 | 28 | 72 |

In Table 2, Reference A refers C. Campbell et al., "High Efficiency Ka-Band Gallium Nitride Power Amplifier MMICs," 2013 IEEE International Conference on Microwaves, Communications, Antennas and Electronic Systems (COMCAS), October 2013, Reference B refers to S. Din et al., "High Power and High Efficiency Ka Band Power Amplifier," 2015 IEEE Internal Microwave Symposium (IMS), May 2015, Reference C refers to J. Cheron et al., "High-gain Over 30% PAE Power Amplifier MMICs in 100 nm GaN Technology at Ka-Band Frequencies," Proceedings of the 10th European Microwave Integrated Circuits Conference, September 2015, Reference D refers to P. Blount et al., "A High Efficiency, Ka-Band Pulsed Gallium Nitride Power Amplifier for Radar Applications," 2016 IEEE Compound Semiconductor Integrated Circuit Symposium (CSICS), October 2016, and Reference E refers to M. Roberg et al., "40 W Ka-Band Single and Dual Output GaN MMIC Power Amplifiers on SiC," 2018 IEEE BiCMOS and Compound Semiconductor Integrated Circuits and Technology Symposium (BCICTS), October 2018. As illustrated in Table 2, the examples of this disclosure may provide a quiescent drain current Idq of 72 mA for a maximum output power of 5.75 W, which may translate to approximately 12.5 mA/W. In some embodiments, the ratio of quiescent drain current to power output is less than 12.5 mA/W.

Figure 19A:
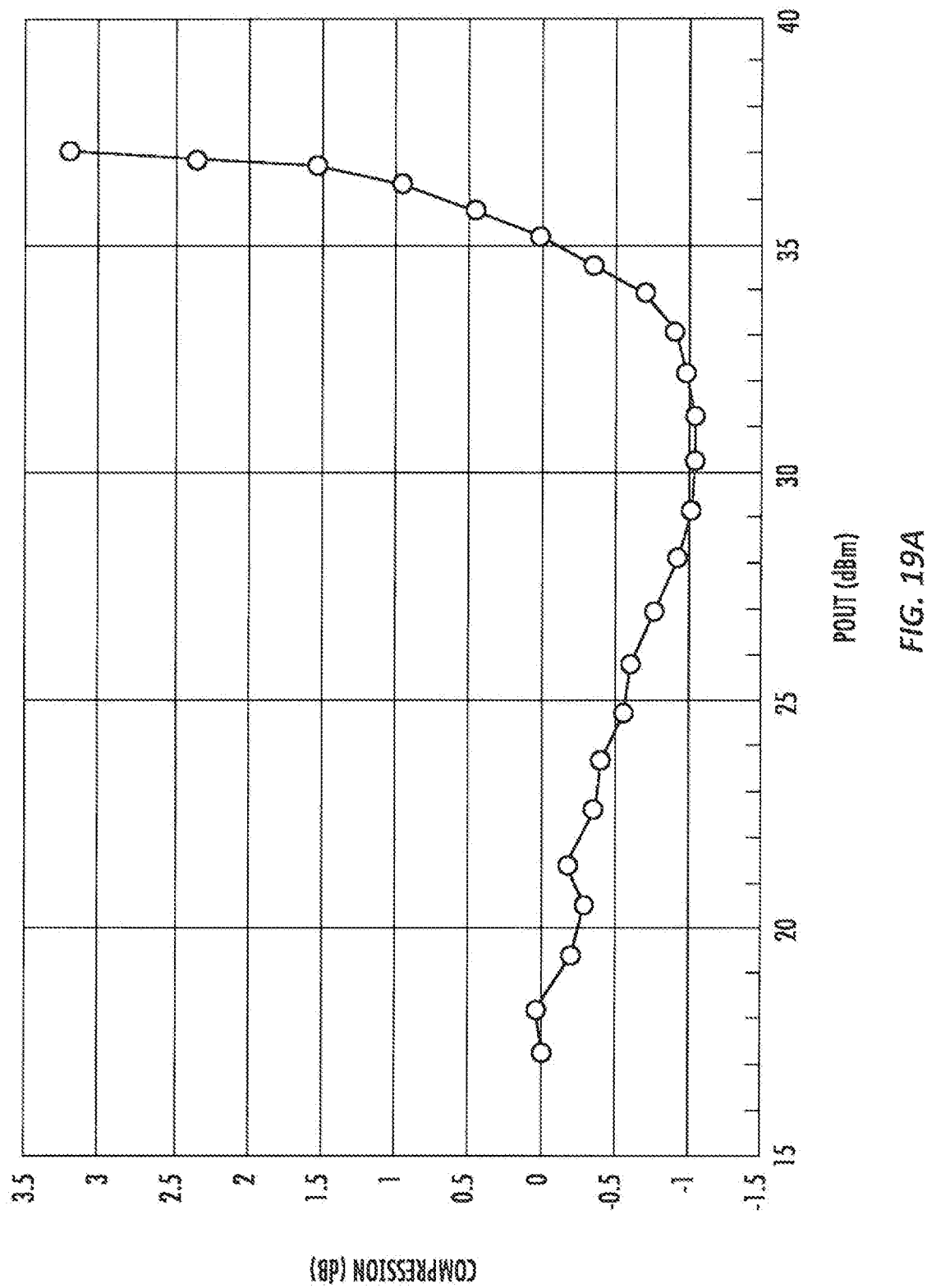
FIGS. 19A, 19B, and 19C are graphs of gain compression measurements of devices according to embodiments described herein.
Figure 19B:
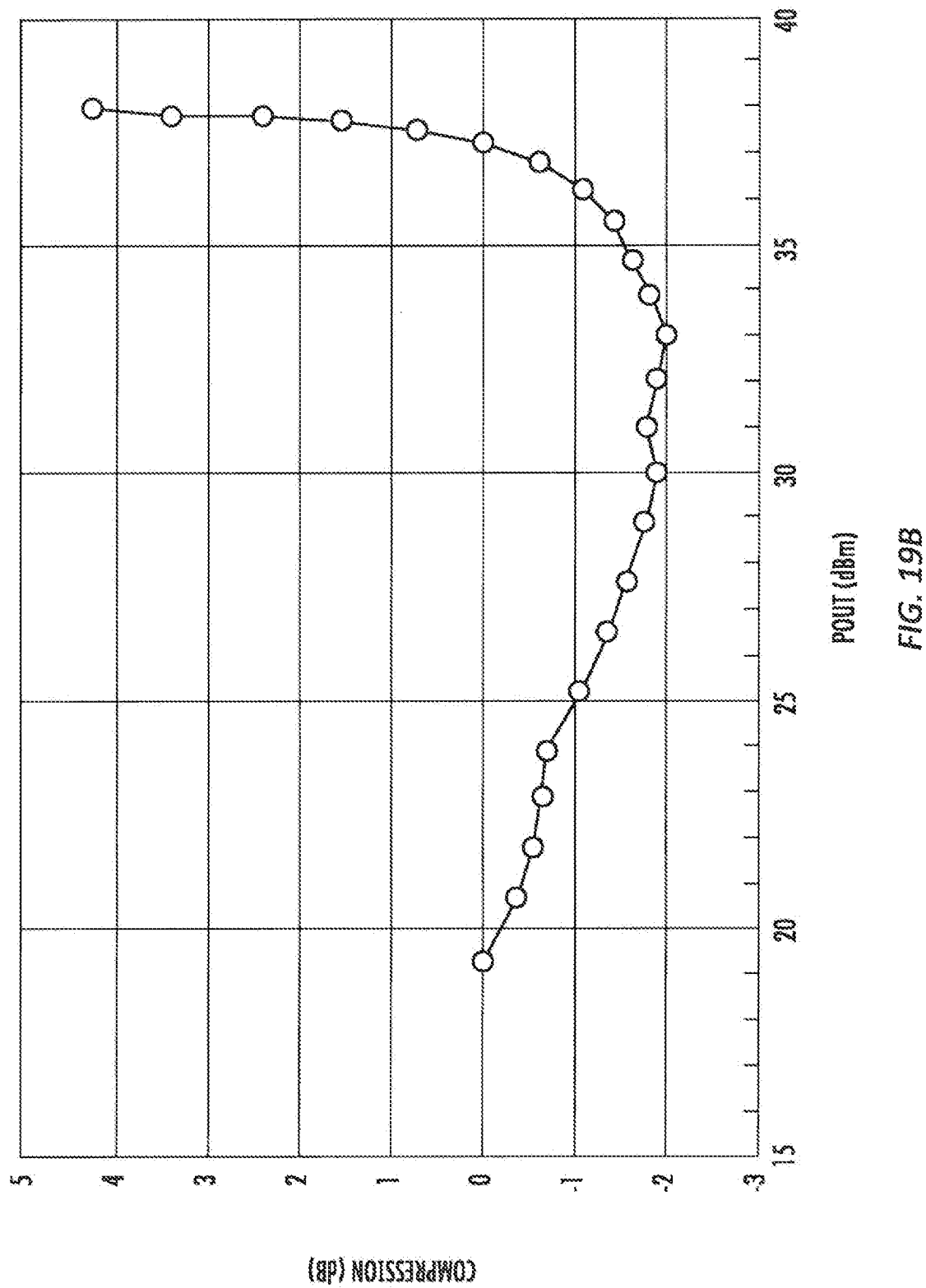
Figure 19C:
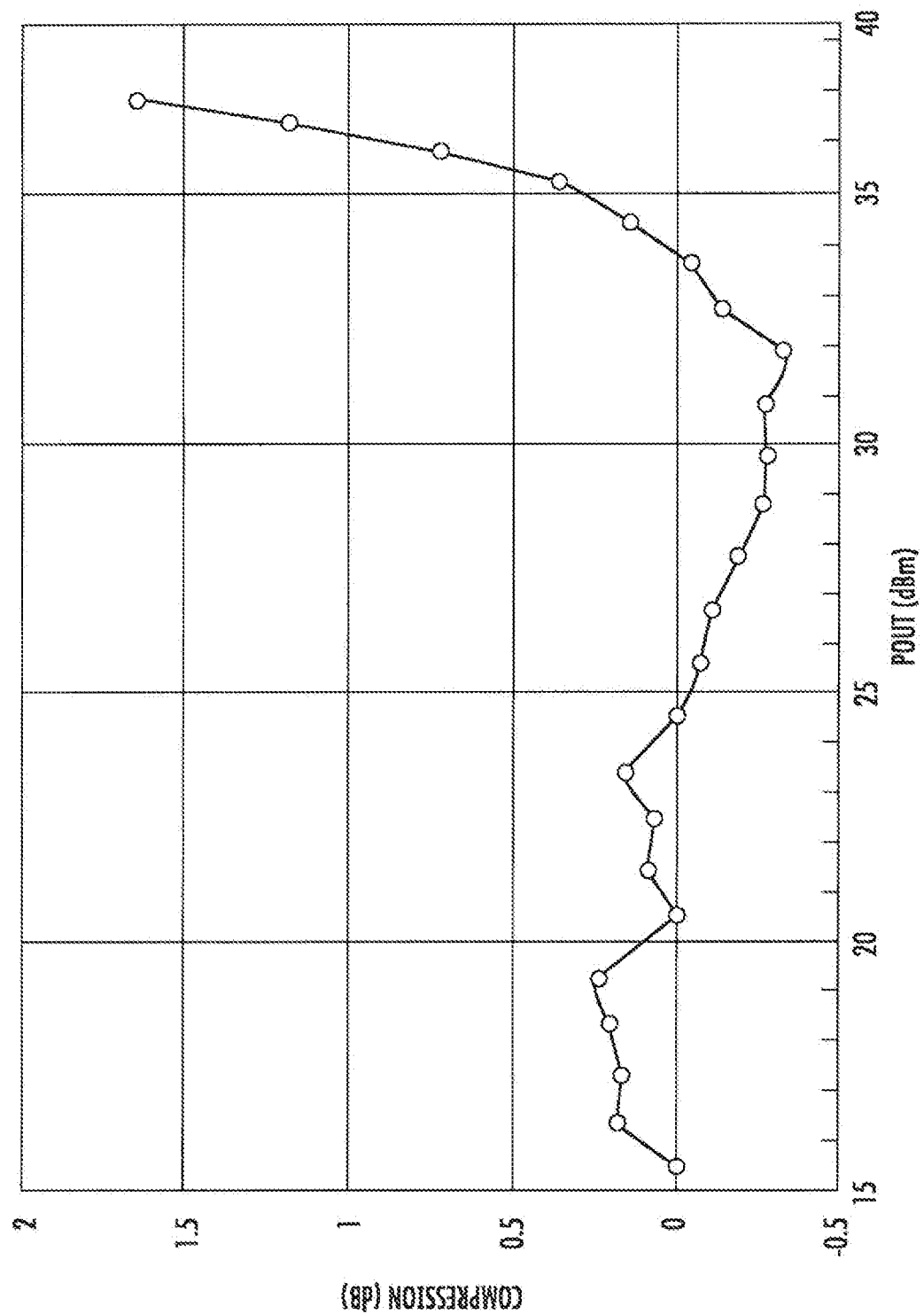

FIGS. 19A, 19B, and 19C are graphs of gain compression measurements of devices according to embodiments described herein. Gain compression measurements averaged over five devices are shown at 26.5 GHz, 28.5 GHz, and 30.5 GHz in FIG. 19A, FIG. 19B, and FIG. 19C respectively. All of the figures show some gain expansion followed by gain compression. Typical GaN amplifiers have soft gain compression that starts well before Psat. These plots show a quick transition from P1dB to Psat. Gain expansion can impact linearity, just as gain compression can impact linearity. The amount of impact depends on the type of modulation. A parameter such as third-order intermodulation distortion (IM3) will be sensitive to the slope of the gain with respect to input power. In the example devices illustrated in FIGS. 19A-19C, the gain expansion observed is modest and has a gentle slope. As a result, the sharp slope of the gain compression still dominates.

Figure 20:
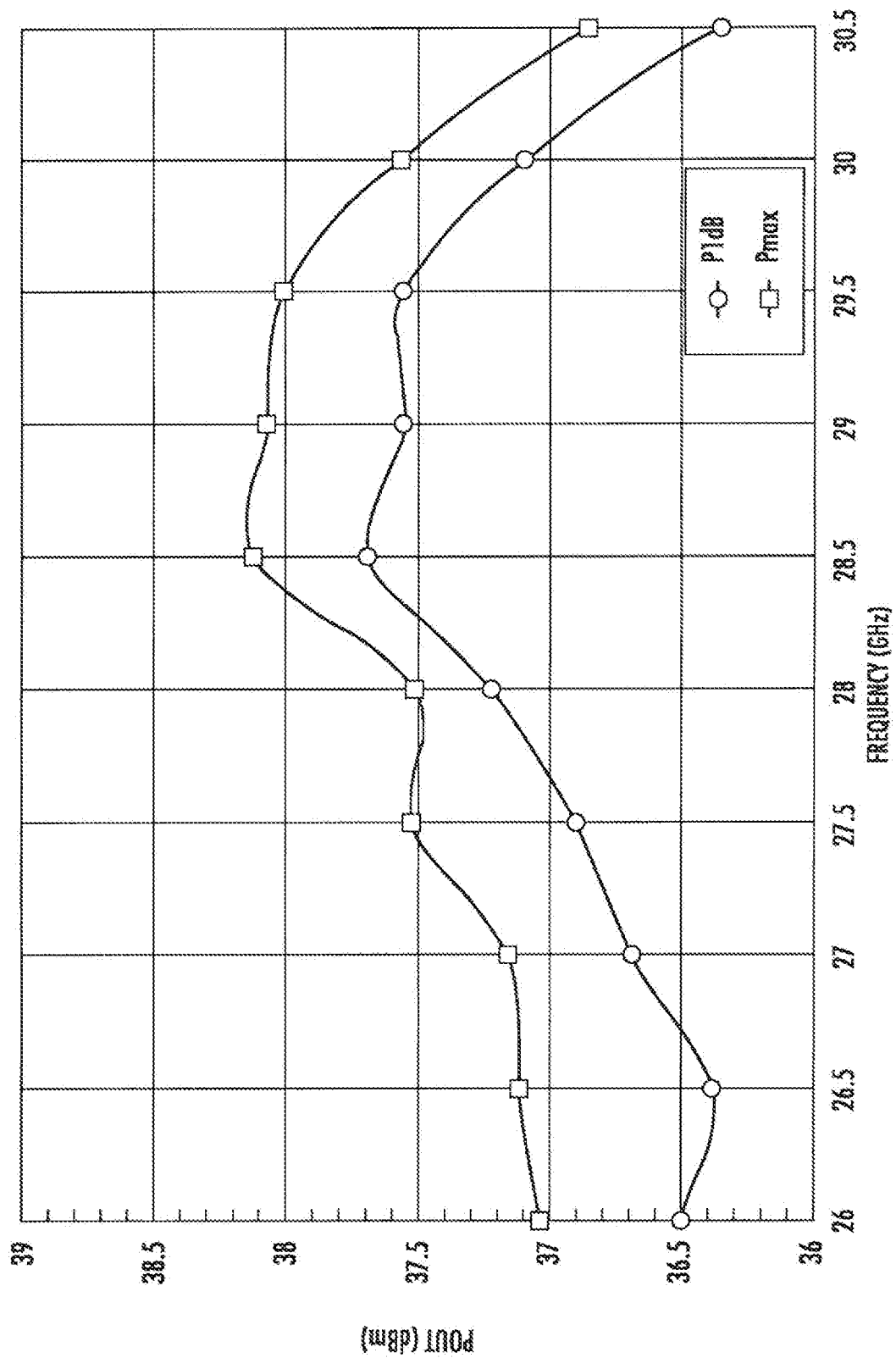
FIG. 20 is a graph of maximum measured power and P1dB characteristics of devices according to embodiments described herein.
Figure 21:
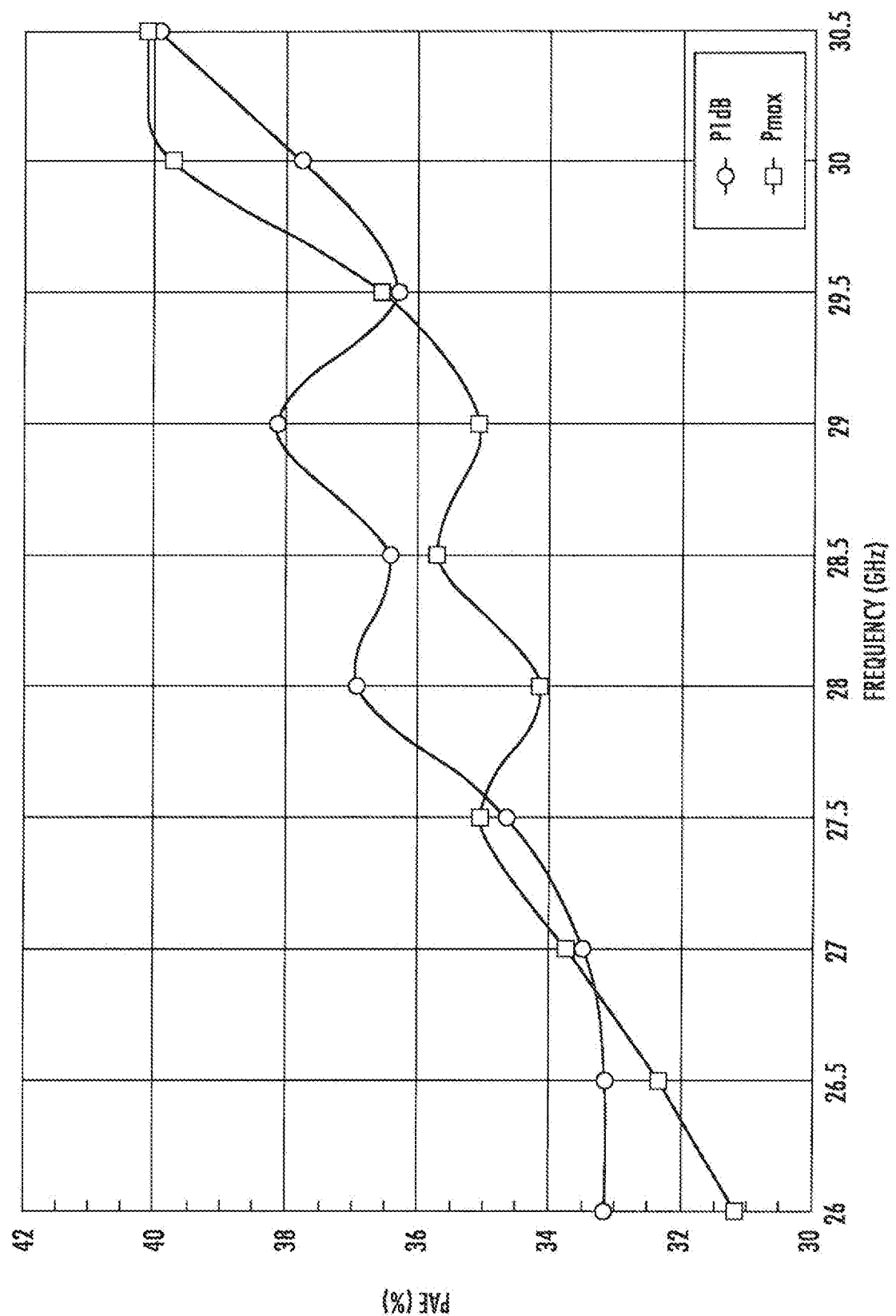
FIG. 21 is a graph of power added efficiency (PAE) characteristics of devices according to embodiments described herein.

FIG. 20 is a graph of maximum measured power (Pmax) and P1dB characteristics of devices according to embodiments described herein. As used herein, the maximum measured power (Pmax) refers to a maximum power measured for the device. FIG. 20 compares P1dB and Pmax across frequency. As illustrated in FIG. 20, P1dB is within 1 dB of Pmax across the frequency band for a GaN MMIC PA according to embodiments of the present invention. FIG. 21 is a graph of PAE characteristics of devices according to embodiments described herein. The PAE for Pmax and for P1dB are shown in FIG. 21. For the example devices illustrated in FIG. 21, PAE at P1dB is greater than 32% across the band, and PAE at P1dB is 37.8% at 30 GHz. Over the operating band of 26.5 GHz to 30.5 GHz, the PAE at P1dB may range from 33% to approximately 40%. This represents an improved PAE at P1dB for GaN-based power amplifiers, such as multiple stage MMICs according to embodiments of the present invention, e.g., a 3-stage GaN power amplifier MMIC operating in the Ka-band, as compared to conventional devices. The improved efficiency at P1dB of the present invention can be advantageously incorporated into transmission systems for communication signals which utilize digital modulation. Linearity is important in an amplifier utilized with a modulated signal and a higher P1dB with respect to output power, as well as a higher efficiency (e.g. PAE) at P1dB, may correlate to an improved linearity at higher output powers of the overall device.

Figure 22:
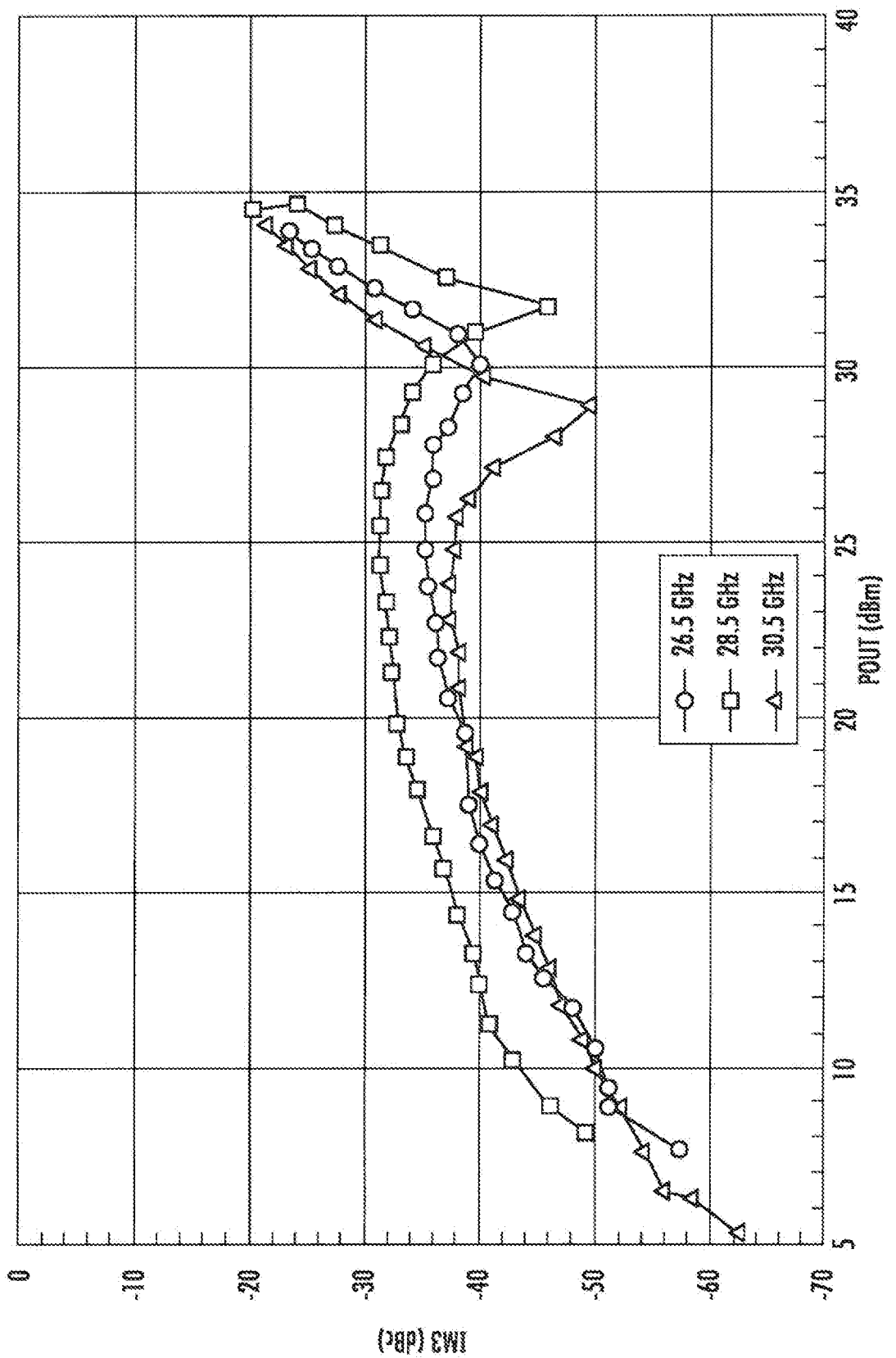
FIG. 22 is a graph of third-order intermodulation distortion (IM3) characteristics of devices according to embodiments described herein.

FIG. 22 is a graph of IM3 characteristics of devices according to embodiments described herein. The IM3 for an example device according to embodiments described herein was measured under continuous waveform (CW) conditions and the results are shown in FIG. 22. An IM3 that is less than −25 dBc for a GaN amplifier is advantageous. As illustrated in FIG. 22, this is achieved at power levels within 4 dB of maximum power (Pmax) for example devices according to embodiments described herein, which is considered to be a good result.

The results for an example 28 V, 3-stage, Ka-Band, GaN-on-SiC, MMIC power amplifier using an optically defined, i-line 150 nm gate have been described herein. A MMIC according to embodiments described herein may provide a maximum measured power (Pmax) of 37.6 dBm with an associated PAE of 39.8% at 30 GHz. The MMIC may exhibit low gain compression, excellent P1dB, and low quiescent bias. P1dB may be within 1 dB of Pmax over the 26.5-30.5 GHz band. At 30 GHz, P1dB may be 37.1 dBm with an associated PAE of 37.8% and quiescent bias of 72 mA. This efficiency at P1dB represents an improvement over conventional devices for a Ka-band, multi-stage MMIC.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims

What is claimed is:

1. A GaN-based high electron mobility transistor (HEMT) device configured to operate for greater than 1000 hours in a high-temperature-reverse-bias (HTRB) operation at 84 V drain bias, wherein the GaN-based HEMT device comprises:
a channel layer and a barrier layer sequentially stacked on a substrate;
a source contact comprising a first ohmic portion on the barrier layer, wherein the source contact is shared between a first unit cell transistor and a second unit cell transistor; and
a via extending in the channel layer, the barrier layer, and the substrate to the first ohmic portion of the source contact, wherein the via is between the first unit cell transistor and the second unit cell transistor.

2. The GaN-based HEMT device of claim 1, wherein, after operating the HTRB operation for 1000 hours a gate leakage of the HEMT device is between $1\times10^{-4}$ and $1\times10^{-3}$ A.

3. The GaN-based HEMT device of claim 1, wherein the HTRB operation is operated with a temperature of 150° C.

4. The GaN-based HEMT device of claim 1, further comprising a gate contact on the barrier layer,
wherein the gate contact comprises a first portion and a second portion on the first portion, and
wherein the second portion extends beyond one or more sidewalls of the first portion.

5. The GaN-based HEMT device of claim 4, wherein the second portion of the gate contact extends beyond a sidewall of the first portion of the gate contact towards the source contact by a distance that is between 0.5 µm and 0.15 µm.

6. A power amplifier comprising a GaN-based high electron mobility transistor (HEMT) device configured to operate for greater than 1000 hours in a high-temperature-reverse-bias (HTRB) operation at 84 V drain bias, wherein the GaN-based HEMT device comprises:
a channel layer and a barrier layer sequentially stacked on a substrate;
a source contact comprising a first ohmic portion on the barrier layer; and
a via extending in the channel layer, the barrier layer, and the substrate to the first ohmic portion of the source contact, wherein a width of the via decreases as the via extends from a bottom surface of the substrate to a top surface of the substrate.

7. The power amplifier of claim 6, wherein the via has first and second opposing sidewalls,
wherein the first sidewall of the via is adjacent an active region of a first unit cell transistor of the GaN-based HEMT device, and
wherein the second sidewall of the via is adjacent an active region of a second unit cell transistor of the GaN-based HEMT device.

8. The power amplifier of claim 6, wherein a power added efficiency (PAE) of the power amplifier is greater than 32% at an output power at 1 dB compression (P1dB) during operation of the power amplifier between 26.5 GHz and 30.5 GHz.

9. The power amplifier of claim 6, wherein the P1dB value of the power amplifier is within 1 dB of maximum measured power during operation of the power amplifier between 26 GHz and 30.5 GHz.

10. The power amplifier of claim 6, wherein, after operating the HTRB operation for 1000 hours a gate leakage of the HEMT device is between $1\times10^{-4}$ and $1\times10^{-3}$ A.

11. The power amplifier of claim 6, wherein the HTRB operation is operated with a temperature of 150° C.

12. The power amplifier of claim 6, further comprising a gate contact on the barrier layer,
wherein the gate contact comprises a first portion and a second portion on the first portion, and
wherein the second portion extends beyond one or more sidewalls of the first portion.

13. The power amplifier of claim 12, further comprising a drain contact on the barrier layer, and
wherein the second portion of the gate contact extends beyond a sidewall of the first portion of the gate contact towards the drain contact by a distance that is between 0.5 µm and 0.15 µm.

14. The power amplifier of claim 12, wherein the second portion of the gate contact extends beyond a sidewall of the first portion of the gate contact towards the source contact by a distance that is between 0.5 µm and 0.15 µm.

15. A power amplifier comprising a GaN-based high electron mobility transistor (HEMT) device, wherein a power added efficiency (PAE) of the power amplifier is greater than 32% at an output power at 1 dB compression (P1dB) during operation of the power amplifier between 26.5 GHz and 30.5 GHz, wherein the GaN-based HEMT device comprises:

a channel layer and a barrier layer, sequentially stacked on a substrate;

a source contact comprising a first ohmic portion on the barrier layer; and a via extending in the channel layer, the barrier layer, and the substrate to the first ohmic portion of the source contact, the via extending between active regions of two adjacent unit cell transistors of the GaN-based HEMT device.

16. The power amplifier of claim 15, wherein the P1dB value of the power amplifier is within 1 dB of maximum measured power during operation of the power amplifier between 26 GHz and 30.5 GHz.

17. The power amplifier of claim 15, wherein the power amplifier is configured to generate a power density greater than 3.5 W/mm while operating at 30 GHz.

18. The power amplifier of claim 15, wherein a ratio of quiescent drain current to power output is approximately 12.5 mA/W or less.

19. The power amplifier of claim 15, further comprising a first stage configured to provide gain compression and a second stage configured to provide gain expansion.

20. The power amplifier of claim 19, wherein the first stage is biased in class A mode, and wherein the second stage is biased in class AB mode.

21. The power amplifier of claim 20, wherein a drive ratio between the first stage and the second stage is approximately 1:2.

* * * * *

UNITED STATES PATENT AND TRADEMARK OFFICE
CERTIFICATE OF CORRECTION

PATENT NO. : 10,971,612 B2  
APPLICATION NO. : 16/555036  
DATED : April 6, 2021  
INVENTOR(S) : Bothe et al.

Page 1 of 1

It is certified that error appears in the above-identified patent and that said Letters Patent is hereby corrected as shown below:

In the Specification

Column 8, Line 43: Please correct "MN" to read -- AlN --

Column 9, Line 33: Please correct "HYPE" to read -- HVPE --

Signed and Sealed this  
Sixth Day of July, 2021

Drew Hirshfeld  
*Performing the Functions and Duties of the*  
*Under Secretary of Commerce for Intellectual Property and*  
*Director of the United States Patent and Trademark Office*